(12) United States Patent
Hirota et al.

(10) Patent No.: US 8,687,101 B2
(45) Date of Patent: *Apr. 1, 2014

(54) SOLID-STATE IMAGING DEVICE AND CAMERA

(75) Inventors: Isao Hirota, Kanagawa (JP); Kouichi Harada, Kanagawa (JP); Nobuhiro Karasawa, Kanagawa (JP); Yasushi Maruyama, Kanagawa (JP); Yoshikazu Nitta, Tokyo (JP); Hiroyuki Terakago, Kanagawa (JP); Hajime Takashima, Kanagawa (JP); Hideo Nomura, Kanagawa (JP)

(73) Assignee: Sony Corporation (JP)

( * ) Notice: Subject to any disclaimer, the term of this patent is extended or adjusted under 35 U.S.C. 154(b) by 149 days.

This patent is subject to a terminal disclaimer.

(21) Appl. No.: 13/348,760

(22) Filed: Jan. 12, 2012

(65) Prior Publication Data

US 2012/0113292 A1    May 10, 2012

Related U.S. Application Data

(63) Continuation of application No. 12/331,116, filed on Dec. 9, 2008, now Pat. No. 8,106,983.

(30) Foreign Application Priority Data

Dec. 18, 2007   (JP) ................................ 2007-326175

(51) Int. Cl.
    *H04N 5/335*    (2011.01)
    *H01L 31/062*   (2012.01)
    *H01L 27/00*    (2006.01)

(52) U.S. Cl.
     USPC ......... 348/308; 257/292; 257/291; 250/208.1

(58) Field of Classification Search
     CPC ............ H01L 27/1463; H01L 27/1464; H01L 27/14621; H01L 27/14623; H01L 27/14627

USPC ........ 250/208.1; 257/291, 292; 348/243, 294, 348/308
     See application file for complete search history.

(56) References Cited

U.S. PATENT DOCUMENTS 8,106,983 B2 *  1/2012  Hirota et al. ................... 348/308
2005/0139828 A1  6/2005  Maruyama
(Continued)

FOREIGN PATENT DOCUMENTS

EP    1 995 783    11/2008
JP    60-140752    7/1985
(Continued)

OTHER PUBLICATIONS

Japanese Office Action issued on Sep. 18, 2012, in connection with counterpart JP Application No. 2007-326175.

*Primary Examiner* — David N Spector
(74) *Attorney, Agent, or Firm* — Sheridan Ross P.C.

(57) ABSTRACT

A solid-state imaging device includes pixel cells that are formed on a substrate having a first substrate surface side, on which light is irradiated, and a second substrate surface side, on which elements are formed, and separated by an adjacent cell group and an element separation layer for each of the pixel cells or with plural pixel cells as a unit. Each of the pixel cells has a first conductive well formed on the first substrate surface side and a second conductive well formed on the second substrate surface side. The first conductive well receives light from the first substrate surface side and has a photoelectric conversion function and a charge accumulation function for the received light. A transistor that detects accumulated charges in the first conductive well and has a threshold modulation function is formed in the second conductive well.

18 Claims, 45 Drawing Sheets

(56) References Cited

U.S. PATENT DOCUMENTS

| | | |
|---|---|---|
| 2006/0146233 A1 | 7/2006 | Park |
| 2006/0187327 A1 | 8/2006 | Mabuchi |

FOREIGN PATENT DOCUMENTS

| | | |
|---|---|---|
| JP | 60-206063 | 10/1985 |
| JP | 64-014959 | 1/1989 |
| JP | 02-304973 | 12/1990 |
| JP | 06-120473 | 4/1994 |
| JP | 07-078959 | 3/1995 |
| JP | 2692218 | 9/1997 |
| JP | 10-065138 | 3/1998 |
| JP | 2935492 | 6/1999 |
| JP | 2003-031785 | 1/2003 |
| JP | 2003-152172 | 5/2003 |
| JP | 2005-085999 | 3/2005 |
| JP | 2005-244434 | 9/2005 |
| JP | 3752773 | 12/2005 |
| JP | 2006-108379 | 4/2006 |

* cited by examiner

IN THE CASE OF FRONT-ILLUMINATED BMCD

FIG. 10A SECTIONAL STRUCTURE
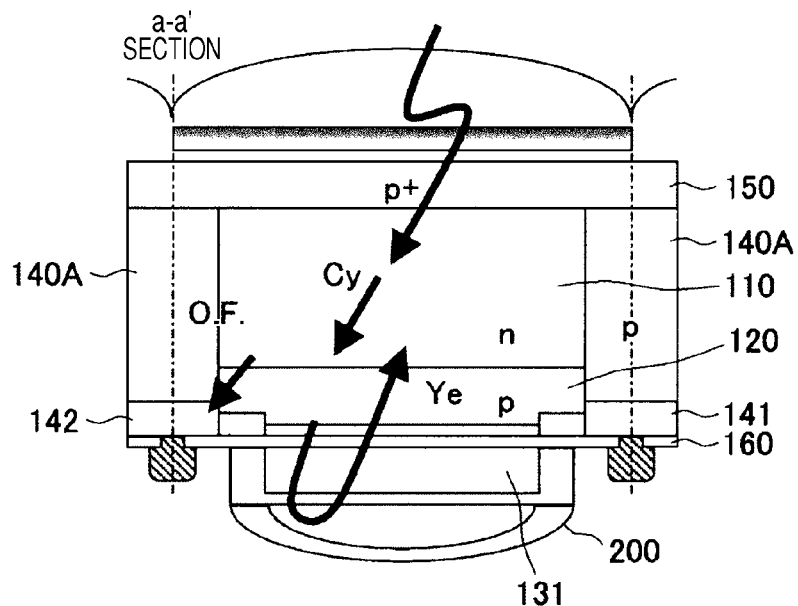
FIG. 10B
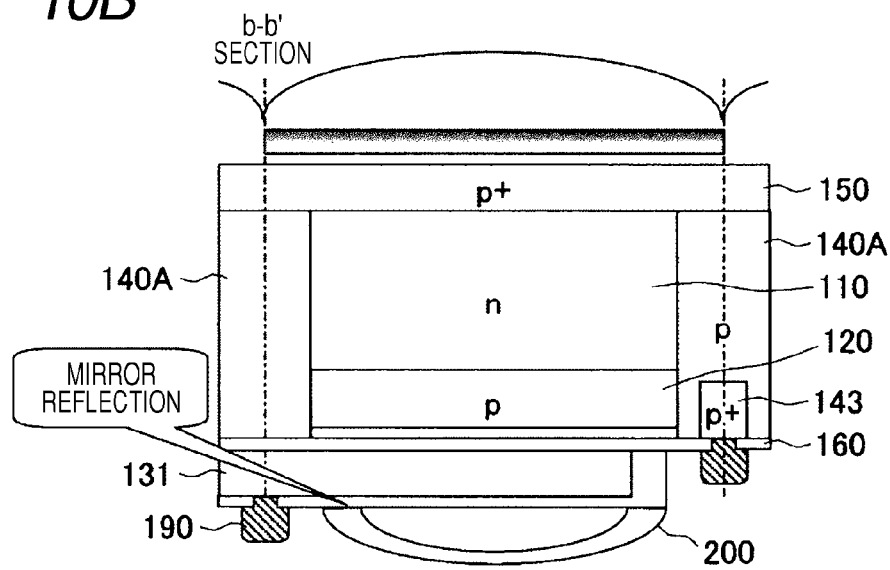
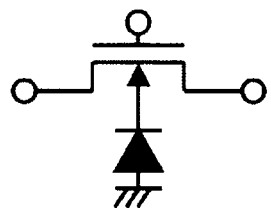

LIGHT SHIELDING FILM FOR
COLOR MIXTURE PREVENTION
CAN ALSO BE USED AS WIRING

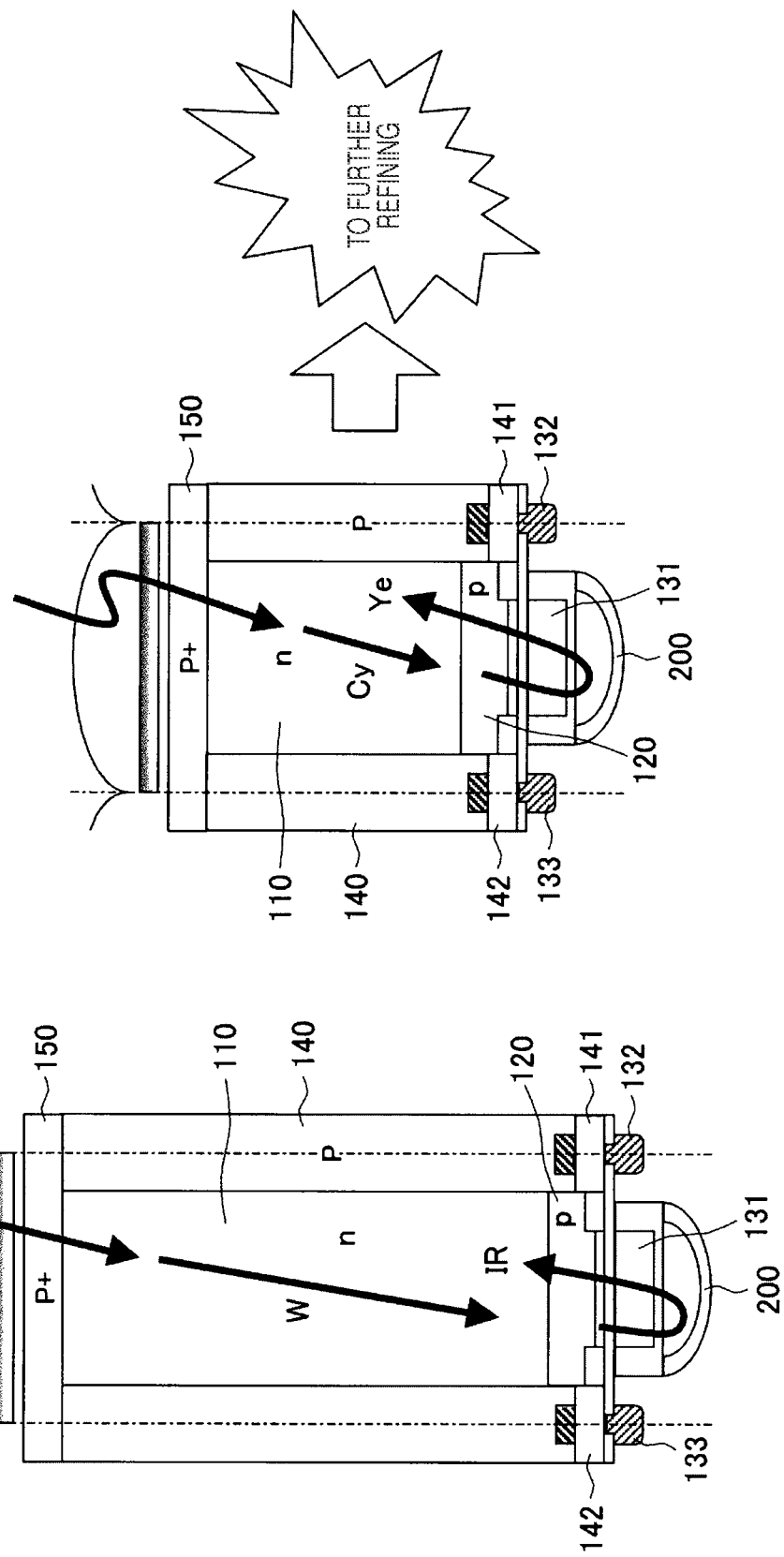

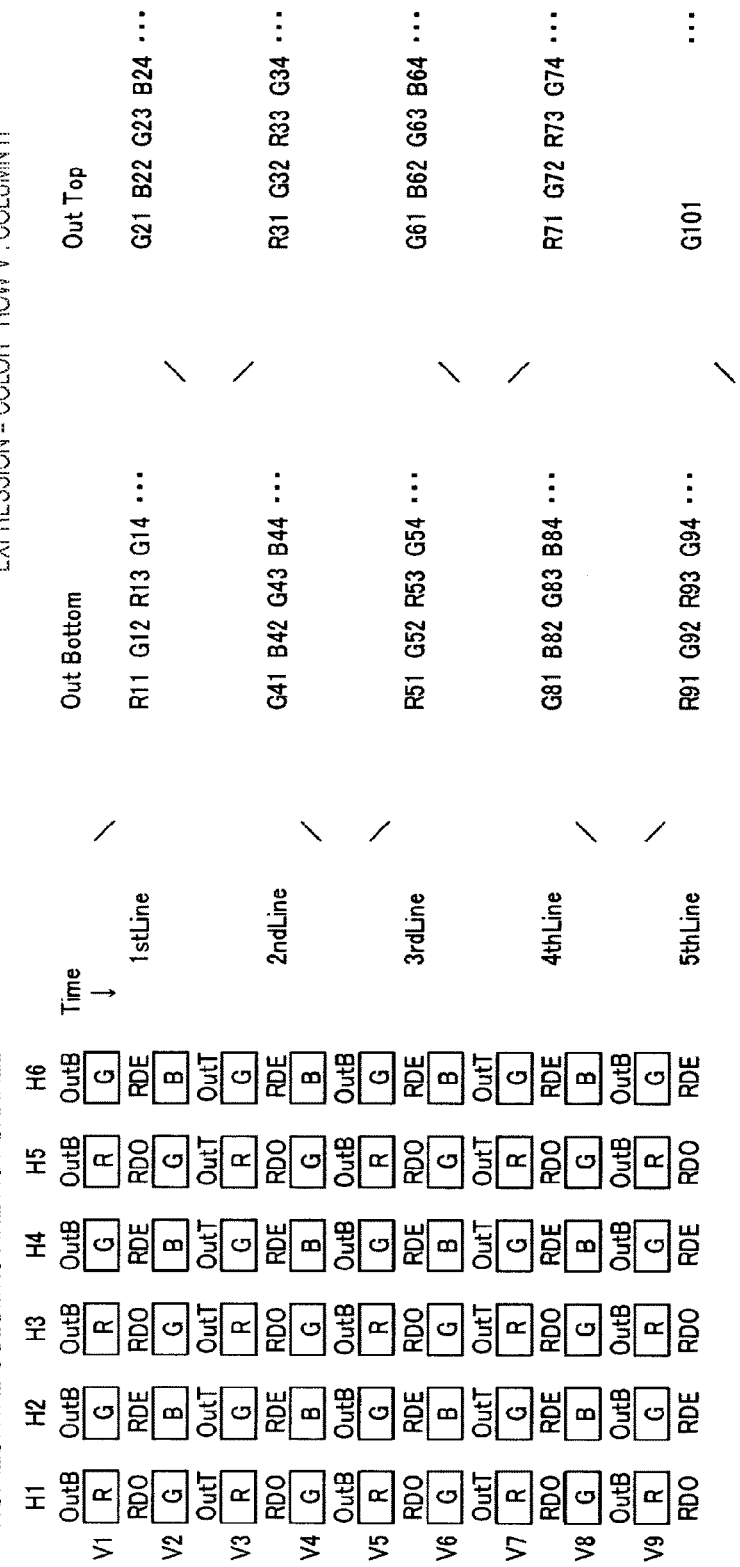

FIG. 19B

SIGNAL WIRING #1

FIG. 24B  SIGNAL WIRING #1

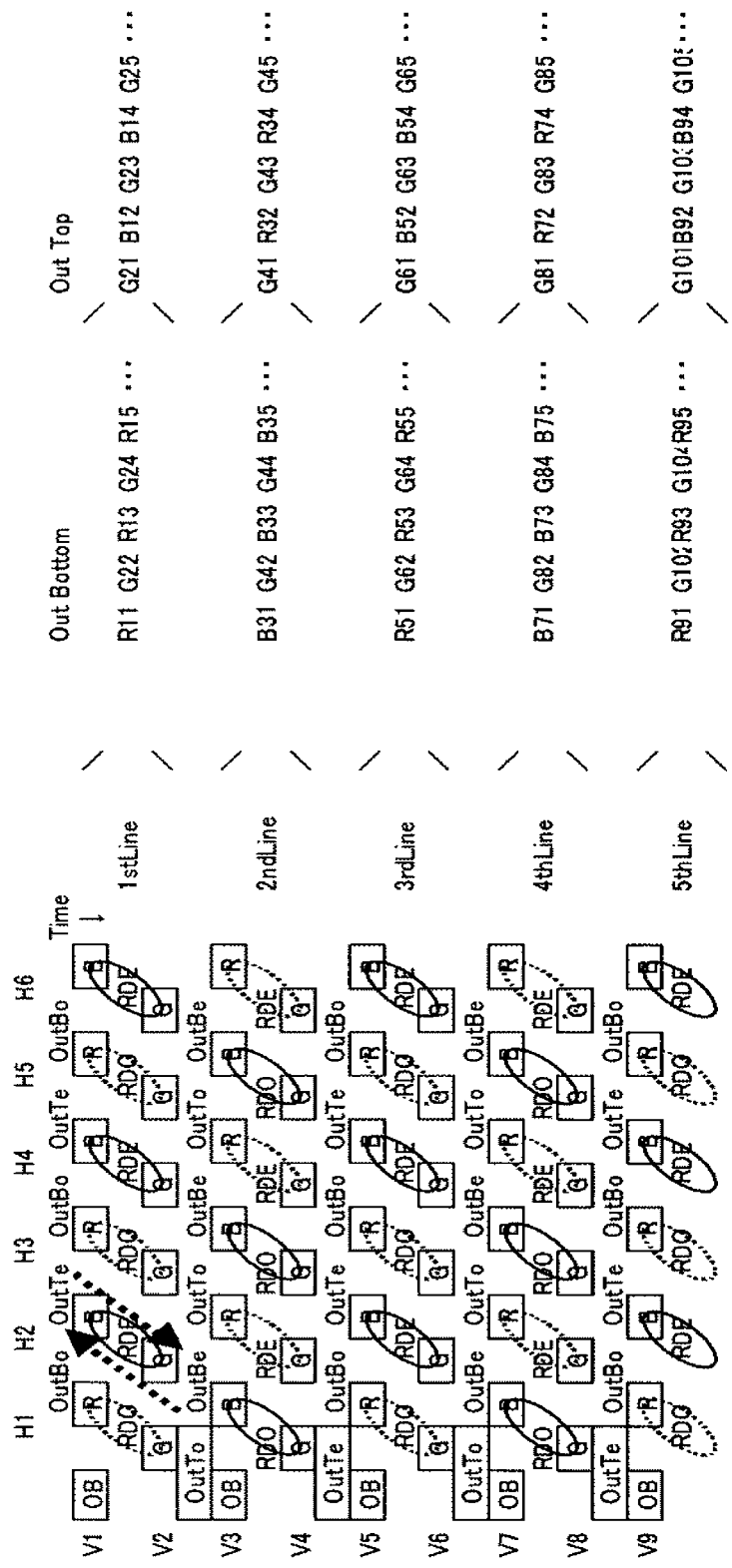

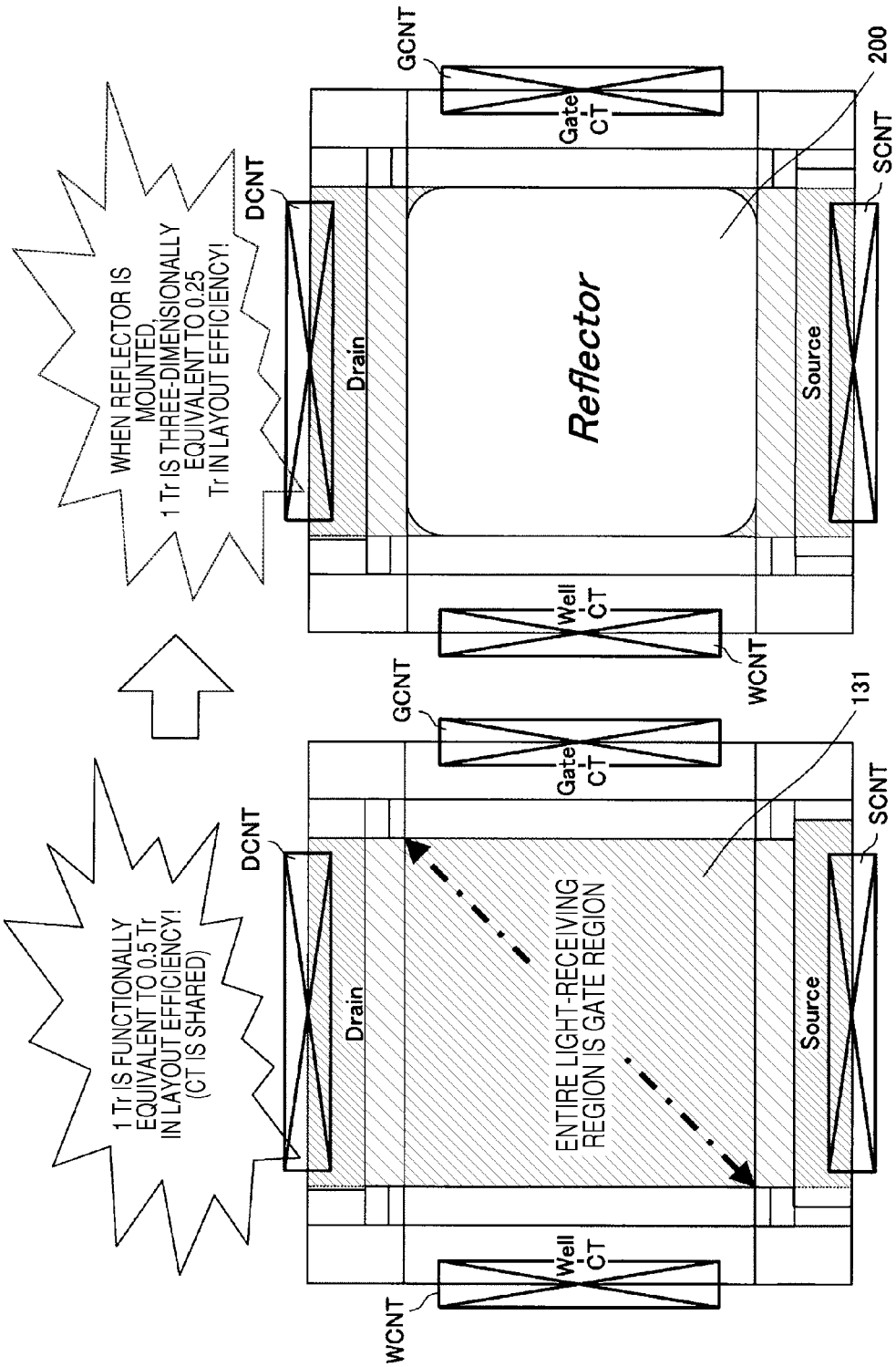

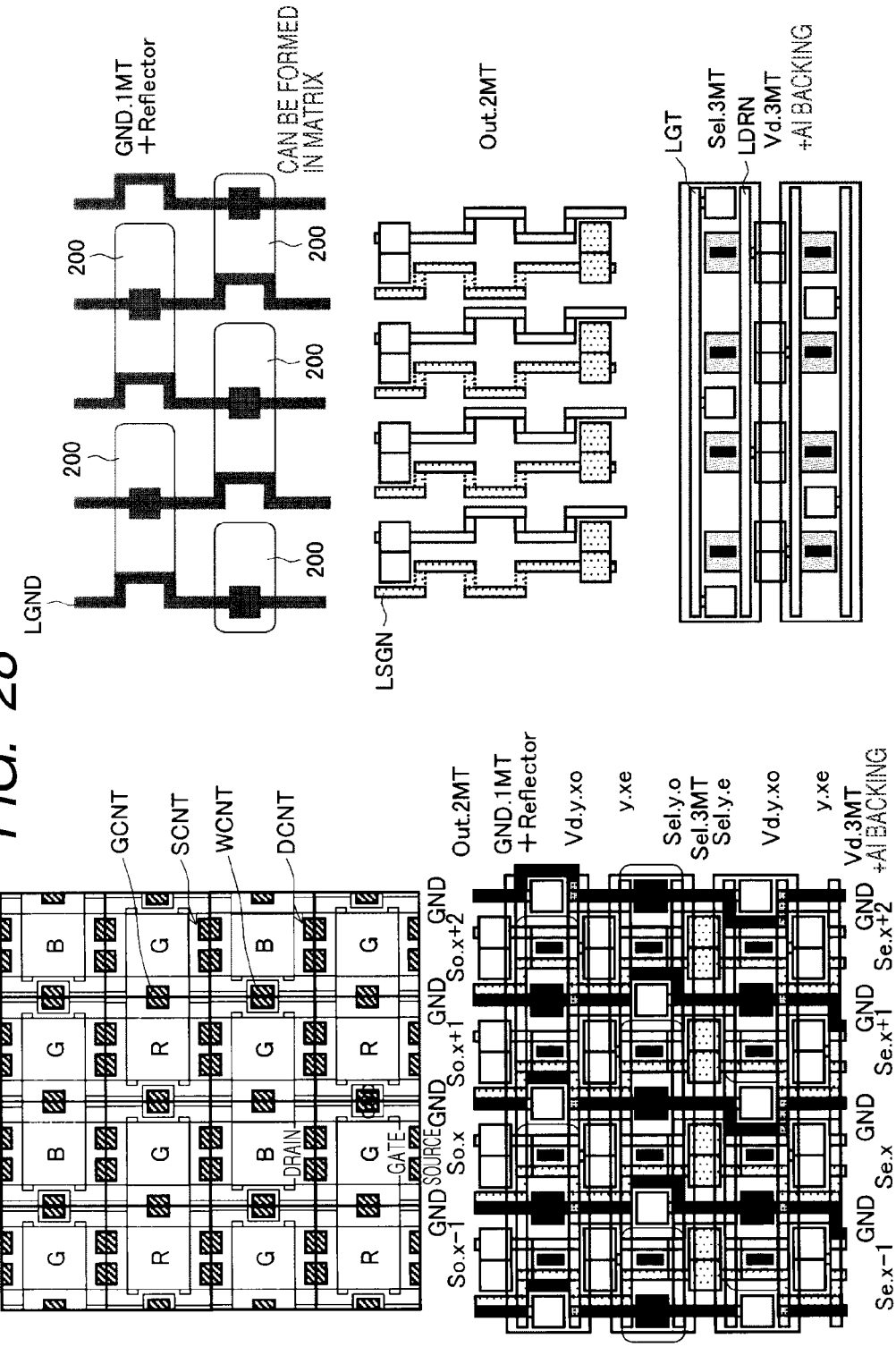

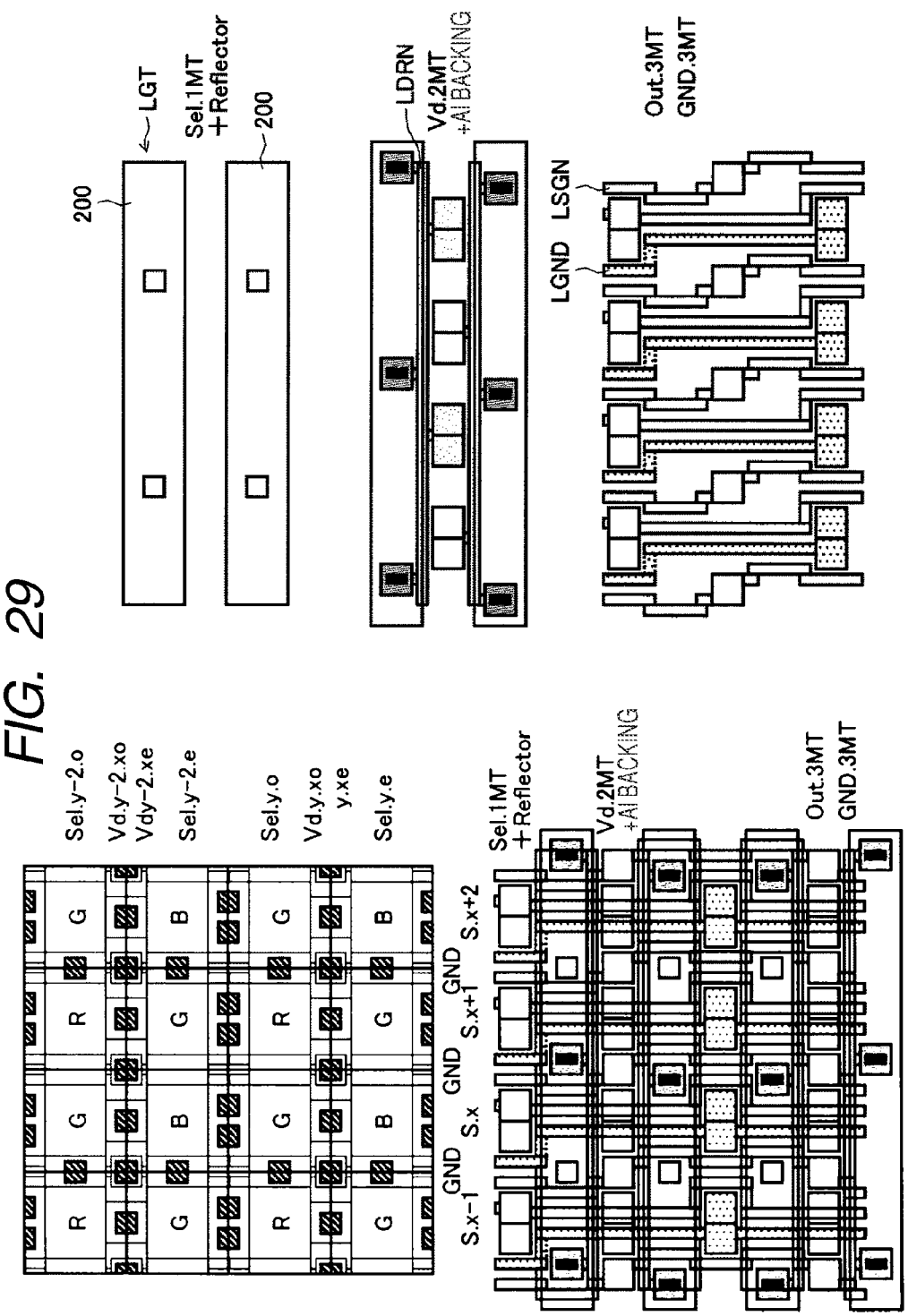

FIG. 33A
WORKING VOLTAGE
1. ACCUMULATION PIXEL (NON-SELECT PIXEL)
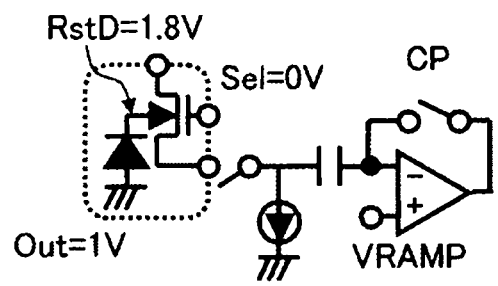
2. DATA READOUT
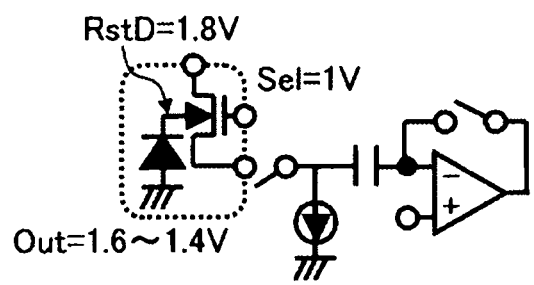
2. RESET
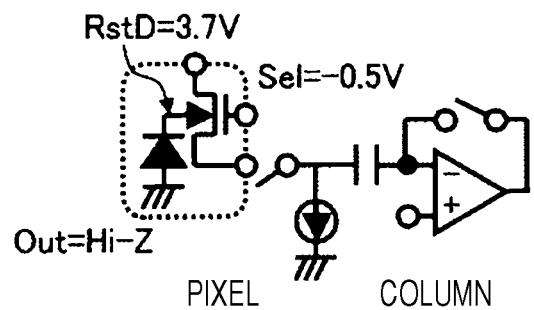

DRIVING TIMING

■ STILL IMAGE SEQUENCE IN TWO-COLUMN SHARING

■ EXAMPLE OF 2 x 2 PIXEL ADDITION SEQUENCE

COLOR FILTER ARRAY IN
COMPLEMENTARY COLOR TYPE

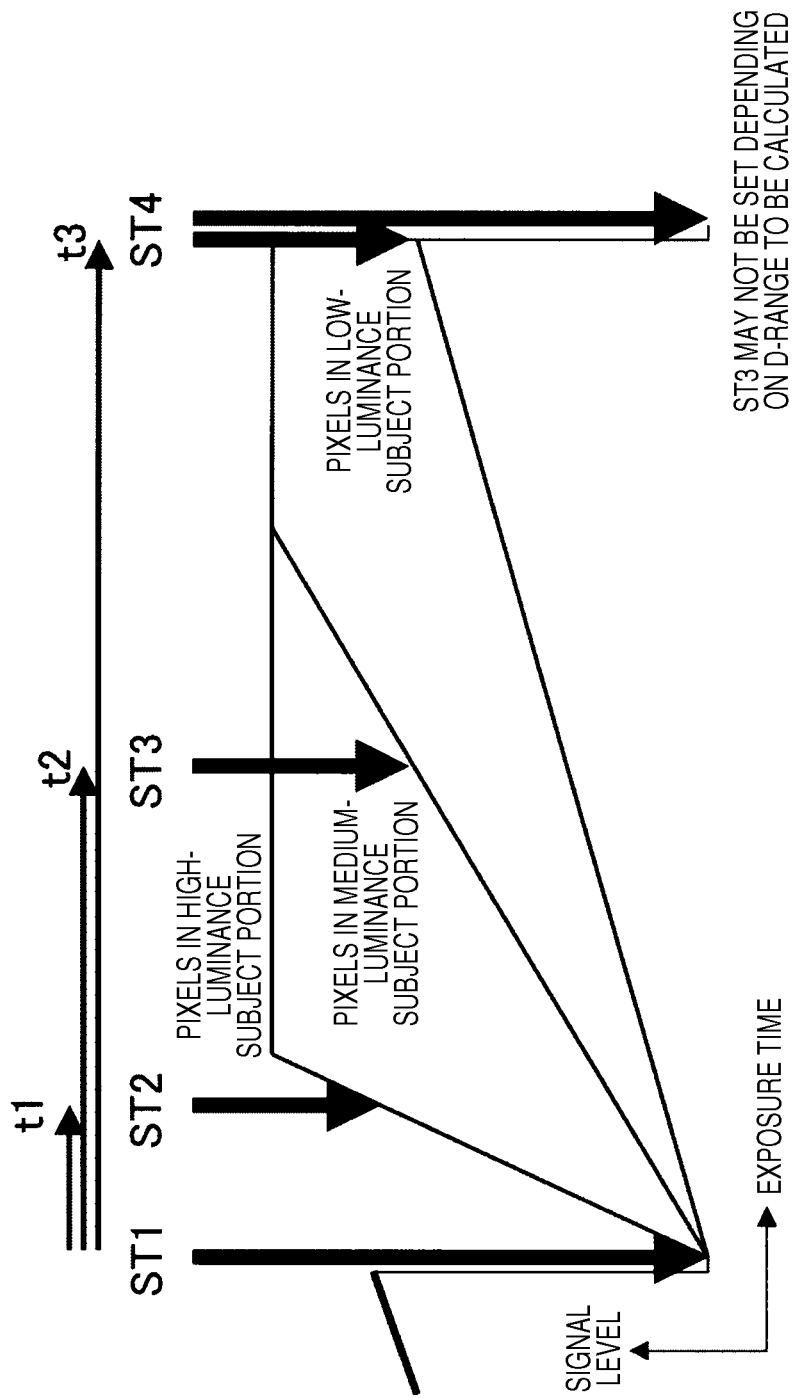

SOLID-STATE IMAGING DEVICE AND CAMERA

RELATED APPLICATION DATA

This application is a continuation of U.S. patent application Ser. No. 12/331,116, filed Dec. 9, 2008, the entirety of which is incorporated herein by reference to the extent permitted by law. This application claims the benefit of priority to Japanese Patent Application No. JP 2007-326175 filed in the Japanese Patent Office on Dec. 18, 2007, the entirely of which is incorporated herein by reference to the extent permitted by law.

BACKGROUND OF THE INVENTION

1. Field of the Invention

The present invention relates to a solid-state imaging device and a camera having a photoelectric conversion element.

2. Description of the Related Art

It is known that, in solid-state imaging devices such as a CCD image sensor and a CMOS image sensor, a crystal defect in a photodiode as a photoelectric conversion element of a light sensing section and a deep level defect in an interface between the light sensing section and an insulating film thereon cause dark current.

As a method of suppressing the occurrence of the dark currents due to the interface state density, an embedded photodiode structure is effective. The embedded photodiode is configured by, for example, forming an n-type semiconductor region and forming a shallow p-type semiconductor region (a hole accumulation region) with high impurity density for the suppression of the dark currents near the surface of the n-type semiconductor region, i.e., an interface between the n-type semiconductor region and an insulating film.

As a method of manufacturing the embedded photodiode, it is a general practice to ion-implant B or $BF_2$ serving as p-type impurities and annealing the same and form a p-type semiconductor region near the interface between the n-type semiconductor region forming the photodiode and the insulating film.

In the CMOS image sensor, each of pixels includes a photodiode and various kinds of transistors such as readout, reset, and amplification transistors. A signal photoelectrically converted by the photodiode is processed by these transistors. A wiring layer including multi-layer metal wiring is formed above each of the pixels. A color filter that specifies the wavelength of light made incident on the photodiode and an on-chip lens that condenses light on the photodiode are formed on the wiring layer.

As such a CMOS image sensor, device structures having various characteristics are proposed.

Specifically, there is proposed various devices such as a charge modulation device (CMD, see Japanese Patent No. 1938092, JP-A-6-120473, and JP-A-60-140752) that adopts a CCD-like characteristic in a photoelectric conversion element structure, a bulk charge modulation device (BCMD, see JP-A-64-14959), a floating well amplifier (FWA, see Japanese Patent No. 2692218 and Japanese Patent No. 3752773) in which a channel is formed on the surface thereof according to a charge amount of photo-holes accumulated to a maximum point, a source to drain current changes according to the charge amount on the surface, and, as a result, readout corresponding to a signal charge is possible, and a Vth modulation image sensor (VMIS, see JP-A-2-304973, JP-A-2005-244434, Japanese Patent No. 2935492, and JP-A-2005-85999) in which a light sensing section and a signal detecting section are divided and arranged adjacent to each other.

There is also proposed a solid-state imaging device in which a light sensing element having all functions of performing photoelectric conversion using incident light, accumulating signal charges obtained by the photoelectric conversion, and outputting signal voltage according to a charge amount of the accumulated signal charges has a potential distribution for facilitating the signal charges to be accumulated in the same place in terms of a plane and facilitating a surface channel current to flow (see JP-A-2003-31785).

These CMOS image sensors are basically front-illuminated solid-state imaging devices that irradiate light from a front side of a device.

On the other hand, there is proposed a back (rear)-illuminated solid-state imaging device that has a rear side of a silicon substrate, on which a photodiode and various transistors are formed, ground to be thinned and makes light incident from the rear side of the substrate to perform photoelectric conversion (see JP-A-10-65138).

SUMMARY OF THE INVENTION

In the front-illuminated CMD, BCMD, FWA, VMIS, and the like, since the substrate is used as an overflow, back (rear) illumination is difficult and reset voltage is high.

In the front-illuminated CMD, BCMD, FWA, VMIS, and the like, since a light sensing section is arranged beside a pickup transistor, there is a disadvantage that an aperture ratio falls.

In an existing photo-gate structure, since light is received through a thin-film gate, there is a disadvantage that blue sensitivity falls.

When a photo-gate type MOS transistor is formed on an $n^-$ layer in the front-illuminated type as in the BCMD, carrier generation by light irradiation is performed near the surface of a semiconductor. Therefore, there is a disadvantage that carriers are captured by a trap present in an interface between the semiconductor and an insulating film, accumulated carriers are not immediately discharged even if reset voltage is applied, and a device characteristic is affected.

When a light sensing photodiode region and a signal detection transistor are arranged to be adjacent to each other in the front-illuminated type as in the VMIS, accumulation and modulation operation for charges generated by light reception are not dynamic actions and are performed separate in terms of time. This is disadvantageous for high-speed signal processing.

Similarly, when the light sensing photodiode region and the signal detection transistor are arranged to be adjacent to each other in the front-illuminated type, contrivance such as provision of a light shielding film above a signal detecting section is necessary. Therefore, there is a disadvantage that an element manufacturing process is complicated.

In the front-illuminated BCMD image sensor, since an entire channel region below a photo-gate electrode is a charge accumulation layer, a current-voltage characteristic (ID-VDD) is not a saturation characteristic but is a triode characteristic. Therefore, there is a disadvantage that, when the image sensor is used in a source follower type, the image sensor is hard to use.

Further, in the front-illuminated CMOS image sensor, there is a disadvantage that light is blocked by wiring above pixels, sensitivity of each of the pixels falls, and, when the light reflected by the wiring is made incident on adjacent pixels, color mixture and the like are caused.

In the solid-state imaging device disclosed in JP-A-2003-31785, a two-layer gate structure is used in order to realize one transistor with a single well. Therefore, there is a disadvantage that, for example, special work is necessary for an element separation area and an element manufacturing process is complicated.

Since this solid-state imaging device is also the front-illuminated type, the solid-state imaging device also has the problems such as the fall in the blue sensitivity and the color mixture of the front-illuminated type.

In the case of the back-illuminated solid-state imaging device disclosed in JP-A-10-65138, hole accumulation regions are formed on a front side and a rear side of the substrate. However, there is a limit in formation of a shallow and dense p-type semiconductor region by ion implantation. Therefore, when it is attempted to further increase the impurity density of the p-type semiconductor region for suppression of dark currents, the p-type semiconductor region is deepened. When the p-type semiconductor region is deepened, since pn junction of the photodiode is separated from a transfer gate, it is likely that a readout ability by the transfer gate falls.

Therefore, it is desirable to provide a solid-state imaging device and a camera that can efficiently and quickly perform a series of operations such as generation and accumulation of photo-carriers, readout of charges, and transmission (reset) of remaining charges, prevent the influence of a trap on carriers in a silicon interface due to light, and realize improvement of sensitivity and pixel size shrinking without deteriorating sensitivity of light with respect to blue.

According to an embodiment of the present invention, there is provided a solid-state imaging device including pixel cells that are formed on a substrate having a first substrate surface side, on which light is irradiated, and a second substrate surface side, on which elements are formed, and separated by an adjacent cell group and an element separation layer for each of the pixel cells or with plural pixel cells as a unit. Each of the pixel cells has a first conductive well formed on the first substrate surface side and a second conductive well formed on the second substrate surface side. The first conductive well receives light from the first substrate surface side and has a photoelectric conversion function and a charge accumulation function for the received light. A transistor that detects accumulated charges in the first conductive well and has a threshold modulation function is formed in the second conductive well.

Preferably, the accumulated charges and signal charges are identical carriers.

Preferably, the transistor has a function of a readout transistor, a function of a reset transistor, and a function of a selection transistor.

Preferably, the transistor has a source and a drain and a gate electrode formed on a channel formation region between the source and the drain, and pixel signal reset is an operation for discarding charges in the drain.

Preferably, the pixel cell has a gamma characteristic that a modulation degree increases when illuminance is low.

Preferably, the pixel cell has the structure in which a capacity increases during a large signal output and has a function of realizing a high dynamic range according to the gamma characteristic.

Preferably, a second conductive separation layer is formed at least on a side of the first conductive well of the first conductive well and the second conductive well.

Preferably, a first conductive source region and a first conductive drain region are formed in the second conductive well or the second conducive separation layer, and a gate electrode is formed on a channel formation region in the second conductive well between the source region and the drain on the second substrate surface side of the substrate.

Preferably, a plurality of the pixel cells are arranged in an array form and share, with adjacent pixel cells, a part or a plurality of contacts of the drain, the source, the wells, or the gate.

Preferably, the contacts of the drain, the source, the wells, and the gate are arranged in four directions of a pixel array of the gate.

Preferably, a plurality of the pixel cells are arranged in an array form, a gate electrode of the pixel cells are formed in common to the pixel cells in a stripe shape in one direction of the pixel array, and a well contact is formed on the source region side or the drain region side.

Preferably, a well contact region is formed in the second conductive separation layer.

Preferably, the well contact region is formed in the second conductive separation layer on the first substrate surface side.

Preferably, when the well contact is formed on the drain side, the well contact is formed in a pinch shape with drain width reduced.

Preferably, in the arrangement of the pixel cells in the array form, the drain contacts are divided into two or more groups in a column and share a column circuit of a signal readout processing system.

Preferably, drain line wiring is backed by a conductor in order to reduce resistance.

Preferably, the solid-state imaging device has, in the gate electrode of the transistor on the second substrate surface side or a further front section of the gate electrode, a reflector that reflects light transmitted through the substrate and makes the light incident on the second conductive well and the first conductive well of the substrate.

Preferably, the thickness of the substrate is set to thickness with which near infrared light can be utilized as the reflected light of the reflector.

Preferably, the thickness of the substrate is set to thickness with which red (R) light can be utilized as the reflected light of the reflector.

Preferably, electrode wiring is formed by a transparent film having high visible light transmittance.

Preferably, the reflector is used as a predetermined wiring layer as well.

Preferably, charges are injected from the drain to the pixels immediately before pixel reset and then the pixels are reset.

Preferably, the solid-state imaging device includes an inverse γ correction circuit that performs inverse gamma correction using a transistor having a back gate terminal of the structure same as that of the transistor of the pixel cells.

Preferably, the solid-state imaging device includes a signal processing system for reading out a signal from the pixel cells, and the signal processing system includes a comparator and utilizes a reset level of a preceding line as a reference level of the comparator.

Preferably, the signal processing system has a function of performing analog sampling during D phase readout and performing digital sampling during P phase readout.

Preferably, the pixel cells are arranged in an array form to obtain one output signal with plural pixels.

Preferably, the pixel cells are arranged in an array form and separated by the element separation layer in a unit of plural pixels to obtain one output signal.

Preferably, the solid-state imaging device includes a signal processing system that performs, during signal readout from the pixels, destructive readout for continuing photoelectric conversion without resetting the pixels.

According to another embodiment of the present invention, there is provided a camera including a solid-state imaging device that receives light from a first substrate surface side of a substrate, an optical system that guides incident light to the first substrate surface side of the solid-state imaging device, and a signal processing circuit that processes an output signal of the solid-state imaging device. The solid-state imaging device includes pixel cells that are formed on the substrate having the first substrate surface side, on which light is irradiated, and a second substrate surface side, on which elements are formed, and separated by an adjacent cell group and an element separation layer for each of the pixel cells or with plural pixel cells as a unit. Each of the pixel cells has a first conductive well formed on the first substrate surface side and a second conductive well formed on the second substrate surface side. The first conductive well receives light from the first substrate surface side and has a photoelectric conversion function and a charge accumulation function for the received light. A transistor that detects accumulated charges in the first conductive well and has a threshold modulation function is formed in the second conductive well.

According to the embodiments of the present invention, light is irradiated on the pixels of the cell structure from the substrate rear surface (first substrate surface) side, photoelectric conversion of the received light is performed in the first conductive well, and charges of the light is accumulated.

The charge accumulation is detected and threshold modulation of the transistor formed in the second conductive well is performed to extract a signal.

In this way, the pixel cells have the double-well structure in the back-illuminated type. The accumulated charges and channel currents (signal charges) are identical carriers.

According to the embodiments of the present invention, it is possible to efficiently and quickly perform a series of operations such as generation and accumulation of photocarriers, readout of charges, and transmission (reset) of remaining charges.

Further, it is possible to prevent the influence of a trap on carriers in a silicon interface due to light and realize improvement of sensitivity and pixel size shrinking without deteriorating sensitivity of light to blue.

BRIEF DESCRIPTION OF THE DRAWINGS

FIGS. 10A and 10B are simplified sectional views taken along an a-a' line and a b-b' line shown in FIG. 9;

FIGS. 16A and 16B are diagrams of an example in which a reflector is provided in pixel cells having different thicknesses;

FIGS. 19A and 19B are diagrams of signal output orders in a square array shown in FIGS. 17A and 17B;

FIGS. 24A and 24B are diagrams of signal output orders in the zigzag array shown in FIGS. 20A and 20B;

FIGS. 25A and 25B are diagrams of signal output orders in the zigzag array shown in FIGS. 22A and 22B;

FIGS. 26A and 26B are diagrams for explaining an example of formation of the reflector at the time when the square array is adopted;

FIG. 28 is a diagram of a second example of the reflector and the wiring sharing layout;

FIG. 29 is a diagram of a third example of the reflector and the wiring sharing layout;

FIGS. 33A to 33C are diagrams of a level diagram of a pre-line reset system, two-column sharing, and 2×2 pixel timing;

FIG. 39 is a diagram of an example of a wide dynamic range (Wide D-Range) sequence by nondestructive readout;

DESCRIPTION OF THE PREFERRED EMBODIMENTS

Embodiments of the present invention will be hereinafter explained with reference to the accompanying drawings.

Figure 1:
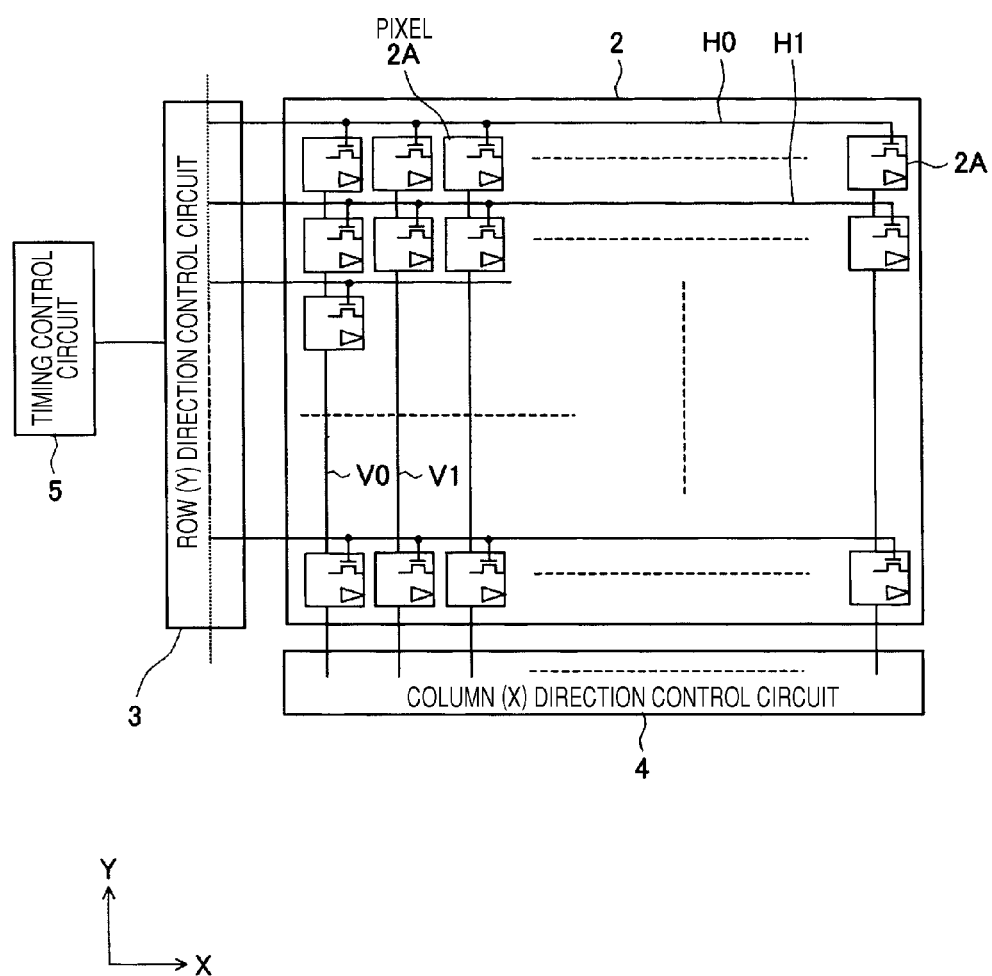
FIG. 1 is a block diagram of a schematic configuration of a solid-state imaging device according to an embodiment of the present invention.

FIG. 1 is a block diagram of a schematic configuration of a solid-state imaging device according to an embodiment of the present invention.

A solid-state imaging device 1 includes, as shown in FIG. 1, a pixel section 2 as a sensing section, a row direction (Y-direction) control circuit 3, a column direction (X direction) control circuit 4, and a timing control circuit 5.

In the pixel section 2, as described in detail later, plural pixel cells 2A are arranged in, for example, a matrix shape.

The pixel cells 2A of the pixel section 2 according to this embodiment is configured as a rear (back)-illuminated image sensor of a threshold modulation (CMD) system having the double-well structure.

The pixel section 2 according to this embodiment adopts the double-well structure. In the pixel section 2, accumulated charges and channel currents are identical carriers. The pixel section 2 has a one-transistor architecture (structure) in which one transistor has functions of a readout transistor, a reset transistor, and a selection transistor.

In a pixel array of the pixel section 2, the pixel cells 2A arranged in an identical row are connected to common row lines H0, H1, and the like and the pixel cells 2A arranged in an identical column are connected to common column lines V0, V1, and the like.

In the solid-state imaging device 1, a timing control circuit 5 that generates an internal clock, a row direction (Y direction) control circuit 3 that controls a row address and row scanning, and a column direction (X direction) control circuit 4 that controls a column address and column scanning are arranged as control circuits for sequentially reading out signals of the pixel section 2.

The row direction (Y direction) control circuit 3 receives a timing control pulse of the timing control circuit 5 and drives predetermined row lines H0, H1, and the like.

The row direction (X direction) control circuit 4 receives timing control pulse of the timing control circuit 5, receives signals read out to predetermined column lines V0, V1, and the like, and performs predetermined processing (CDS (Correlated Double Sampling) processing), analog to digital conversion processing, and the like.

A configuration and functions concerning signal readout processing from the pixel cells 2A in the column direction control circuit 4 are described in detail later.

A specific device structure of the pixel section of the solid-state imaging device according to this embodiment is explained below.

Figure 2A:
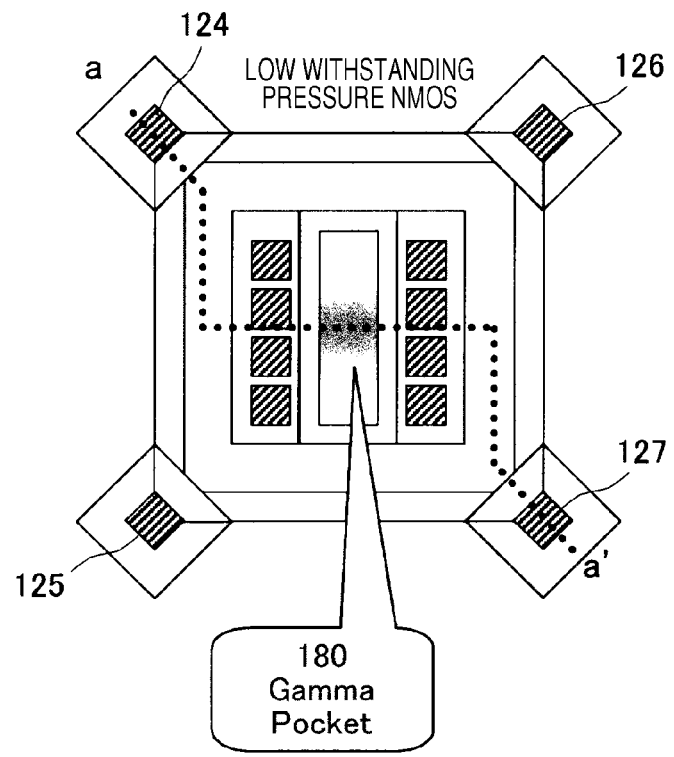
FIGS. 2A and 2B are diagrams of a basic structure of a pixel section of the solid-state imaging device according to the embodiment.
Figure 2B:
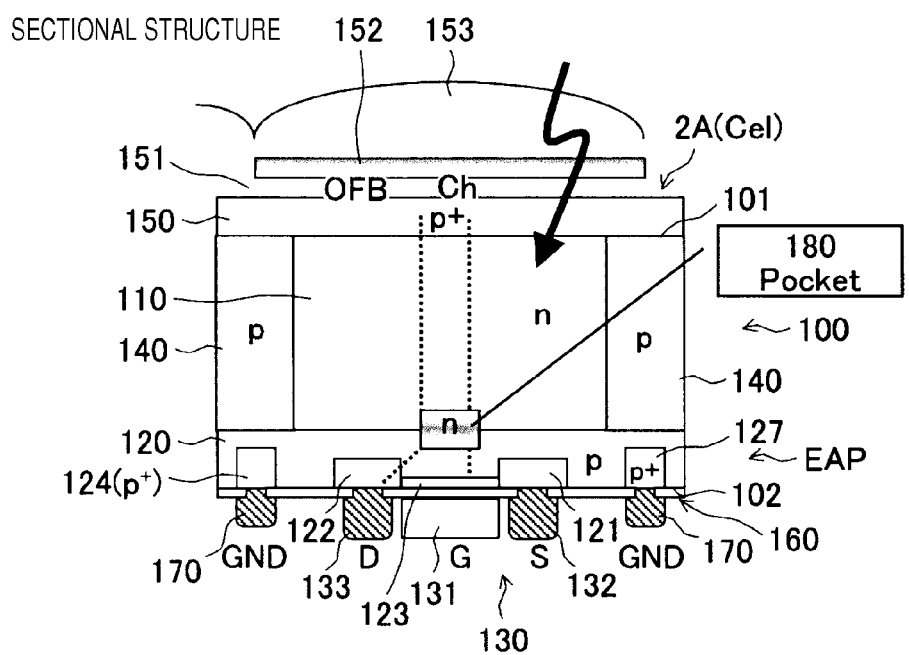

FIGS. 2A and 2B are diagrams of a basic structure of the pixel section of the solid-state imaging device according to this embodiment. FIG. 2A is a plan view and FIG. 2B is a simplified sectional view taken along an a-a' line shown in FIG. 2A.

As shown in FIG. 2B, the solid-state imaging device 1 is formed as a rear (back)-illuminated device in which light is made incident from a first substrate surface 101 side (a rear side) of a substrate (a silicon substrate) 100 and an element area portion EAP, in which a MOS transistor is formed, is formed on a second substrate surface 102 side (a front side).

The substrate 100 is formed by thin-filming a silicon wafer such that light can be made incident from the rear side. The thickness of the substrate 100 is 2 μm to 6 μm for visible light and 6 μm to 10 μm for near infrared light depending on a type of the solid-state imaging device 1.

In this way, the substrate 100 has the first substrate surface 101 side on which light is irradiated and the second substrate surface 102 side on which elements are formed. The plural cells Cel (2A) separated by adjacent cells and an element separation layer are formed on the substrate 100.

In this embodiment, on the substrate 100, the plural pixel cells Cel (2A) separated by an adjacent cell group and the element separation layer for each of pixels cells or with plural pixel cells as a unit are formed.

Each of the pixel cells Cel includes a first conductive (in this embodiment, n-type) well (hereinafter referred to as first well) 110 formed on the first substrate surface 101 side and a second conductive (p-type) well (hereinafter referred to as second well) 120 formed further on the second substrate surface 102 side than the first well 110.

The n-type first well 110 functions as a light sensing section that receives light from the first substrate surface 101 side and has a photoelectric conversion function and a charge accumulation function for the received light.

A MOS transistor that detects accumulated charges in the light sensing section of the first well 110 and has a threshold modulation function is formed in the second well 120.

A p-type element separation layer (conductive layer) 140 of a second conducive type opposite to a first conductive type (in this embodiment, n-type) is formed to surround sidewalls of the first well 110. A $p^+$ layer 150 is formed on the first substrate surface 101, which is a light incident surface of the substrate 100.

An insulating film and a protective film 151 formed of, for example, silicon oxide are formed on a light incident surface side of the $p^+$ layer 150. A color filter 152 that transmits only light in a desired waveform region is formed on the protective film 151. A microlens 153 that condenses incident light on the light sensing section of the first well 110 is formed on the color filter 152.

In the p-type second well 120, a source region 121 and a drain region 122 formed by an $n^+$ layer are formed in the center thereof at a predetermined space apart from each other. A channel forming region 123 is formed between the source region 121 and the drain region 122.

Well (substrate) contact regions 124 to 127 formed of a p+ layer are formed in an area (an end side area) of the second well 120 not overlapping the first well 110.

An insulating film 160 of silicon oxide or the like is selectively formed by a predetermined process on the surface of the second substrate surface 102 of the substrate 100 on which the source region 121, the drain region 122, and the well contact regions 124 to 127 are formed.

A gate electrode 131 of the transistor 130 is formed, via the insulating film 160, on the channel forming region 123 between the source region 121 and the drain region 122 on the second substrate surface 102 side of the substrate 100.

A source electrode 132 of the transistor 130 connected to the source region 121 is formed by opening a part of the insulating film 160 on the source region 121.

Similarly, a drain electrode 133 of the transistor 130 connected to the drain region 122 is formed by opening a part of the insulating film 160 on the drain region 122.

A well contact electrode 170 connected to the well contact regions 124 to 127 is formed by opening a part of the insulating film 160 on the well contact regions 124 to 127. A level of the well contact region 170 is set to, for example, the ground potential GND (0V) or −1.2 V.

In the configuration described above, the transistor 130 including an insulated-gate field effect transistor (referred to as MOS transistor) is formed by the source region 121, the drain region 122, and the channel forming region 123 formed in the second well 120 on the second substrate surface 102 side and the gate electrode 131, the source electrode 132, and the drain electrode 133 formed on the surface side of the second substrate surface 102.

In FIG. 2B, reference sign S denotes a source of the transistor 130, D denotes a drain of the transistor 130, and G denotes a gate of the transistor 130.

In this way, each of the pixel cells Cel (2A) according to this embodiment is formed as the rear (back)-illuminated image sensor of the threshold modulation (CMD) system having the double-well structure.

Figure 3:
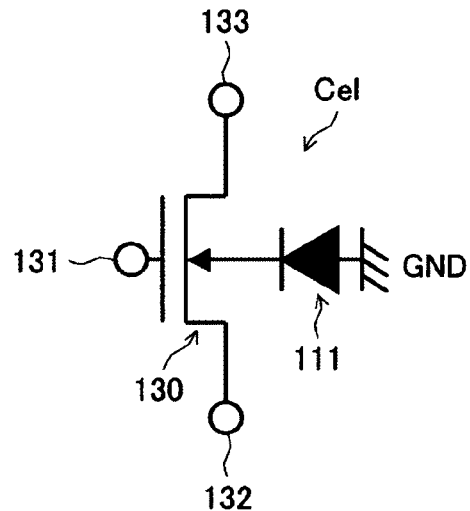
FIG. 3 is a diagram of an equivalent circuit of a pixel cell according to the embodiment.

FIG. 3 is a diagram of an equivalent circuit of the pixel cell according to this embodiment.

The pixel cell 2A (Cel) includes, as shown in FIG. 3, a photoelectric conversion and charge accumulation element section 111 formed in the first well 110 and one transistor 130 formed by the second well 120 and an electrode on the second substrate surface 102 side.

As described above, the pixel cell Cel according to this embodiment is the back-illuminated type and has the double-well structure. In the pixel cell Cel, accumulated charges and channel currents are identical carriers. Further, the pixel cell Cel has a one-transistor architecture (structure) in which one transistor has functions of a readout transistor, a reset transistor, and a selection transistor.

In other words, in this embodiment, the pixel cell Cel is the back-illuminated type and adopts the double-well structure and does not adopt a single-well modulation system. A reason for this is explained below.

When the single-well modulation system is adopted, pocket implantation for linearity improvement is necessary. This makes it difficult to obtain saturated charges Qs during pixel size shrinking in order to reduce an accumulation region.

Even if the single-well structure has a high modulation degree and high conversion efficiency, the single-well structure is susceptible to a defect. In the single-well structure, pixel fluctuation in linearity (non-linearity like as cat's paw) tends to frequently occur and, when the pixel fluctuation occurs, it is difficult to correct the pixel fluctuation.

Since pinning comes off during readout, the single-well structure is incompatible with column digital CDS. In analog CDS, an increase in a capacity hinders pixel size shrinking.

Even if the single-well structure is combined with the back-illumination, since a reset transistor is necessary and a pixel cell has two transistors, this is disadvantageous for pixel size shrinking.

On the other hand, in this embodiment, the pixel cell Cel is the back-illuminated type and has the double-well structure, accumulated charges and channel currents are identical carriers, and pixel separation can be performed by an independent carrier. Therefore, the transistor structure does not need to be a ring. The transistor can be configured by so-called unidirectional structure of drain (D)/gate (G)/source (S) same as the structure of the normal transistor.

In this embodiment, the structure for discharging signal carriers to the drain of the transistor 130 is adopted. This realizes a complete one-transistor and lateral reset structure in which one transistor is used as a readout (pickup) transistor, a rest transistor, and a selection transistor.

In other words, since the pixel cell structure according to this embodiment only has to be the single-layer gate structure rather than the double-layer gate structure, special work is unnecessary for the element separation area.

A drain, a source, and a gate can be shared between adjacent pixels. Therefore, it is possible to remarkably improve layout efficiency and perform pixel size shrinking.

Since lateral reset by the drain of the transistor is adopted, it is possible to share a column and shrink a column circuit by using lateral wiring for the drain and using separate wiring in shared pixel units.

Since a space is formed on the gate of the transistor, a reflector structure, which makes use of metal of wiring or the like, can be provided in the space. As a result, it is possible to reflect light transmitted through a silicon (Si) substrate, photoelectrically convert the light in Si again, and improve, for example, near infrared sensitivity.

In the existing structure, dark currents generated in the interface are recombined with holes by turning off the gate during a light emission period and pinning the surface of the silicon (Si) substrate. Therefore, components not completely recombined cause dark current unevenness and a white dot defect.

On the other hand, in the structure according to this embodiment, since the double-well structure is adopted, there is an advantage that it is possible to discharge dark current electrons generated on the Si surface from the channel to the drain and completely shut out dark currents and white dots caused in the interface.

As a result, even if the gate is turned on during column readout, dark currents and white dots do not pose a problem. Therefore, it is possible to perform nondestructive readout of signals.

An array structure for realizing pixel size shrinking, a configuration including a reflector, a configuration and functions of a signal readout processing system, and nondestructive readout processing for signals are described in detail later.

Operations in the pixel cell having the configuration described above are explained below.

Light is made incident in the pixel cell from the first substrate surface (rear surface) 101 on the rear side. Electron and hole pairs are generated mainly by a photoelectric effect in the n-type first well 110 in the pixel cell. The generated holes are discharged to the outside through the p-type element separation layer 140 forming a wall surface of the cell.

Only the electrons are accumulated in the n-type first well 110 and accumulated in a potential well formed near a gate region semiconductor surface between the source and the drain of the transistor 130 serving as the MOS transistor. A signal of the accumulated charges is amplified and detected through the transistor 130, the accumulated charges are discharged as appropriate, and control of color mixture and a saturate charge amount is performed.

The thickness of a semiconductor layer of a sensor of the solid-state imaging device 1 is about 2 μm to 10 μm, which is the thickness enough for displaying quantum efficiency of photoelectric conversion in a wavelength range of light.

On the other hand, in the case of the front-illuminated type, usually, the thickness of the semiconductor substrate needs to be kept at the thickness (up to several hundreds μm) that makes an element less easily cracked. Therefore, a leak current between a source and a drain through a substrate of the element may be unable to be neglected and may pose a problem.

On the other hand, in this embodiment, since the thickness of the element is sufficiently small, it is possible to reduce the leak current through the substrate and prevent the problem.

The configuration and the functions of the solid-state imaging device 1 according to this embodiment are explained above.

The solid-state imaging device 1 is examined more in detail below.

Figure 4:
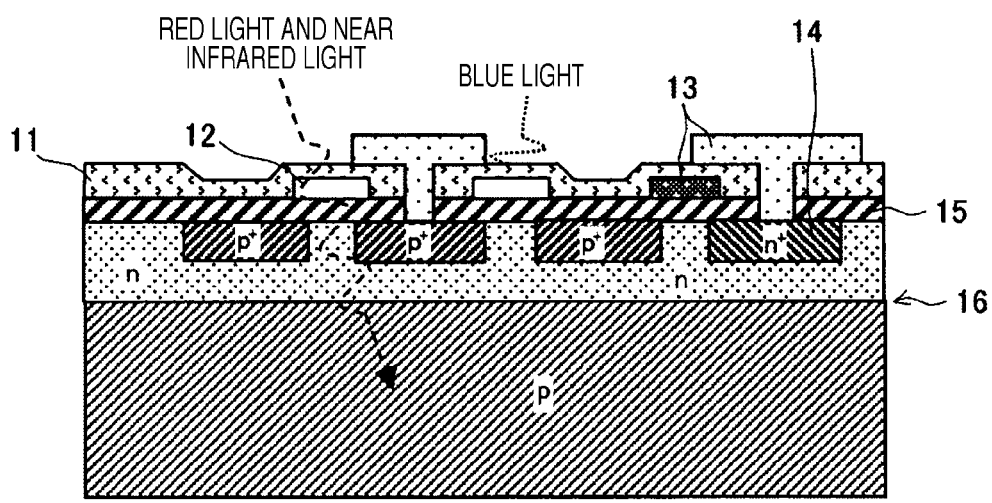
FIG. 4 is a diagram for explaining what kind of relation the wavelength of incident light has with an arrangement of transistors in the case of a front-illuminated BMCD.

FIG. 4 is a diagram for explaining what kind of relation the wavelength of incident light has with an arrangement of transistors in the case of a front-illuminated BMCD.

In a front-illuminated BMCD 10 shown in FIG. 4, an insulating film 11, transparent electrodes 12, light shielding electrodes 13, and the like are formed on a substrate front surface side. Reference numeral 14 denotes lateral drains, 15 denotes a gate insulating film, and 16 denotes a silicon substrate.

In the case of the front illumination shown in FIG. 4, light penetrates from a side on which transistors are set. Since the lateral drain regions 14 are covered with the light shielding electrodes 13, the light penetrates into the silicon substrate 16 from an opening other than the lateral drain regions 14 while being transmitted through the insulating film 11, the transparent electrodes 12, the gate insulating film 15, and the like. Red light and near infrared light having large wavelength penetrate relatively deep from the surface of silicon. However, blue light and near ultraviolet light are photoelectrically converted in a place not so deep inside. When light having small wavelength passes through an insulating multilayer film on the surface, the light tends to lose energy because of scattering, absorption, reflection on an interface surface, or the like.

On the other hand, in the case of the rear illumination according to the embodiment shown in FIG. 2B, light penetrates into the substrate (the silicon substrate) 100 from the side where the transistor 130 is not arranged. Most of light having large wavelength reaches near the transistor 130 but only a part of light having small wavelength reaches near the transistor 130.

Various proposals are made concerning how a diffusion layer of a source and a drain and a well layer should be formed in order to maximize quantum efficiency including the wavelength of incident light.

However, there is little argument concerning the possibility that light passing through a silicon oxide film (an insulating film) affects a transistor characteristic. In this embodiment, a mechanism concerning this point is clarified to some extent, although qualitatively.

Figure 5:
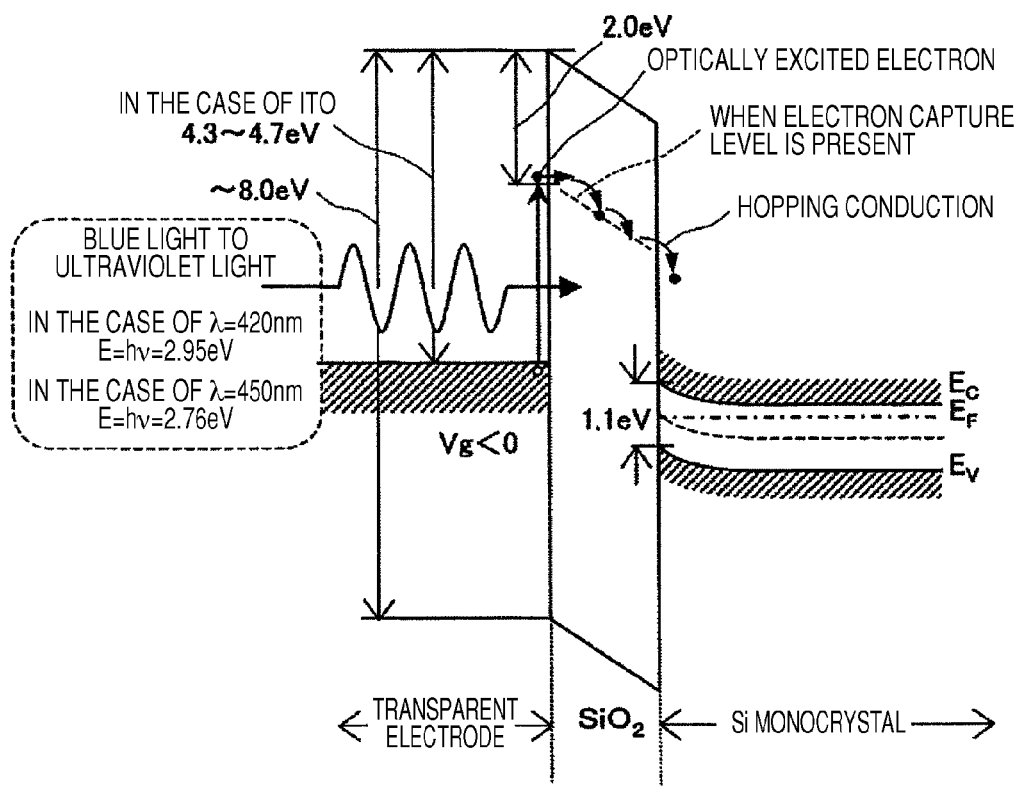
FIG. 5 is a diagram of an overview of an energy band state formed by a transparent electrode, a gate silicon oxide film, and silicon monocrystal in the case of a front-illuminated type.

FIG. 5 is a diagram of an overview of an energy band state formed by a transparent electrode, a gate silicon oxide film, and silicon monocrystal in the case of the front-illuminated type.

A characteristic of a gate oxide film may be considerably different depending on a manufacturing method or processing. When the manufacturing method of the processing is not well-controlled, a trap that captures electrons and holes remains in the silicon oxide film. In the figure, a trap that captures electrons is present in a position of 2.0 eV under a conduction band of the silicon oxide film.

In the case of a silicon thermal oxide film, a band gap is about 8.0 eV. When an ITO is used as a transparent electrode, a work function is about 4.3 eV to 4.7 eV. Therefore, a Fermi level of the transparent electrode is located a little below the center of an energy gap of the silicon thermal oxide film.

When attention is paid to a blue light component in incident light, for example, wavelength λ of 450 nm, this is equivalent to E=2.76 eV from the Einstein photoelectric law E=hv. As shown in the figure, this energy is substantially equal to a position of an energy level of an electron trap in the oxide film measured from the Fermi level of the transparent electrode.

At this point, if relatively large negative voltage is applied to the transparent gate electrode compared with voltage applied to the silicon substrate, electrons ejected from the metal surface (the transparent electrode) by the photoelectric effect are excited in the oxide film and captured by the trap.

The electrons captured by the trap are ejected again by an electric field, flow into the conduction band of the silicon monocrystal according to hopping conduction, bring the gate electrode and the silicon into a weak conduction state, and cause fluctuation in the transistor characteristic and a signal amount.

In the rear illumination according to this embodiment, light having large energy and small wavelength consumes most of energy thereof for photo-carrier generation in the silicon substrate until the light reaches the transistor region. Therefore, the rear illumination does not have the disadvantage of the front illumination.

Figure 6:
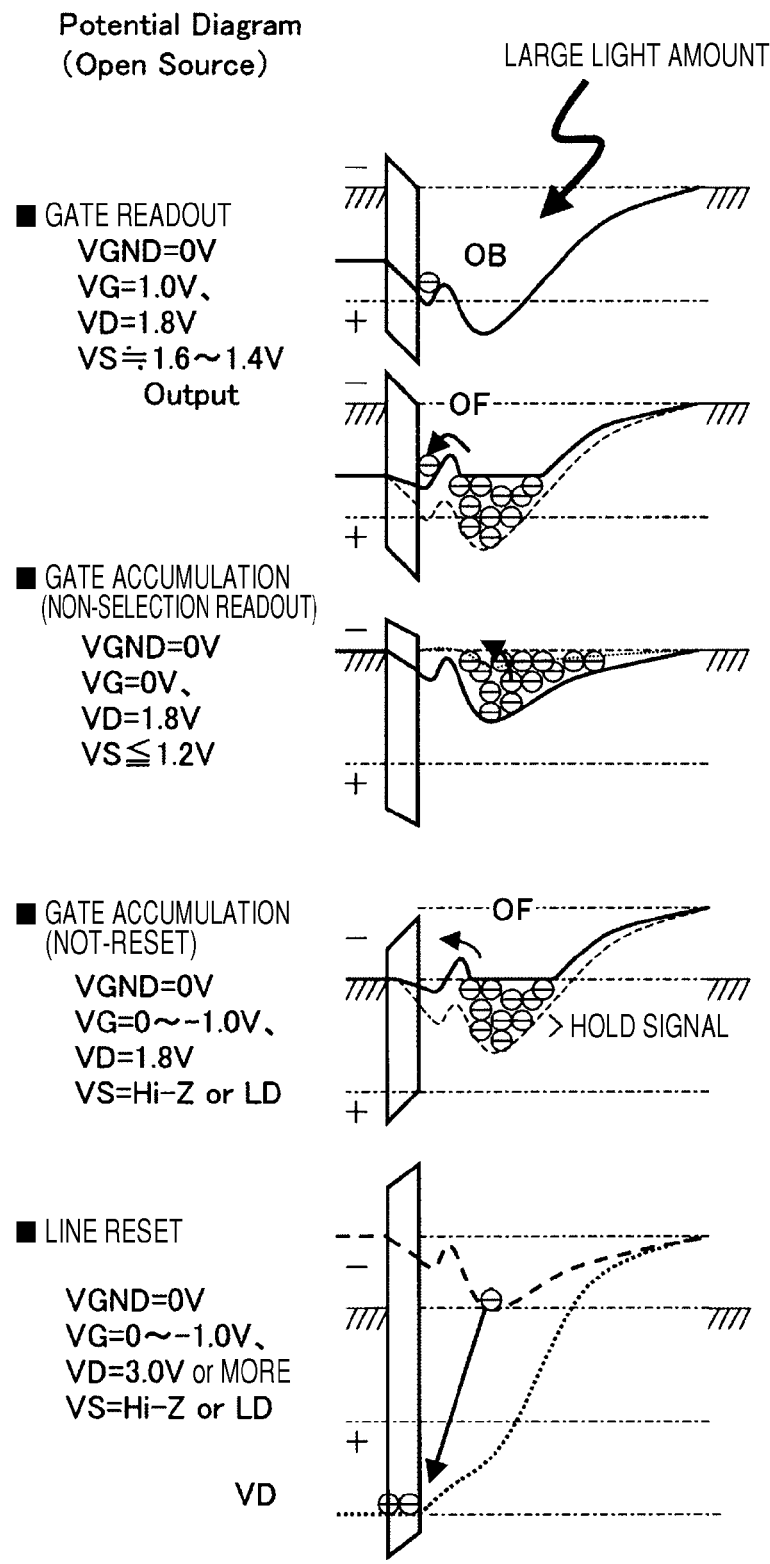
FIG. 6 is a diagram of a change in potential with respect to electrons in a semiconductor substrate in a direction perpendicular to a semiconductor substrate surface in each region according to a change in a potential state of the device shown in FIGS. 2A and 2B.

FIG. 6 is a diagram of a change in potential with respect to electrons in a semiconductor substrate in a direction perpendicular to a semiconductor substrate surface in each of regions according to a potential state change of the device shown in FIGS. 2A and 2B.

In all states, voltage VGND of the well contact electrode 170 is set to 0 V.

(i) Gate Readout

When the gate voltage VG of the transistor 130 is set to 1.0 V and the drain voltage VD thereof is set to 1.8 V, the source voltage VS thereof is about 1.6 V to 1.4 V. Accumulated charges (electrons) decrease and a channel electron current flowing from the source to the drain is modulated and decreases according to the decrease in the accumulated charges. If this current change is measured, an amount of change of charges of the accumulated electrons is obtained.

(ii) Gate Accumulation (Non-Readout State)

When the gate voltage VG of the transistor 130 is set to 0 V and the drain voltage VD thereof is set to 1.8 V, the source voltage VS thereof is equal to or lower than 1.2 V. Electrons are accumulated in the potential well formed near the semiconductor surface in the gate region between the source and the drain of the transistor 130.

(iii) Gate Accumulation (Non-Reset State, Hard Reset)

When the gate voltage VG of the transistor 130 is set to 0 V to −1.0 V and the drain voltage VD thereof is set to 1.8 V, the source voltage VS thereof has high impedance Hi-Z or LD.

The accumulated electrons overflow. In other words, the pixel cell Cel is saturated. At this point, a signal is held.

(iv) Reset

When the gate voltage VG of the transistor 130 is set to 0 V to −1.0 V and the drain voltage VD thereof is set to be equal to or higher than 3.0 V, for example, set to 3.7 V, the source voltage VS thereof has high impedance Hi-Z or LD. The electrons present in the accumulation well are discharged to the outside through the drain electrode.

As described above, in this embodiment, as pixel signal reset, the drain voltage VD is modulated and, in some case, both the drain voltage VD and the gate voltage VG are modulated (in the example shown in FIG. 6, a potential difference between the drain and the gate is increased) to discharge signal charges (electrons) accumulated in the drain electrode.

In this embodiment, a so-called gamma (γ) characteristic is given to the pixel cell to increase a degree of modulation and conversion efficiency when illuminance is low.

In this embodiment, the γ characteristic is applied to a high dynamic range (DR).

The γ characteristic of the pixel cell is explained below.

Figure 7:
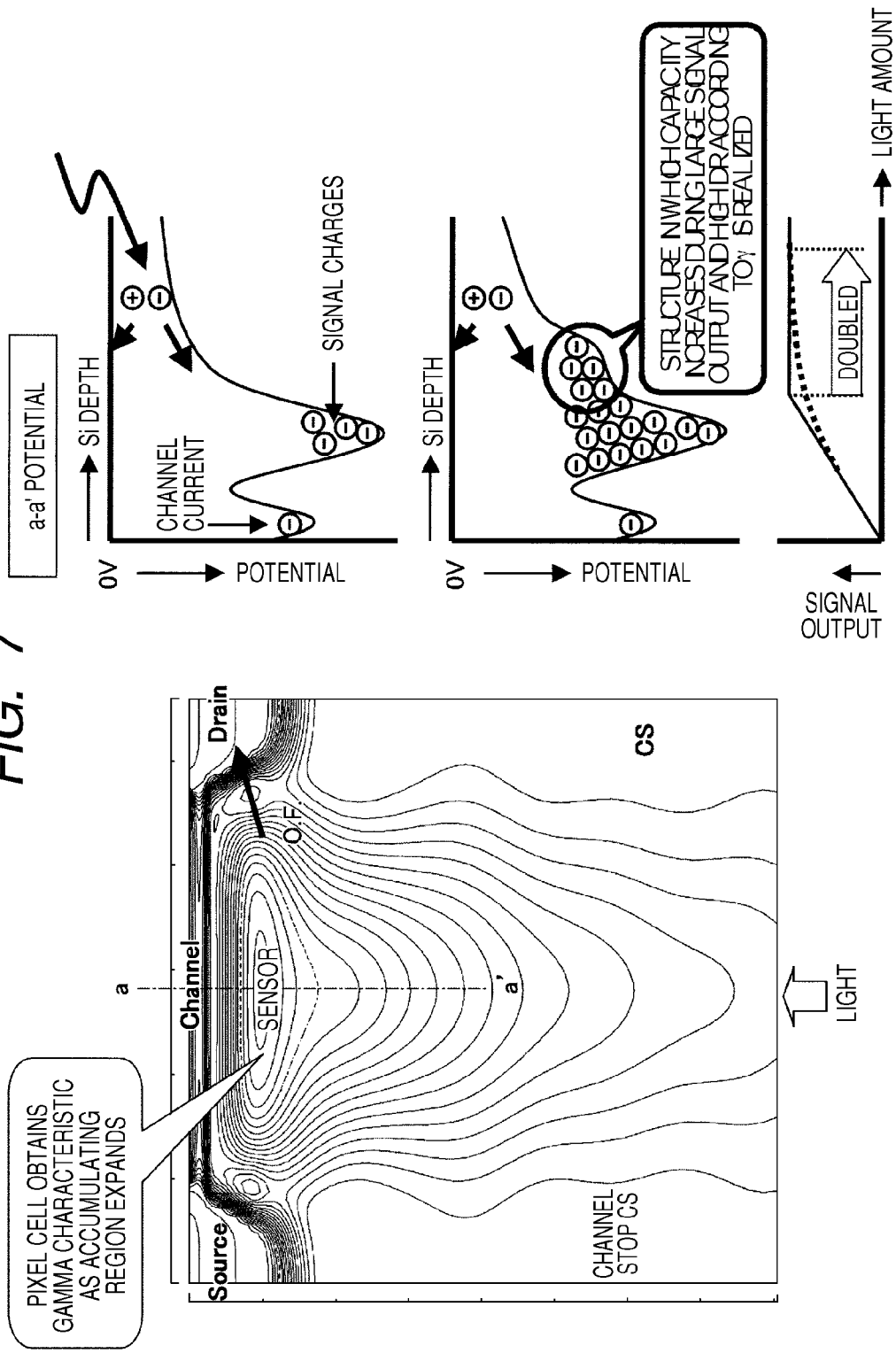
FIG. 7 is a diagram of an example of a potential distribution in an a-a' line shown in FIGS. 2A and 2B.

FIG. 7 is a diagram of an example of a potential distribution in an a-a' line shown in FIG. 2A.

As one of characteristics of a double well, as shown in FIG. 7, a sensor accumulation region has a broad potential shape. Therefore, a capacity of the double well changes according to a signal amount and has nonlinearity (the γ characteristic).

However, in the case of the γ characteristic that a gain increases during a small signal output in response to nonlinearity of the single-well structure and lack of a signal during the small signal output, since inverse γ correction is possible and a gain during low illuminance is minus, noise is compressed simultaneously with the signal. This makes it possible to reduce noise.

In this way, in this embodiment, the γ characteristic is positively utilized and, as shown in FIG. 2B, a rather deep n-type gamma pocket 180 for accumulating small signals is provided.

In the gamma pocket 180, signal carries and signal currents concentrate on one point and a degree of modulation of the small signals is improved.

It is possible to perform inverse gamma correction in a DSP at a later stage, which performs signal processing, and realize total noise compression.

As shown in FIG. 7, the pixel cell Cel has the structure in which a capacity thereof increases during a large signal output and realizes the high dynamic range (DR) according to the γ characteristic.

Figure 8:
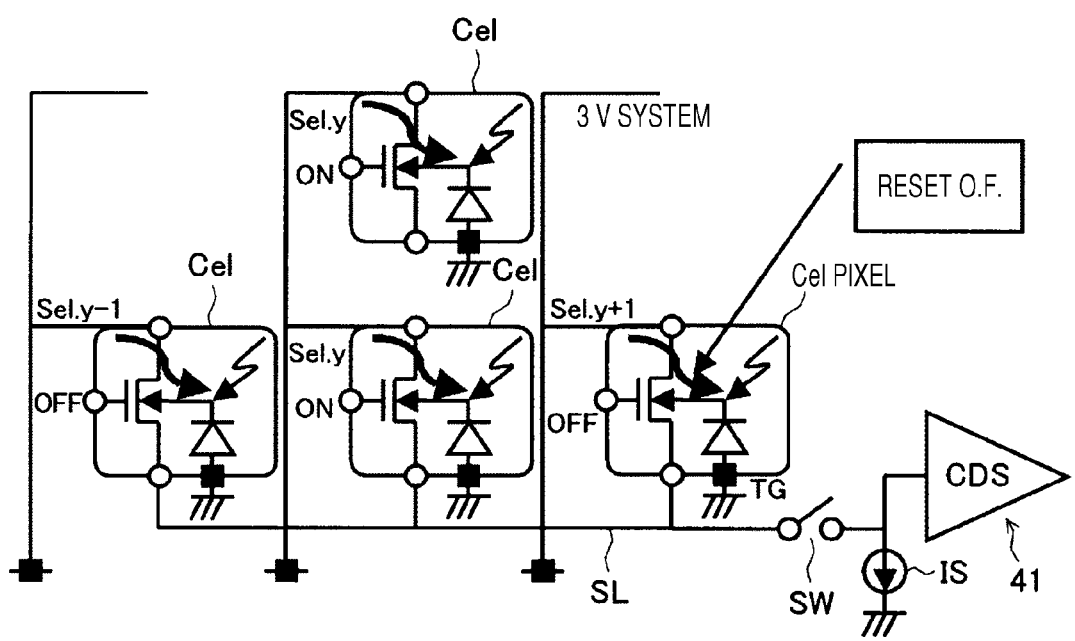
FIG. 8 is a schematic diagram of a configuration of a signal readout processing system according to the embodiment.

FIG. 8 is a schematic diagram of a configuration of the signal readout processing system according to this embodiment.

The column (X) direction control circuit 4 includes a CDS circuit 41. An accumulated signal of the pixel cell Cel in an ON state is transferred to the CDS circuit 41 through a signal transmission line SL and a switch SW. Reference sign IS denotes a current source for forming a source follower.

The configuration and the functions of the pixel cell according to this embodiment are explained above.

An array of the pixel cells of the pixel section 2, a configuration including a reflector, and the like are explained below.

Figure 9:
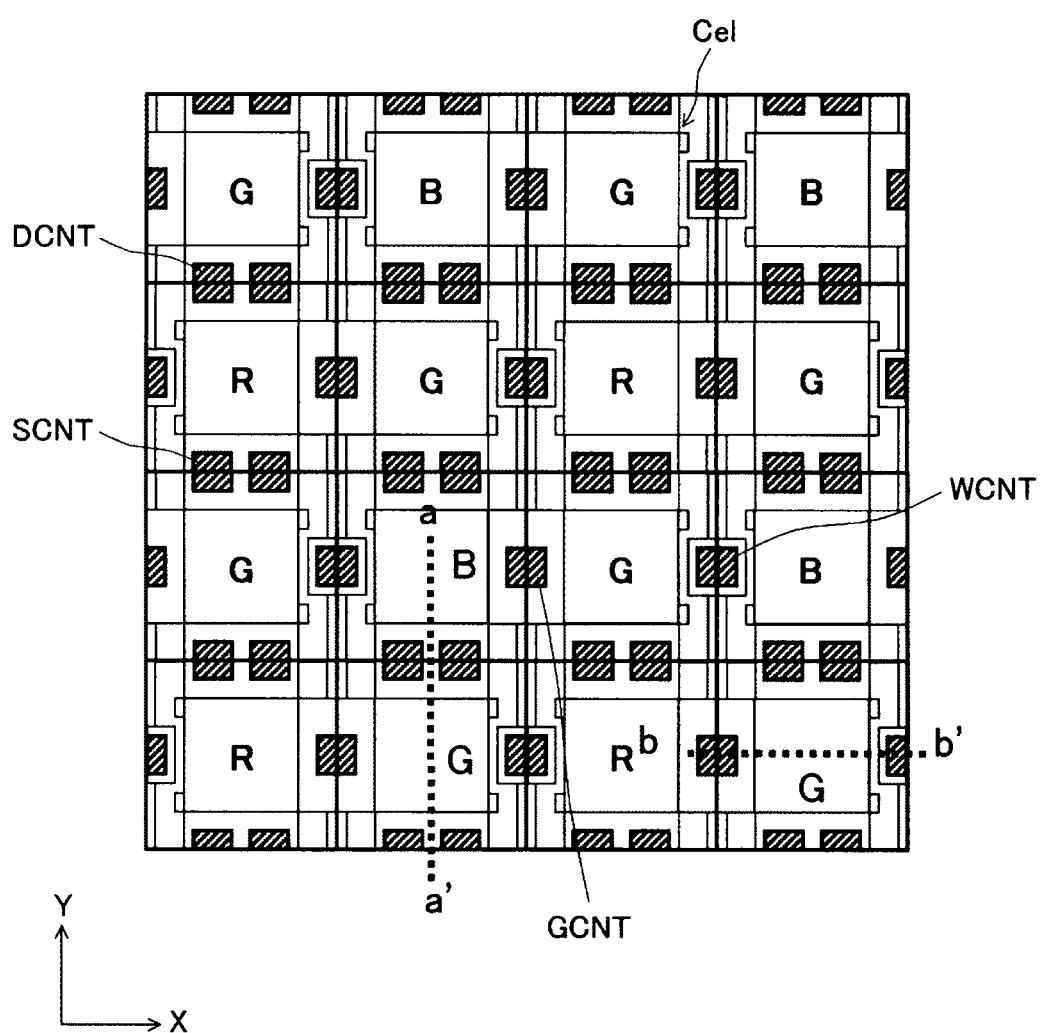
FIG. 9 is a diagram of an example of a layout of pixel cells in the pixel section according to the embodiment.

FIG. 9 is a diagram of an example of a layout of pixel cells in the pixel section according to this embodiment. FIG. 10A is a simplified sectional view taken along an a-a' line shown in FIG. 9. FIG. 10B is a simplified sectional view taken along a b-b' line shown in FIG. 9.

In this example, the pixel cells Cel are arranged in a matrix shape. A Bayer array is adopted.

A p-type element separation layer (conductive layer) 140A is formed on sidewalls of the first well 110 and the second well 120. A source region 141 and a drain region 142 including the n⁺ layer forming the transistor 130 are formed in the p-type element separation layer 140A. A well contact region 143 is formed on the source region 141 side or the drain region 142 side. In this example, the well contact region 143 is formed on the source region 141 side.

A gate contact electrode 190 is formed in a position opposed to the p-type element separation layer 140A.

A reflector 200 is formed on a front side (a side where light is not irradiated) of the gate electrode 131 of the pixel cell Cel excluding the element separation layer 140A.

In this way, the pixel cells are arranged to share, with adjacent pixel cells, a part or a plurality of contacts of the drain, the source, the wells, or the gate. This makes it possible to improve the layout efficiency.

In other words, since the pixel cell Cel can be configured by one transistor, the contacts of the drain, the source, the gate, and the well are arranged in the four directions on the pixel separation layers and the gate occupies the entire pixel. Therefore, random noise of the transistor is remarkably reduced.

In the layout example shown in FIG. 9, a drain contact DCNT and a source contact SCNT are shared by pixel cells adjacent to each other in a Y direction (a vertical direction or a row direction) of X and Y directions shown in the figure. A gate contact GCNT and a well contact WCNT are shared by pixel cells adjacent to each other in the X direction (a horizontal direction or a column direction).

In this way, the drain contact DCNT, the source contact SCNT, the gate contact GCMT, and the well (substrate) contact WCNT can be arranged in the four direction of the gate. Therefore, as shown in FIG. 11, the layout can be used in a so-called zigzag array as well.

Figure 11:
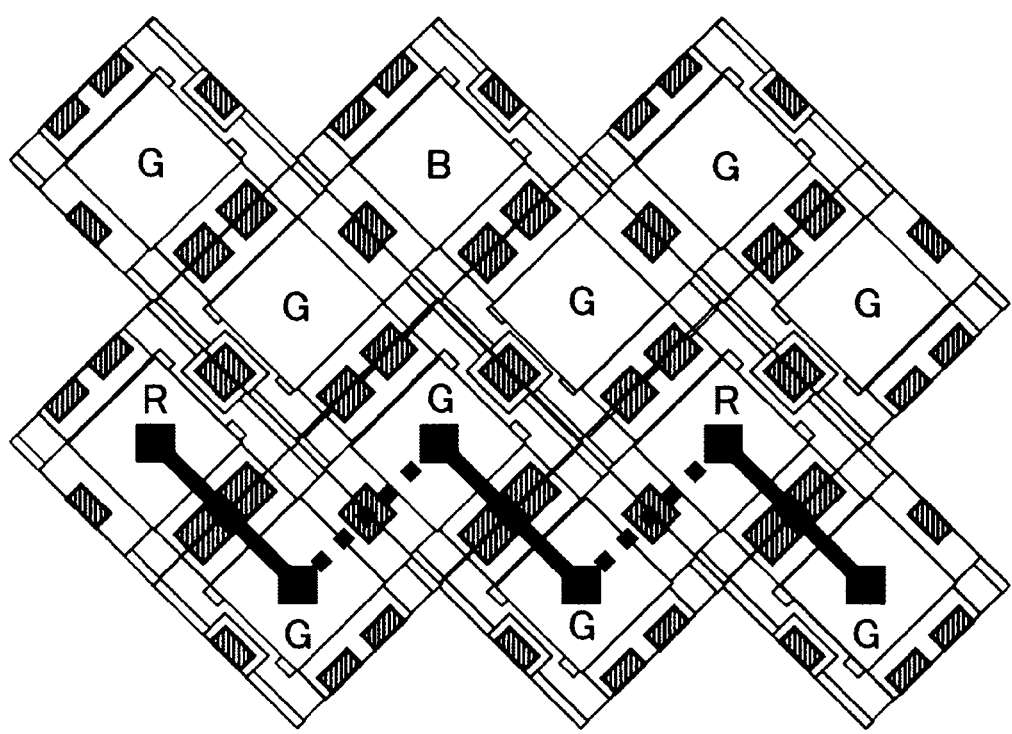
FIG. 11 is a diagram of the structure in which the pixel cells are arranged to be rotated 45 degrees from those shown in FIG. 9.

In an example shown in FIG. 11, the arrangement shown in FIG. 9 is rotated by 45 degrees.

Figure 12:
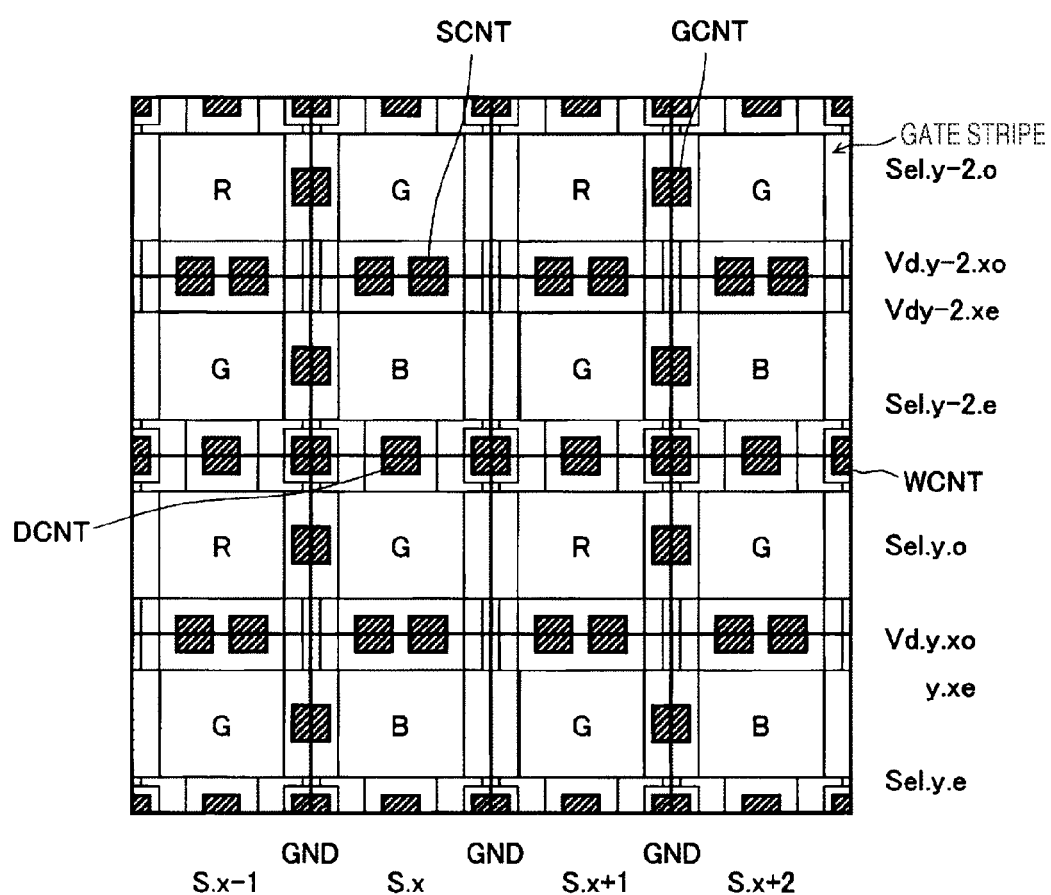
FIG. 12 is a diagram of an example of a layout in which a gate is used in common in an X direction (horizontal direction) stripe.

FIG. 12 is a diagram of an example of a layout in which a gate is shared in an X direction (horizontal direction) stripe.

As shown in the figure, in the layout, the gate is shared in the horizontal stripe and the well (substrate) contact WCNT is set on the source side or the drain side. This makes it possible to easily form the reflector 200.

In this case, the well (substrate) contact WCNT may be arranged in every other column in the X (horizontal) direction.

It may be determined according to withstanding pressure or a layout whether the well (substrate) contact WCNT should be set on the drain side or the source side.

When the well (substrate) contact WCNT is set on the source side, since a potential difference is reduced, there is an advantage that pixel size shrinking can be easily performed.

Figure 13:
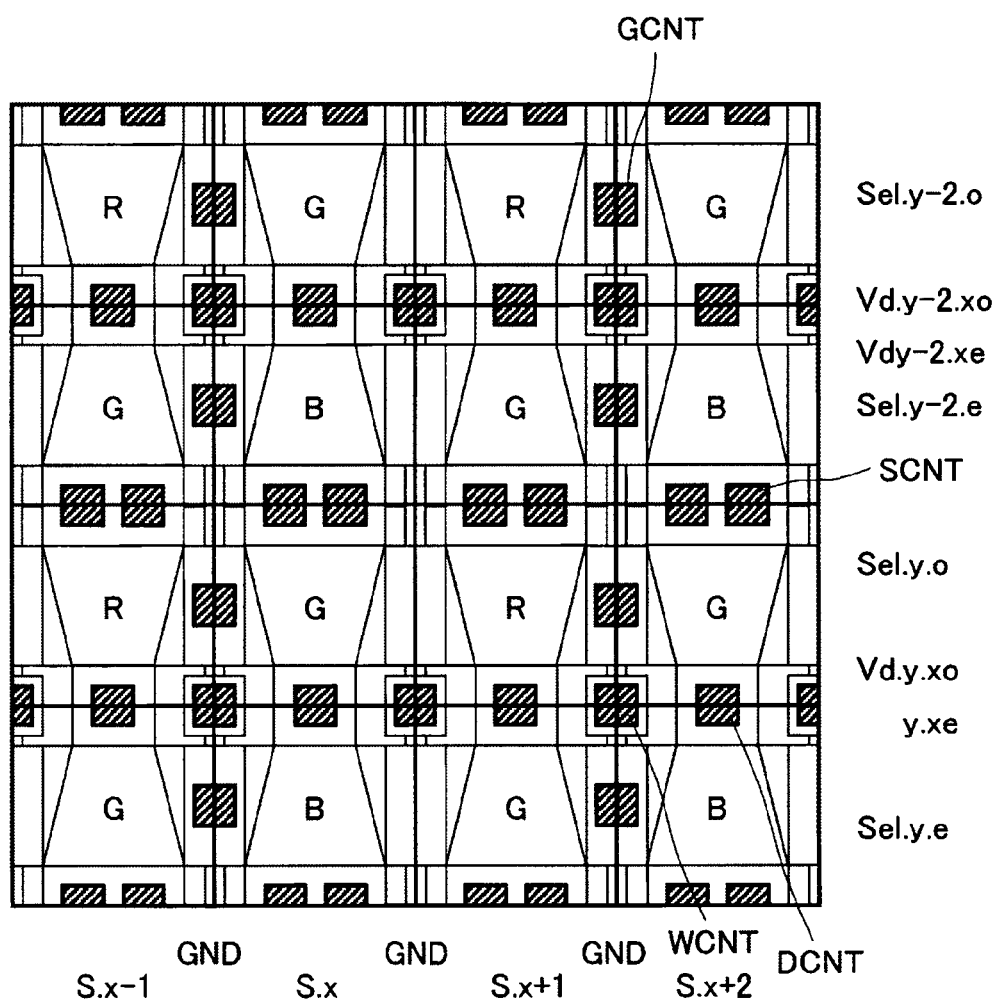
FIG. 13 is a diagram of an example of a layout in which a drain side is pinched.

FIG. 13 is a diagram of an example of a layout in which the drain side is pinched.

When the well (substrate) contact WCNT is set on the drain side, drain width is reduced, i.e., pinched to secure withstanding pressure.

Consequently, since a cannel on the source side is widened, the source side is deepened and a portion in which signals are accumulated and a portion to which modulation tends to be applied coincide with each other, and a high modulation characteristic is obtained.

Figure 14:
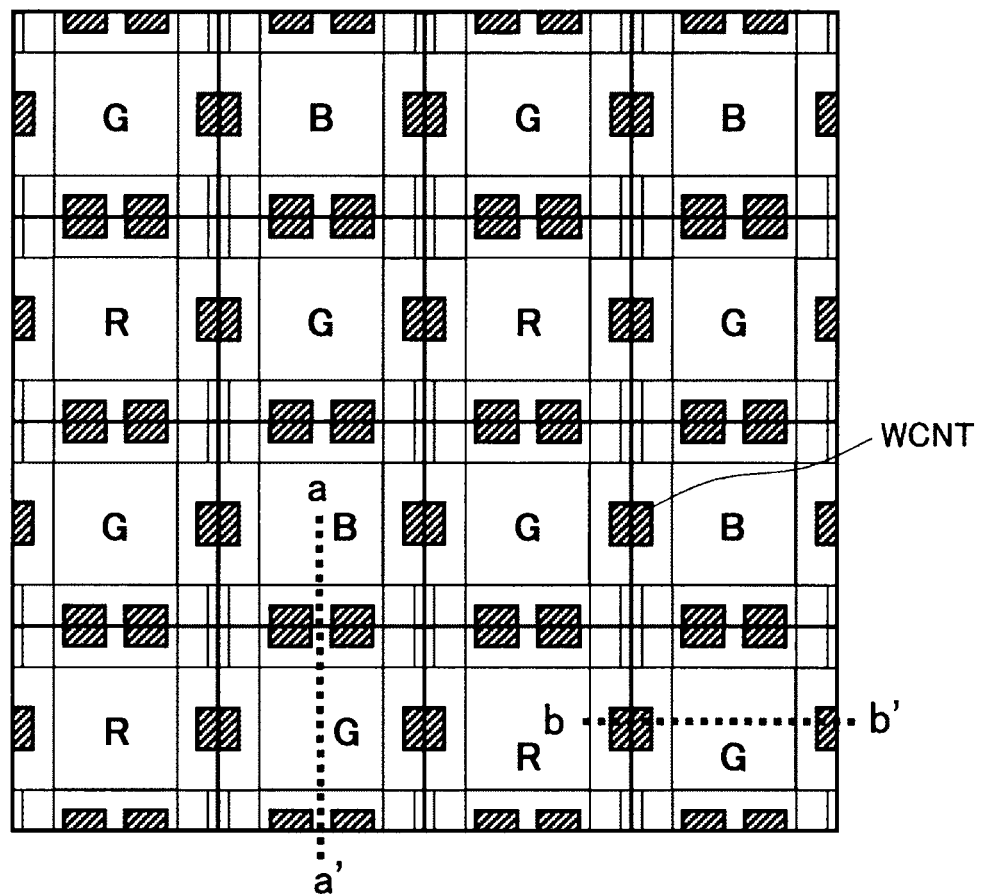
FIG. 14 is a diagram of another example of the layout of the pixel cells in the pixel section according to the embodiment.
Figure 15A:
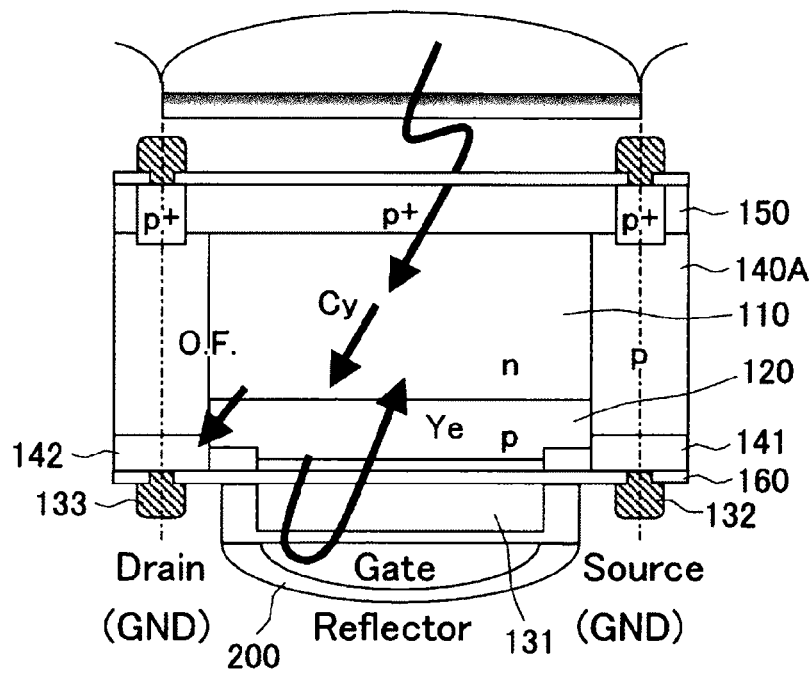
FIGS. 15A and 15B are simplified sectional views taken along an a-a' line and a b-b' line shown in FIG. 14.
Figure 15B:
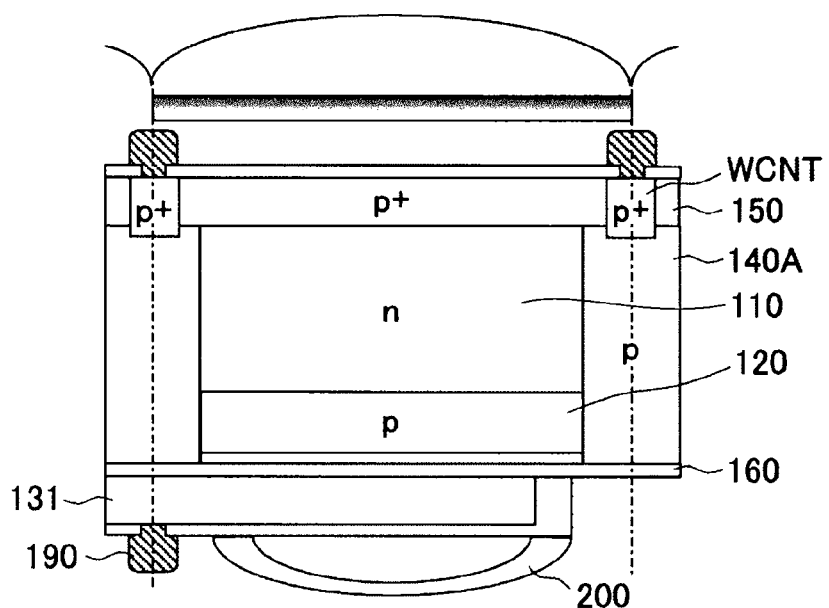

FIG. 14 is a diagram of another example of the layout of the pixel cells in the pixel section according to this embodiment. FIG. 15A is a simplified sectional view taken along an a-a' line shown in FIG. 14. FIG. 15B is a simplified sectional view taken along a b-b' line shown in FIG. 14.

The layout shown in FIG. 14 is the same as that of the example shown in FIG. 9. However, in this example, the well (substrate) contact WCNT is formed on the first substrate surface 101 (rear surface) side rather than the second substrate surface 102 side. The gate electrode 131 is formed over the entire pixel cell including the p-type element separation layer 140A on the second substrate surface 102 side.

In this case, a not-shown light shielding film for color mixture prevention can also be used as not-shown wiring.

By adopting such a configuration, wiring of the reflector 200 is symmetrically formed. This is advantageous in terms of withstanding pressure.

The reflector 200 is explained more in detail.

In the pixel cell Cel according to this embodiment that is the back-illuminated type and adopts the double-well structure, a space is formed on the gate electrode 131 of the transistor 130. Therefore, a reflector structure, which makes use of metal of wiring or the like, can be provided in the space.

Light transmitted through the silicon substrate 100 is reflected by the reflector 200 and photoelectrically converted in the first well 110 of the silicon substrate 100 again. This makes it possible to improve, for example, near infrared sensitivity.

In this case, as shown in FIG. 16A, the substrate is relatively thick (about 6 μm to 10 μm) and can be applied to, for example, a night vision monitor camera by making use of reflection of near infrared light by the reflector 200.

Moreover, as shown in FIG. 16B, if the thickness of the substrate 100 is positively reduced to reflect G light to R light, it is possible to further halve a pixel size because only about a half substrate thickness is necessary. This makes it possible to prevent color mixture.

Usually, a silicon substrate needs to have the thickness of 2 μm to 3 μm is necessary for visible light and has to receive light with an angle of incidence up to about 25 degrees. About 1:2 in an aspect ratio is a limit. Therefore, it is said that about 1 μm to 1.5 μm is a limit of the pixel size.

However, as in this embodiment, if the reflector 200 is used, the silicon substrate has to have only a half thickness 1 μm to 1.5 μm. Therefore, as the pixel size, a sub-micron pixel is possible.

In this case, it is desirable to use an ITO film having high visible light transmittance for an electrode.

In this embodiment, the reflector 200 is wiring of metal (Al, etc.). This configuration example is described later.

Although not specifically explained, a reflector may be formed of a nonconductive insulating film or the like.

A configuration in which downsizing can be realized by sharing a column circuit is explained below.

In this case, in the matrix array of the pixel cells in the pixel section 2, drain contacts are divided into two or more groups in a column to share a column circuit in the column direction (X direction) control circuit 4 and realize downsizing.

Figure 17A:
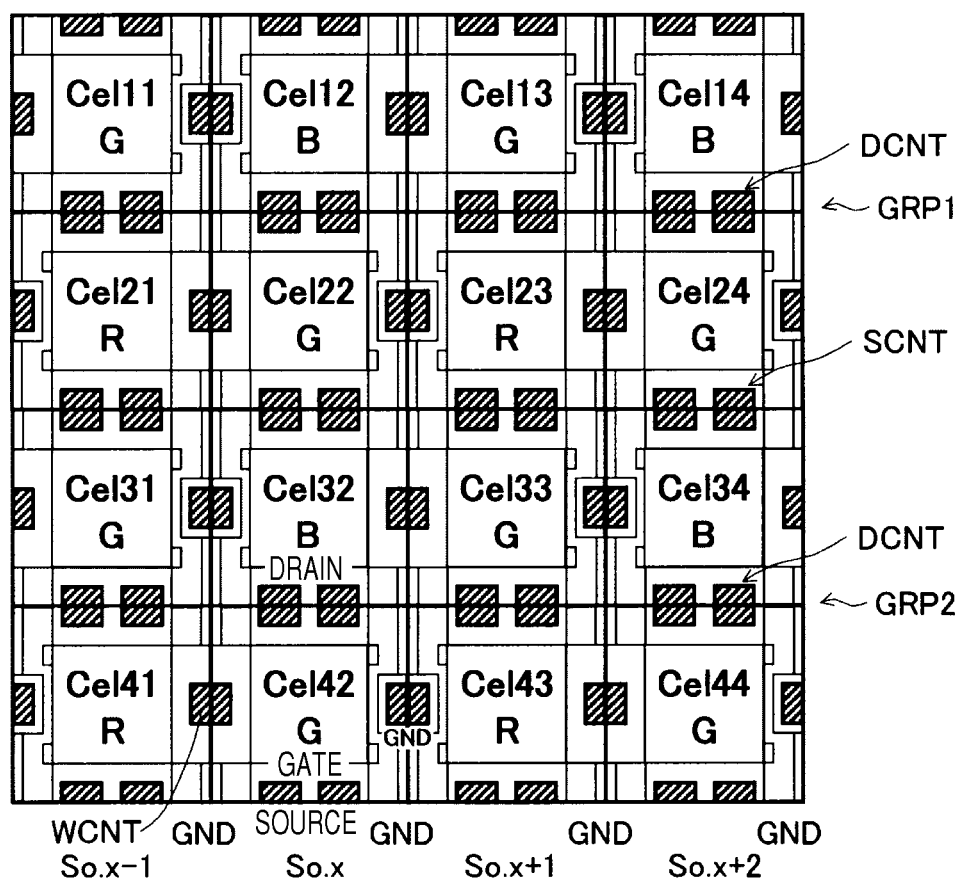
FIGS. 17A and 17B are diagrams of an example of a pixel cell array of a contact sharing pixel section.
Figure 17B:
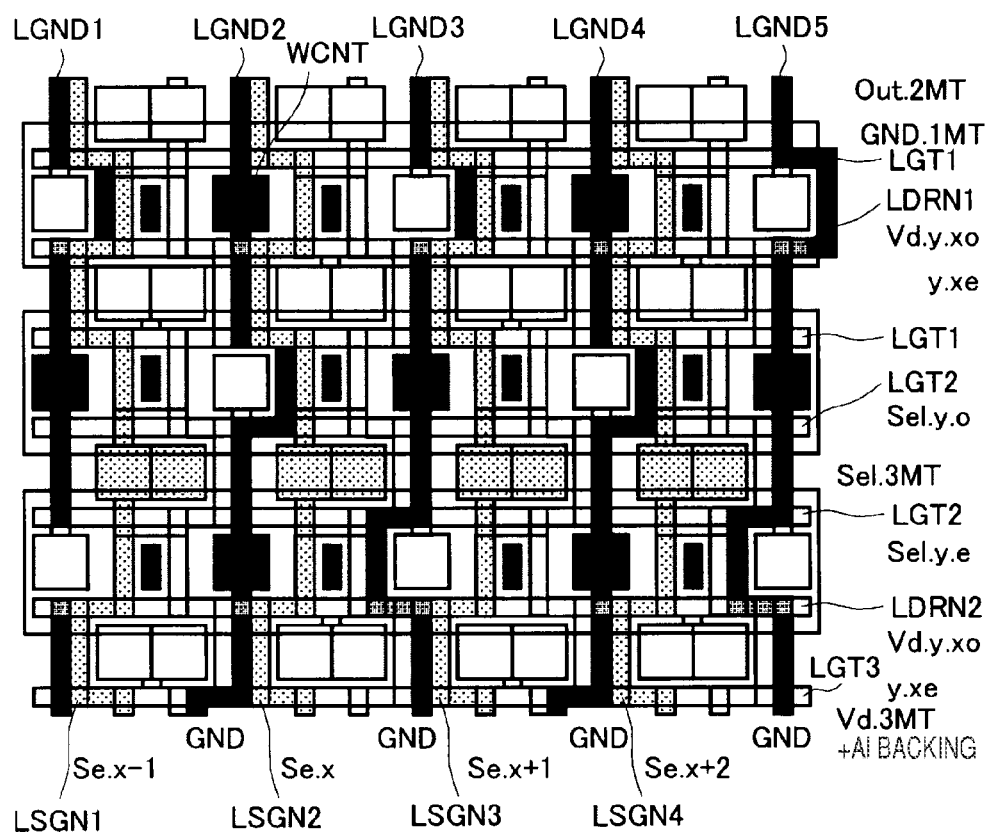

FIGS. 17A and 17B are diagrams of an example of a pixel cell array of a contact sharing pixel section. FIG. 17A is a diagram of an example of a layout of pixel cells. FIG. 17B is a diagram of a pattern layout corresponding to FIG. 17A.

Figure 18:
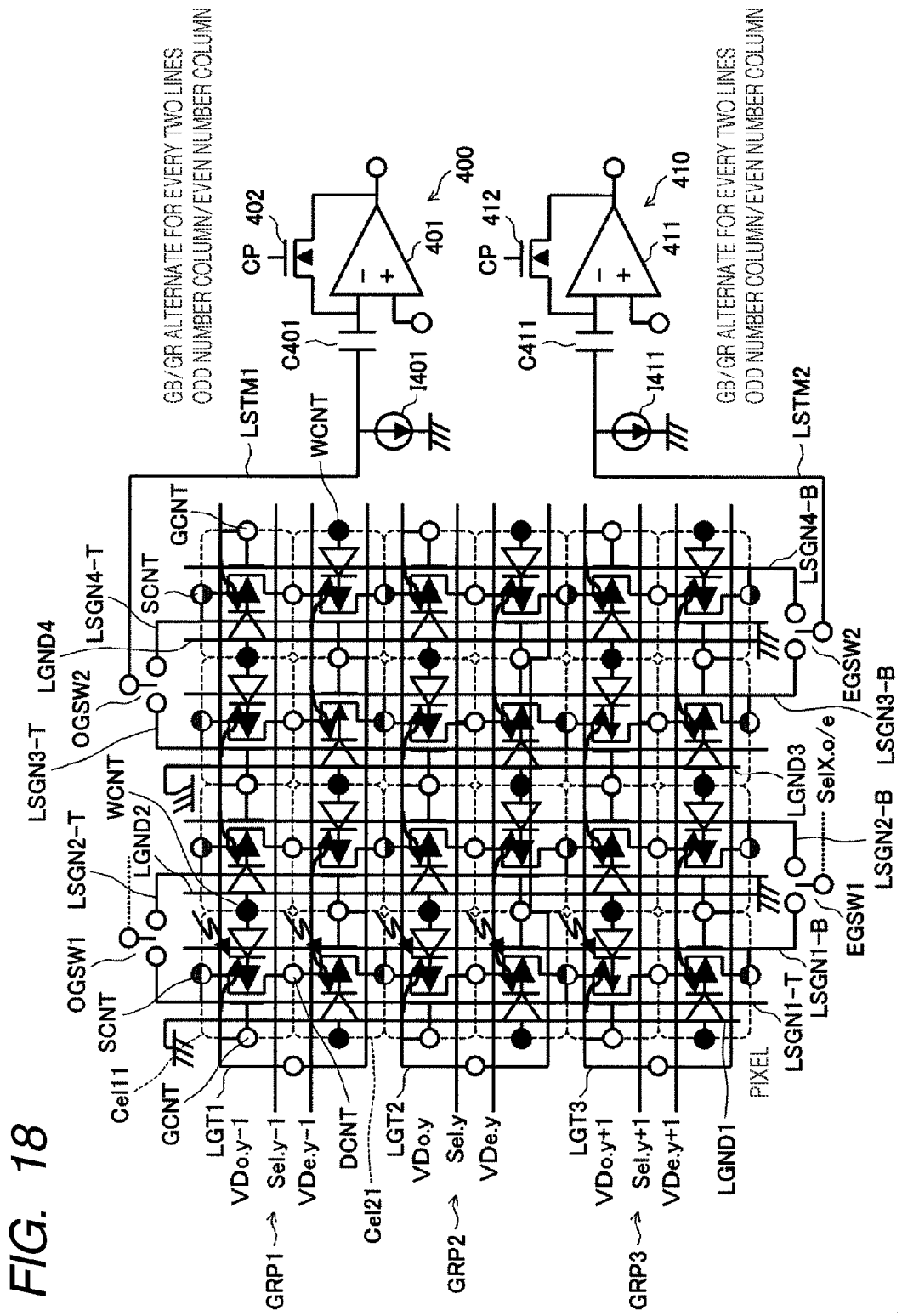
FIG. 18 is a diagram of an equivalent circuit in which a layout shown in FIG. 17A is adopted and a signal processing system and a pixel section that share a column circuit are simplified.

FIG. 18 is a diagram of an equivalent circuit in which the layout shown in FIG. 17A is adopted and signal processing system and pixel sections that share a column circuit are simplified.

In the following explanation, it is assumed that a signal Sel is supplied to a selected gate of a transistor.

In this example, two vertical lines share a drain.

In the example shown in FIG. 17A, selected and shown sixteen cells Cel are arranged in a matrix shape.

Basically, the Bayer array is adopted. A pixel cell Cel11 of G (green, Gr) is arranged in the first row, first column, a pixel cell Cel12 of B (blue) is arranged in the first row, second column, a pixel cell Cel21 of R (red) is arranged in the second row, first column, and a pixel cell Cel22 of G (Gb) is arranged in the second row, second column.

Similarly, a pixel cell Cel13 of G (Gr) is arranged in the first row, third column, a pixel cell Cel14 of B is arranged in the first row, fourth column, a pixel cell Cel23 of R is arranged in the second row, third column, and a pixel cell Cel24 of G (Gb) is arranged in the second row, second column.

A pixel cell Cel31 of G is arranged in the third row, first column, a pixel cell Cel32 of B is arranged in the third row, second column, a pixel cell Cel41 of R is arranged in the fourth row, first column, and a pixel cell Cel42 of G (Gb) is arranged in the fourth row, second column.

Similarly, a pixel cell Cel33 of G (Gr) is arranged in the third row, third column, a pixel cell Cel34 of B is arranged in the third row, fourth column, a pixel cell Cel43 of R is arranged in the fourth row, third column, and a pixel cell Cel44 of G (Gb) is arranged in the fourth row, fourth column.

In each of the columns of the pixel cell array, pixel cells in an odd number row and an even number row adjacent to each other share a drain contact.

In the example shown in FIG. 17A, the pixel cells Cel11 and Cel21 share the drain contact DCNT and the pixel cells Cel31 and Cel41 share the drain contact DCNT.

Similarly, the pixel cells Cel12 and Cel22 share the drain contact DCNT and the pixel cells Cel32 and Cel42 share the drain contact DCNT.

The pixel cells Cel13 and Cel23 share the drain contact DCNT and the pixel cells Cel33 and Cel43 share the drain contact DCNT.

The pixel cells Cel14 and Cel24 share the drain contact DCNT and the pixel cells Cel34 and Cel44 share the drain contact DCNT.

In the example shown in FIG. 17A, a group GRP1 is formed by the pixel cells Cel11 to Cel14 in the first row and the pixel cells Cel21 to Cel24 in the second row that share the drain contact DCNT.

Similarly, a group GRP2 is formed by the pixel cells Cel31 to Cel34 in the third row and the pixel cells Cel41 to Cel44 in the fourth row that share the drain contact DCNT.

In each of the columns between groups adjacent to each other, pixel cells adjacent to each other share the source contact SCNT.

In the example shown in FIG. 17A, the pixel cell Cel21 of the group GRP1 and the pixel cell CEL31 of the group GRP2 share the source contact SCNT.

The pixel cell Cel22 of the group GRP1 and the pixel cell Cel32 of the group GRP2 share the source contact SCNT.

The pixel cell Cel23 of the group GRP1 and the pixel cell Cel33 of the group GRP2 share the source contact SCNT.

The pixel cell Cel24 of the group GRP1 and the pixel cell Cel34 of the group GRP2 share the source contact SCNT.

In FIG. 17B, reference signs LGND1 to LGND5 and the like denote ground lines connected to the well contact WCNT, LSGN1 to LSGN4 and the like denote signal lines connected to the source contact SCNT, LGT1 to LGT3 and the like denote gate lines connected to the gate contact, and LDRN1 to LDRN4 and the like denote drain lines connected to the drain contact.

The ground line LGND and the signal line LSGN are wired for each of the columns in the Y direction (the row direction).

The gate line LGT and the drain line LDRN are wired for each of the rows in the X direction (the column direction).

The ground line LGND, the signal line LSGN, the gate line LGT, and the drain line LDRN are formed by a laminated structure of the wiring.

For example, the ground line LGND is formed by first metal wiring (1MT) in a bottom layer.

The signal line LSGN is formed by second metal wiring (2MT) in a layer second from the bottom.

The gate line LGT and the drain line LDRN are formed by third metal wiring (3MT) of a top layer via an insulating film provided between the lines while maintaining insulating properties.

In this embodiment, the drain line LDRN formed by the third metal wiring is backed by, for example, Al wiring Lal to reduce resistance as measures against IR drop.

In this embodiment, as shown in FIGS. 17A and 17B and FIG. 18, in each of the groups GRP1 to GRP3, in pixel cells that share the drain contact, the gate contact GCNT and the well (substrate) contact WCNT are formed to face opposite directions in the X direction (the column direction).

In an odd number column and an even number column, the gate contact GCNT and the well (substrate) contact WCNT are formed to face opposite directions as well.

Specifically, in the group GRP1, the gate contact GCNT of the pixel cell Cel11 in the first column is formed on the left side in the figure in the X direction and the well contact WCNT is formed on the right side in the figure in the X direction.

On the pixel cell Cel21 in the first column, the gate contact GCNT is formed on the right side in the figure in the X direction and the well contact WCNT is formed on the left side in the figure in the X direction.

The gate of the transistor 130 of the pixel cell Cel11 is connected to the gate line LGT1 via the gate contact GCNT. The well contact WCNT is connected to the ground line LGND2 wired in the second column.

The gate of the transistor 130 of the pixel cell Cel21 is connected to the gate line LGT1 via the gate contact GCNT. The well contact WCNT is connected to the ground line LGND1 wired in the first column.

On the pixel cell Cel12 in the second column, the gate contact GCNT is formed on the right side in the figure in the X direction. The well contact WCNT is formed on the left side in the figure in the X direction.

The gate contact GCNT of the pixel cell Cel22 in the second column is formed on the left side in the figure in the X direction. The well contact WCNT is formed on the right side in the figure in the X direction.

The gate of the transistor 130 of the pixel cell Cel12 is connected to the gate line LGT1 via the gate contact GCNT. The well contact WCNT is connected to the ground line LGND2 wired in the second column.

The gate of the transistor 130 of the pixel cell Cel22 is connected to the gate line LGT1 via the gate contact GCNT. The well contact WCNT is connected to the ground line LGND3 wired in the third column.

The gate contact GCNT of the pixel cell Cel13 in the third column is formed on the left side in the figure in the X direction and the well contact WCNT is formed on the right side in the figure in the X direction.

The gate contact GCNT of the pixel cell Cel23 in the first column is formed on the right side in the figure in the X direction and the well contact WCNT is formed on the left side in the figure in the X direction.

The gate of the transistor 130 of the pixel cell Cel13 is connected to the gate line LGT1 via the gate contact GCNT. The well contact WCNT is connected to the ground line LGND4 wired in the fourth column.

The gate of the transistor 130 of the pixel cell Cel23 is connected to the gate line LGT1 via the gate contact GCNT. The well contact WCNT is connected to the ground line LGND3 wired in the third column.

The gate contact GCNT of the pixel cell Cel14 in the fourth column is formed on the right side in the figure in the X direction and the well contact WCNT is formed on the left side in the figure in the X direction.

The gate contact GCNT of the pixel cell Cel24 in the second column is formed on the left side in the figure in the X direction and the well contact WCNT is formed on the right side in the figure in the X direction.

The gate of the transistor 130 of the pixel cell Cel14 is connected to the gate line LGT1 via the gate contact GCNT. The well contact WCNT is connected to the ground line LGND4 wired in the fourth column.

The gate of the transistor 130 of the pixel cell Cel24 is connected to the gate line LGT1 via the gate contact GCNT. The well contact WCNT is connected to the ground line LGND5 (not shown) wired in the fifth column.

The groups GRP2 and GRP3 are basically formed in the same pattern. Therefore, detailed explanation of the groups GRP2 and GRP3 is omitted.

As shown in FIG. 18, for top readout and bottom readout, the signal lines LSGN1 to LSGN4 and the like are respectively divided into two signal lines LSGN1-T and LSGN1-B, LSGN2-T and LSGN2-B, LSGN3-T and LSGN3-B, and LSGN4-T and LSGN4-B and the like.

An odd number group select switch (a top switch) OGSW1 and an even number group select switch (a bottom switch) EGSW1 are provided and a top switch OGSW2 and a bottom switch EGSW2 are provided in a unit of two columns.

The signal lines LSGN1-T and LSGN2-T are connected to two switching terminals of the top switch OGSW1. The signal lines LSGN1-B and LSGN2-B are connected to two switching terminals of the bottom switch EGSW1. The signal lines LSGN1-T and LSGN2-T are connected to the source contact SCNT of the odd number groups GRP1, GRP3 and the like. The signal lines LSGN1-B and LSGN2-B are connected to the source contact SCNT of the even number groups GRP2, GRP4 and the like.

Similarly, the signal lines LSGN3-T and LSGN4-T are connected to two switching terminals of the top switch OGSW2. The signal lines LSGN3-B and LSGN3-B are connected to two switching terminals of the bottom switch EGSW2. The signal lines LSGN3-T and LSGN4-T are connected to the source contact SCNT of the odd number groups GRP1, GRP3 and the like. The signal lines LSGN3-B and LSGN4-B are connected to the source contact SCNT of the even number groups GRP2, GRP4 and the like.

Fixed terminals of the top switches OGSW1, OGSW2 and the like are connected to a first signal transfer line LSTM1. Fixed terminals of the bottom switches EGSW1 and EGSW2 are connected to a second signal transfer line LSTM2.

A current source I401 is connected to the first signal transfer line LSTM1. A connection point of the current source I401 and the first signal transfer line LSTM1 is connected to a comparator 401 of a column circuit 400 via a capacitor C401.

An inverting input (−) of the comparator 401 is connected to the capacitor C401. Reference potential is given to a non-inverting input (+) thereof.

A reset switch 402 is connected between the inverting input (−) and an output of the comparator 401. The switch 402 is formed by, for example, a MOS transistor.

A current source I411 is connected to the second signal transfer line LSTM2. A connection point of the current source I411 and the second signal transfer line LSTM2 is connected to a comparator 411 of a column circuit 410 via a capacitor 411.

An inverting input (−) of the comparator 411 is connected to the capacitor C411. Reference potential is given to a non-inverting input (+) thereof.

A reset switch 412 is connected between the inverting input (−) and an output of the comparator 411. The switch 412 is formed by, for example, a MOS transistor.

In such a configuration, it is possible to perform reset separately for an odd number and an even number and sample signals in order of a D phase Do of the odd number, a P phase Po of the odd number, a D phase De of the even number, and a P phase Pe of the even number. It is possible to perform arbitrary adding processing of signals from same color pixels with digital addition both vertically and horizontally (counter addition vertically).

Figure 19B:
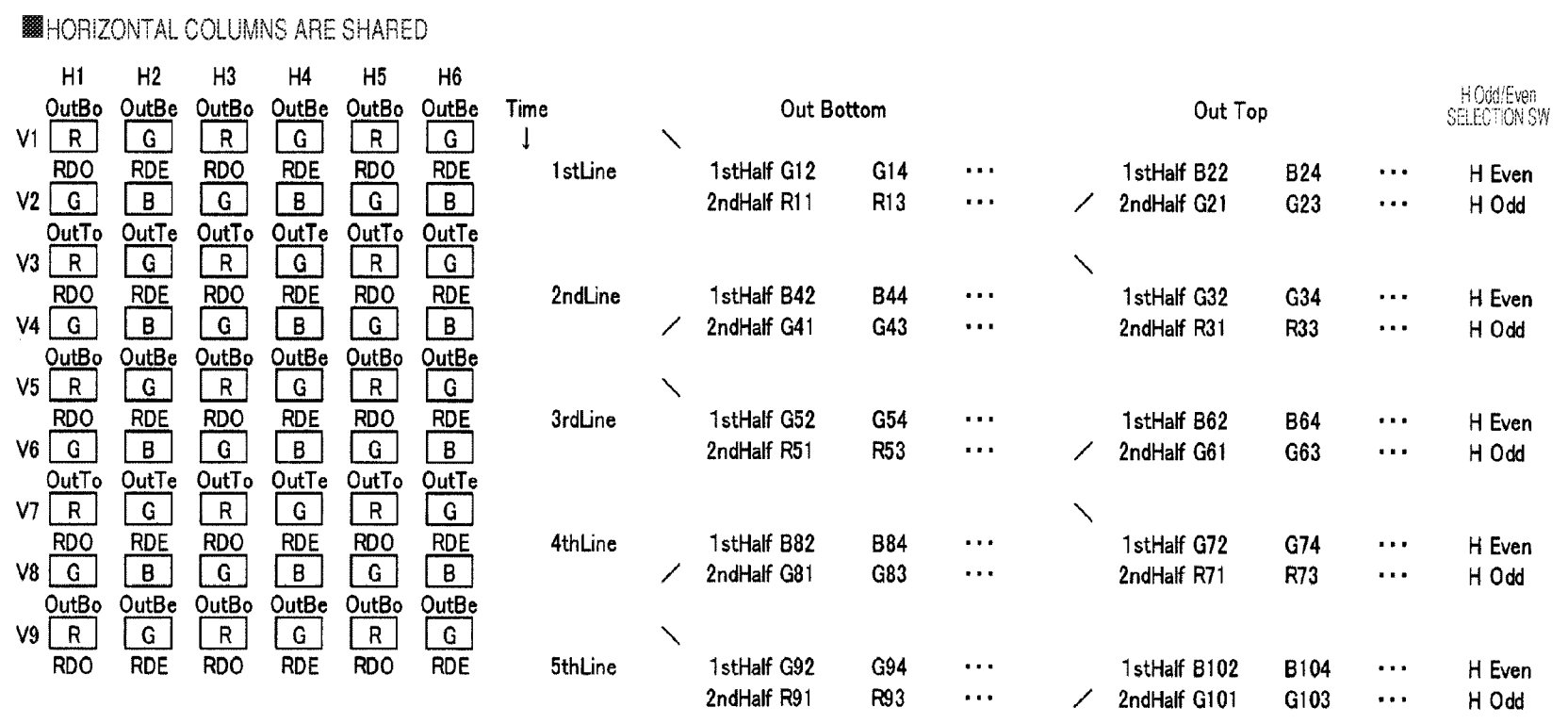

FIGS. 19A and 19B are diagrams of signal output orders in the square array shown in FIGS. 17A and 17B. FIG. 19A is a diagram of a signal output order for outputting signals when horizontal columns are not shared. FIG. 19B is a diagram of a signal output order for outputting signals when horizontal columns are shared.

In FIGS. 19A and 19B, to arrange pixel cells in the signal output orders, an arrangement of the pixel cells is vertically reversed from that shown in the layout diagram.

In this example, rows and columns are represented as V rows and H columns and numbers are affixed to the respective rows and columns. Numbers corresponding to RGB of pixel cells and a matrix array are given to output signals. For example, a signal in the first row, first column is represented as R11 and a signal in the first row, second column is represented as G12.

In the case of an example shown in FIG. 19A, signals are outputted in order according to a pixel cell array both on a bottom side and a top side.

In the case of an example shown in FIG. 19B, signals are outputted in a time division manner.

For example, first, signals of pixel cells G12, G14, and the like are read out on the bottom side and signals of pixel cells B22 and B24 are readout on the top side and, second, signals of pixel cells R11, R13, and the like are read out on the bottom side and signals of pixel cells G21 and G23 are read out on the top side.

In this way, it is possible to perform signal readout for each of same colors and perform arbitrary adding processing of signals from same color pixels.

As explained above, in the example shown in FIGS. 17A and 17B and FIG. 18, Gb and Gr are alternately read out for every two lines and read out dividedly in an odd number column and an even number column.

In this example, since a drain is shared by two lines, parallel processing according to an upper and lower column array (double speed) is necessary. Moreover, since signals of Gr/Gb lines are outputted from above and below alternately for every two lines, digital addition or 2/4 thinning-out is performed vertically.

It is possible to share two or more horizontal columns according to separation of a horizontal reset drain (e.g., into an odd number column and an even number column) (1/n deceleration).

Further, it is possible to perform column shrinking.

Moreover, it is possible to perform, in color coding synchronization, arbitrary adding processing of signals from same color pixels by digital addition in an identical column signal.

Furthermore, since the horizontal wiring of the drain line LDRN is backed by Al for a reduction in resistance, it is possible to prevent a fall in signal voltage transmitted to the drain line.

Figure 20A:
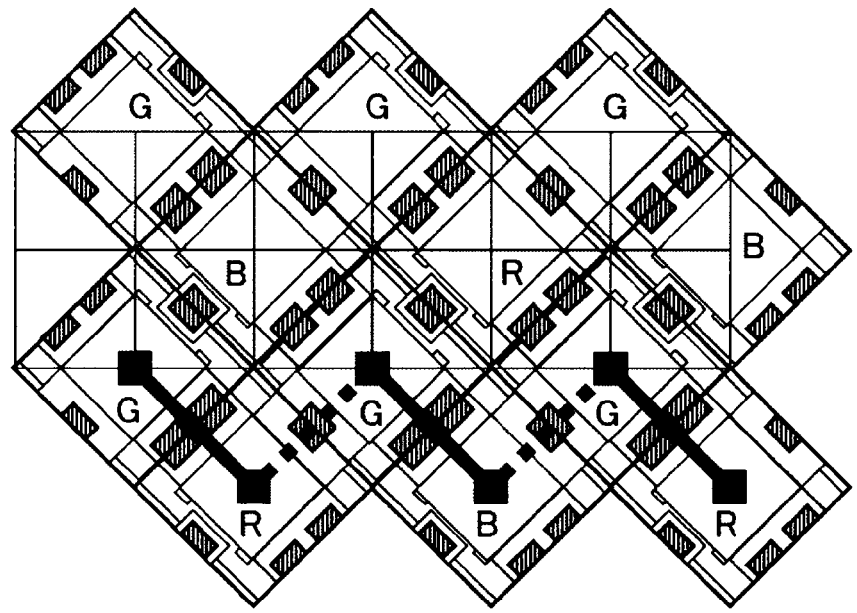
FIGS. 20A and 20B are diagrams of a zigzag array formed by rotating the square array shown in FIGS. 17A and 17B by 45 degrees.
Figure 20B:
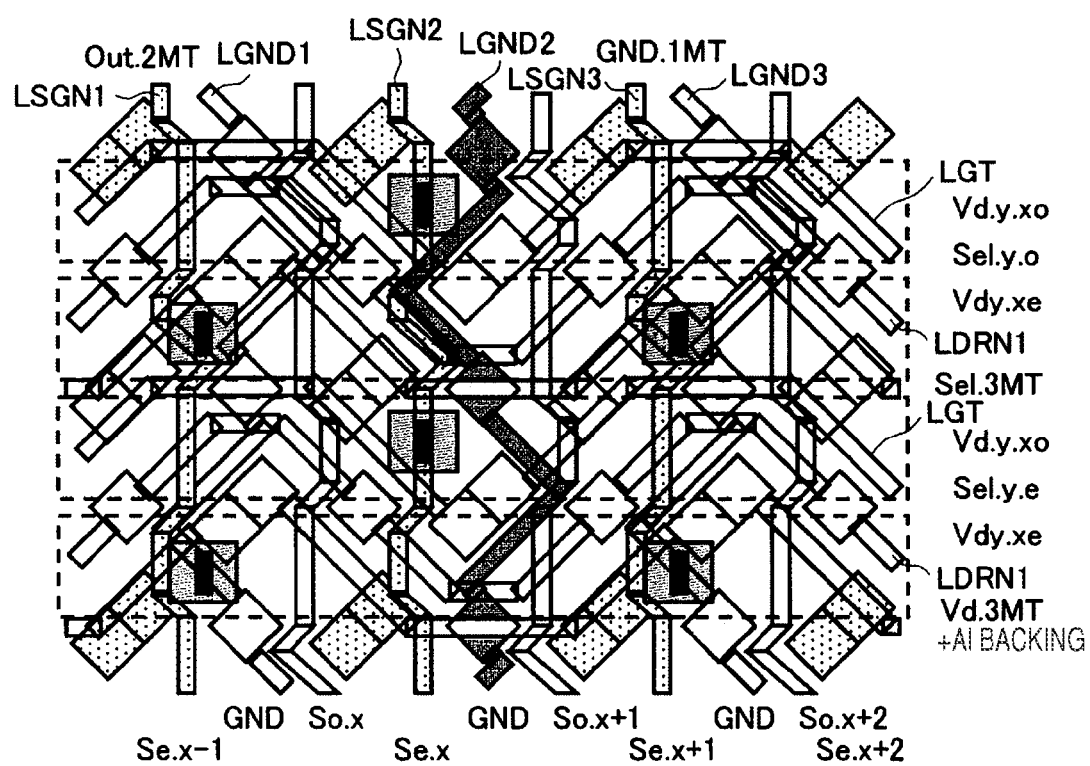

FIGS. 20A and 20B are diagrams of a zigzag array formed by rotating the square array shown in FIGS. 17A and 17B by 45 degrees. FIG. 20A is a diagram of an example of a layout of pixel cells. FIG. 20B is a diagram of a pattern layout corresponding to FIG. 20A.

Figure 21:
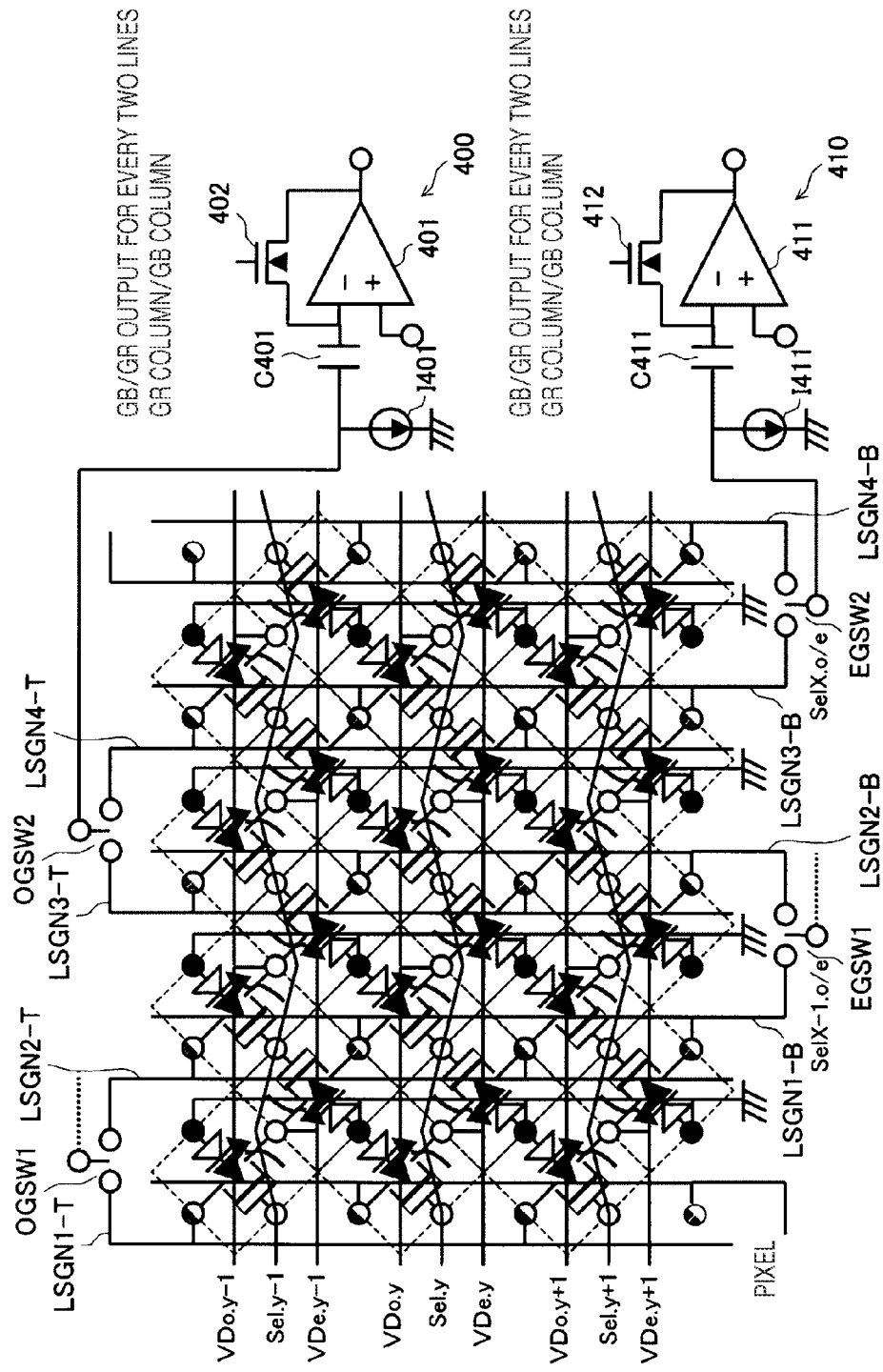
FIG. 21 is a diagram of an equivalent circuit in which a layout shown in FIG. 20A is adopted and a signal processing system and a pixel section that share a column circuit are simplified.

FIG. 21 is a diagram of an equivalent circuit in which the layout shown in FIG. 20A is adopted and a signal processing system and a pixel section that share a column circuit are simplified.

The zigzag array can be realized by simply rotating an electrode and the structure below the electrode by 45 degrees and contriving wiring for the zigzag array.

In this case, a basic operation is the same as that in the case of the square array shown in FIGS. 17A and 17B and FIG. 18. It is possible to perform reset separately for an odd number and an even number and sample signals in order of a D phase Do of the odd number, a P phase Po of the odd number, a D phase De of the even number, and a P phase Pe of the even number. It is possible to perform arbitrary adding processing of signals from same color pixels with digital addition both vertically and horizontally (counter addition vertically).

Figure 22A:
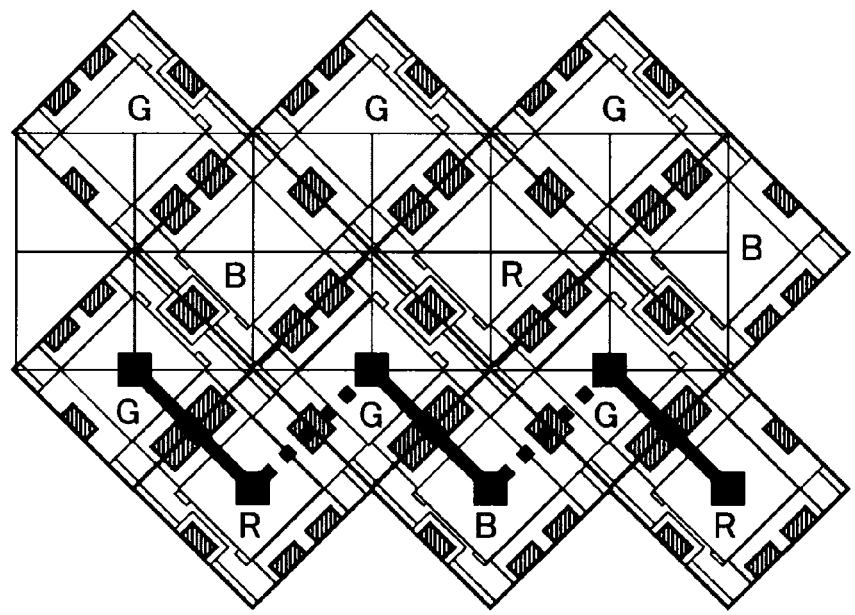
FIGS. 22A and 22B are diagrams of another zigzag array formed by rotating the square array shown in FIGS. 17A and 17B by 45 degrees.
Figure 22B:
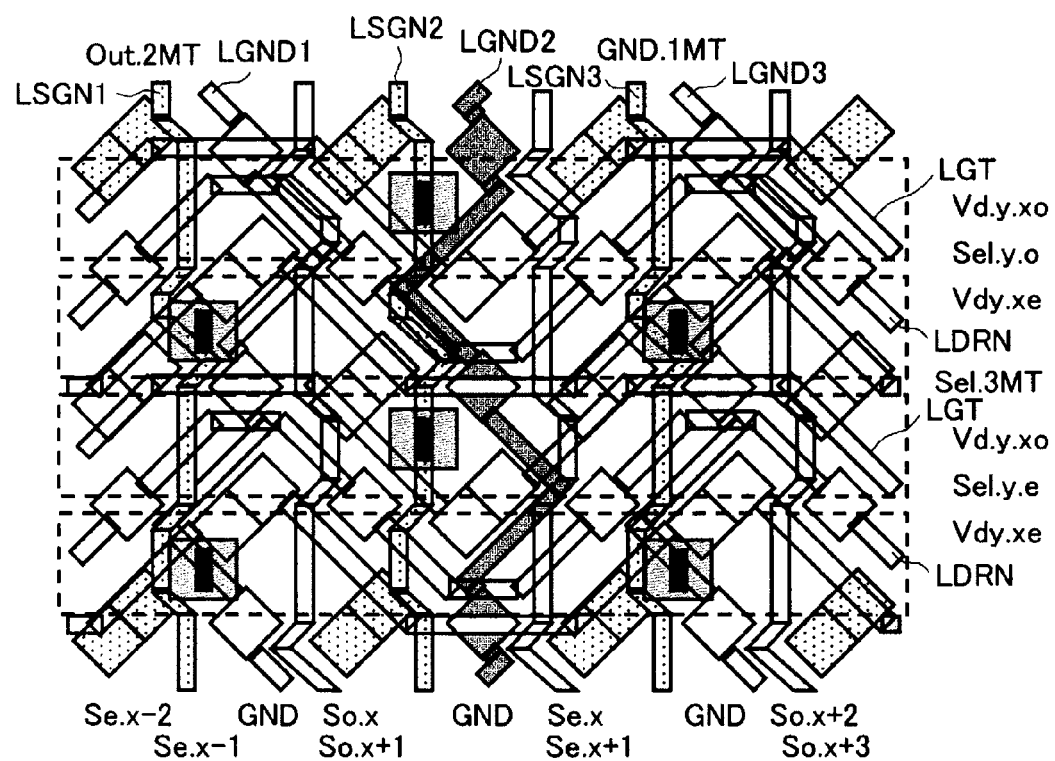

FIGS. 22A and 22B are diagrams of another zigzag array formed by rotating the square array shown in FIGS. 17A and 17B. FIG. 22A is a diagram of an example of a layout of pixel cells. FIG. 22B is a diagram of a pattern layout corresponding to FIG. 22A.

Figure 23:
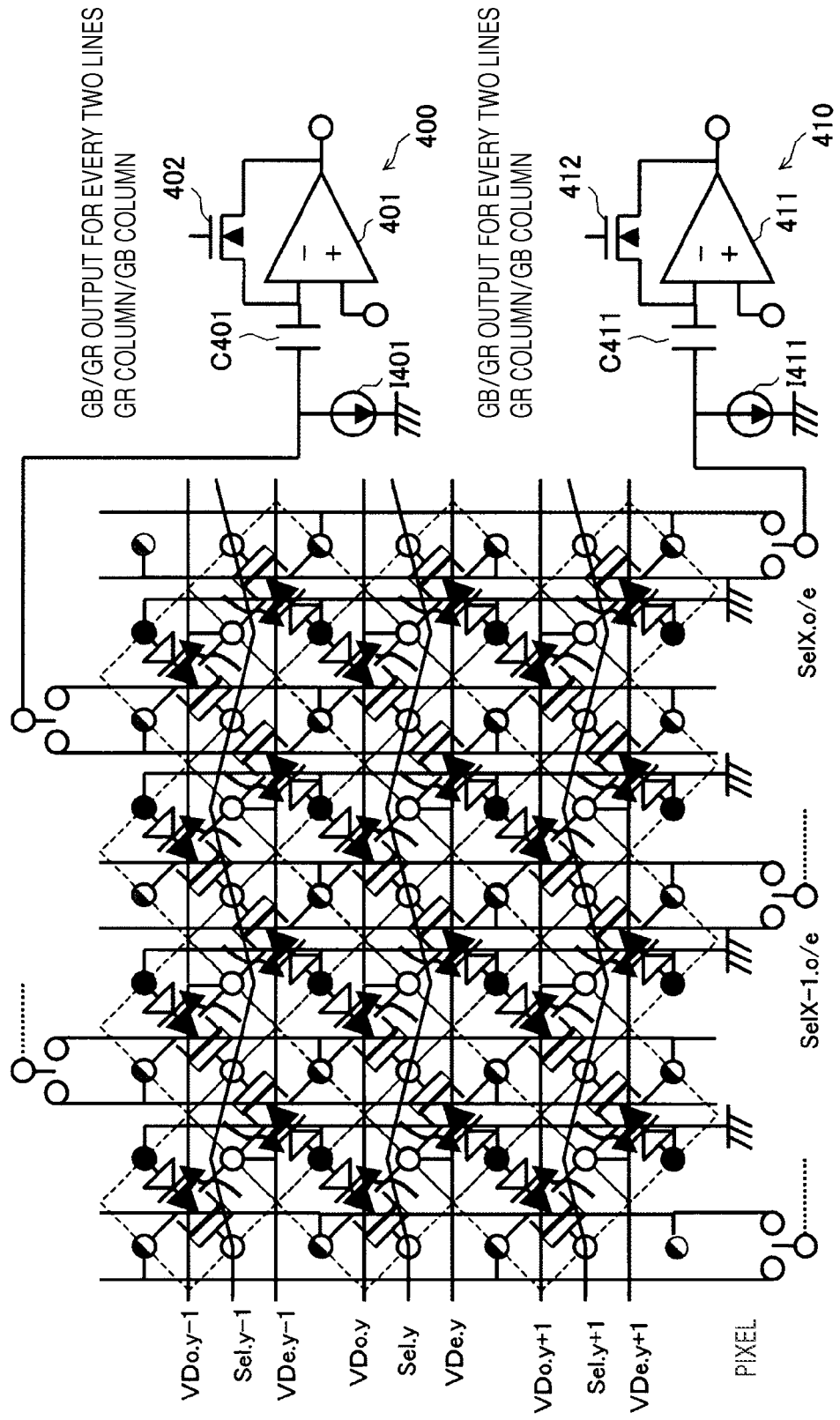
FIG. 23 is a diagram of an equivalent circuit in which a layout shown in FIG. 22A is adopted and a signal processing system and a pixel section that share a column circuit are simplified.

FIG. 23 is a diagram of an equivalent circuit in which the layout shown in FIG. 22A is adopted and a signal processing system and a pixel section that share a column circuit are simplified.

In an example shown in FIGS. 20A and 20B and FIG. 21, a form of signal readout is the same as that in the case of FIGS. 17A and 17B and FIG. 18. However, in an example shown in FIGS. 22A and 22B and FIG. 23, a column at the bottom and a column at the top are alternately arranged.

In this case, a basic operation is the same as that in the case of the square array shown in FIGS. 17A and 17B and FIG. 18. It is possible to perform reset separately for an odd number and an even number and sample signals in order of a D phase Do of the odd number, a P phase Po of the odd number, a D phase De of the even number, and a P phase Pe of the even number. It is possible to perform arbitrary adding processing of signals from same color pixels with digital addition both vertically and horizontally (counter addition vertically).

Figure 24A:
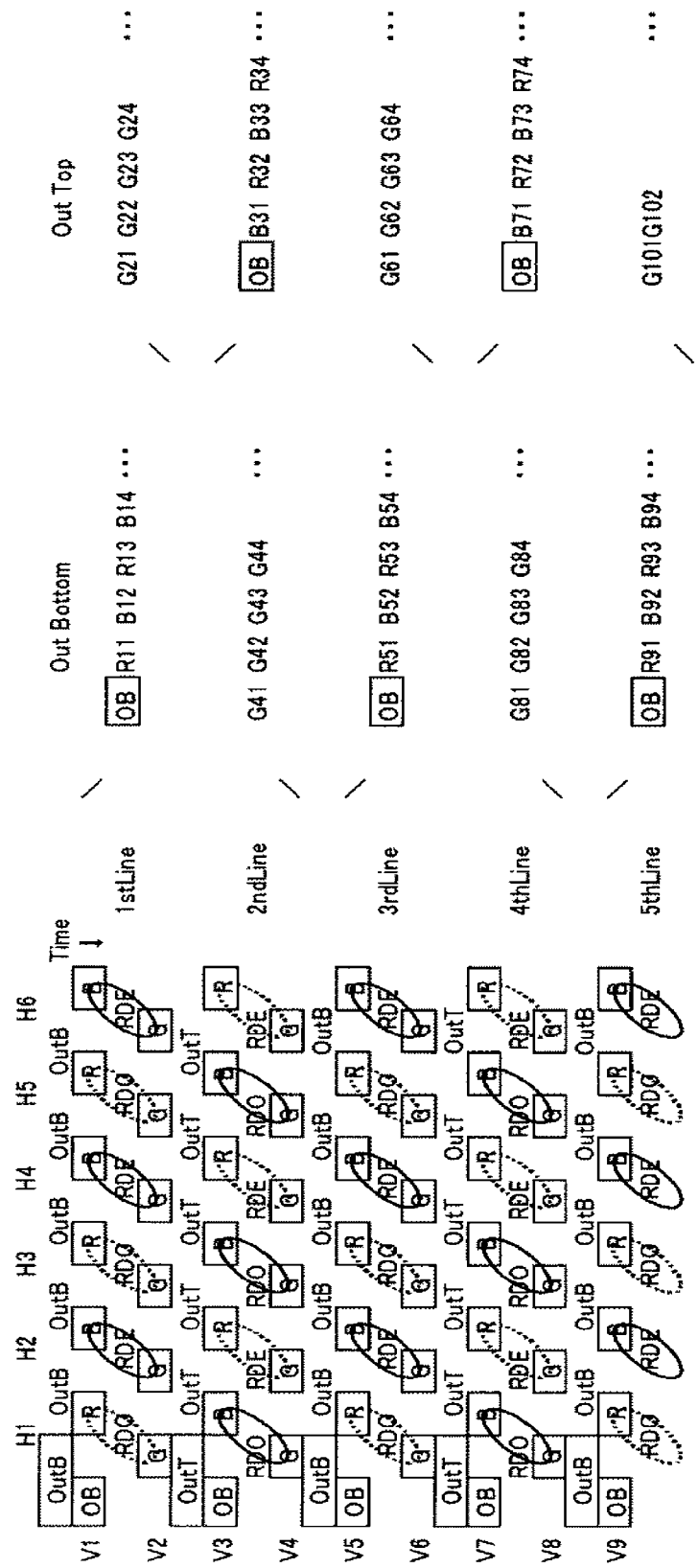

FIGS. 24A and 24B are diagrams of signal output orders in the zigzag array shown in FIGS. 20A and 20B. FIG. 24A is a diagram of a signal output order for outputting signals when horizontal columns are not shared. FIG. 24B is a diagram of a signal output order for outputting signals when horizontal columns are shared.

In this example, rows and columns are represented as V rows and H columns and numbers are affixed to the respective rows and columns. Numbers corresponding to RGB of pixel cells and a matrix array are given to output signals.

In the case of an example shown in FIG. 24A, signals are outputted in order according to a pixel cell array both on a bottom side and a top side.

In the case of an example shown in FIG. 24B, signals are outputted in a time division manner.

For example, first, signals of pixel cells R11, R13, and the like are read out on the bottom side and signals of pixel cells G22 and G24 are readout on the top side and, second, signals of pixel cells B12, B14, and the like are read out on the bottom side and signals of pixel cells G23 and G25 are read out on the top side.

In this way, it is possible to perform signal readout for each of same colors and perform arbitrary adding processing of signals from same color pixels.

Figure 25B:
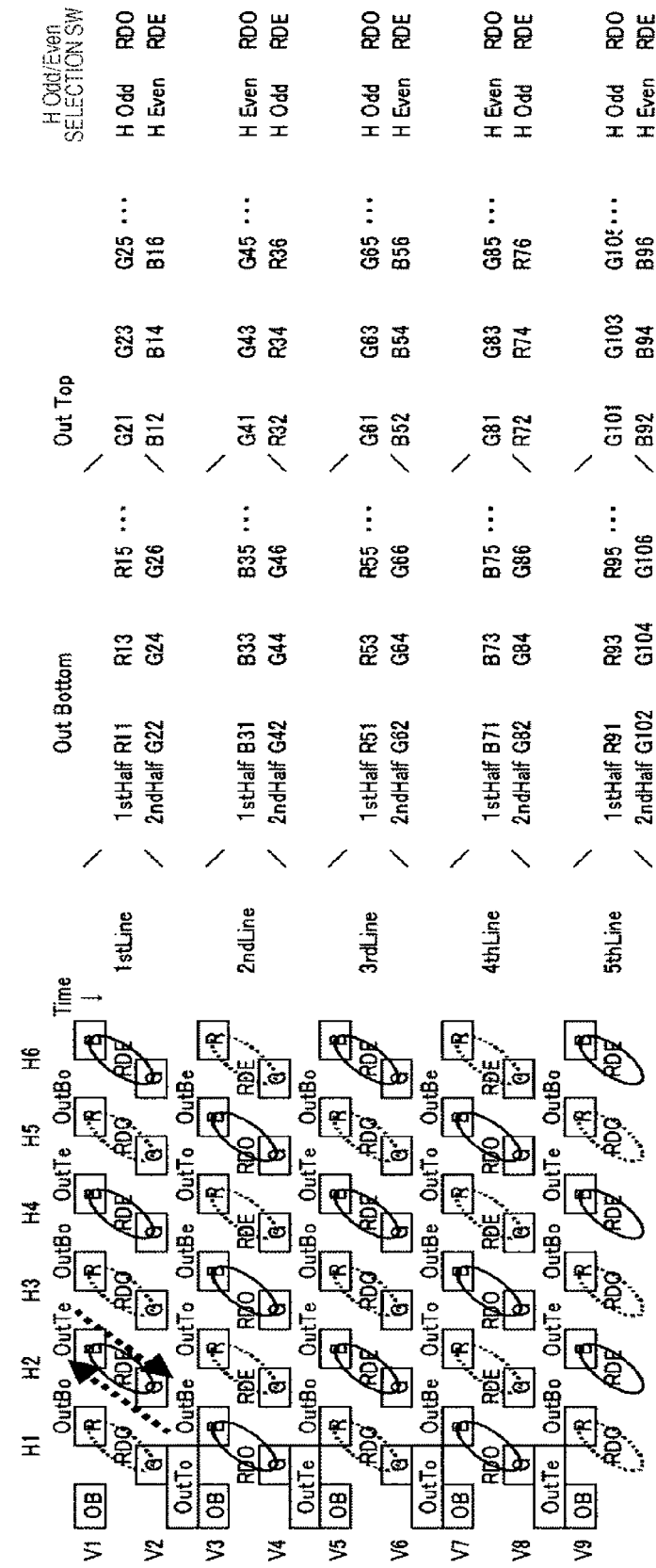

FIGS. 25A and 25B are diagrams of signal output orders in the zigzag array shown in FIGS. 22A and 22B. FIG. 25A is a diagram of a signal output order for outputting signals when horizontal columns are not shared. FIG. 25B is a diagram of a signal output order for outputting signals when horizontal columns are shared.

In this example, rows and columns are represented as V rows and H columns and numbers are affixed to the respective rows and columns. Numbers corresponding to RGB of pixel cells and a matrix array are given to output signals.

In the case of an example shown in FIG. 25A, signals are outputted in order according to a pixel cell array both on a bottom side and a top side.

In the case of an example shown in FIG. 25B, signals are outputted in a time division manner.

For example, first, signals of pixel cells R11, R13, R15, and the like are read out on the bottom side and signals of pixel cells G21, G23, and G25 are readout on the top side and, second, signals of pixel cells G22, G24, G26, and the like are read out on the bottom side and signals of pixel cells B12, B14, and B16 are read out on the top side.

In this way, it is possible to perform signal readout for each of same colors and perform arbitrary adding processing of signals from same color pixels.

The specific examples of the pixel cell array are explained above.

An example of formation of a reflector at the time when the square array shown in FIGS. 17A and 17B is adopted is explained below.

In the pixel cell array according to this embodiment, the drain contact DCNT, the source contact SCNT, the gate contact GCNT, and the well (substrate) contact WCNT can be arranged in the four direction of the gate. Therefore, as shown in FIG. 26A, an entire light sensing region is a gate region.

Therefore, as shown in FIG. 26B, the reflector 200 can be basically formed to be superimposed on the entire gate region.

On the other hand, when the square array shown in FIGS. 17A and 17B is adopted, the reflector can be formed by using any wiring of a laminated structure.

First to third examples are explained below.

Figure 27:
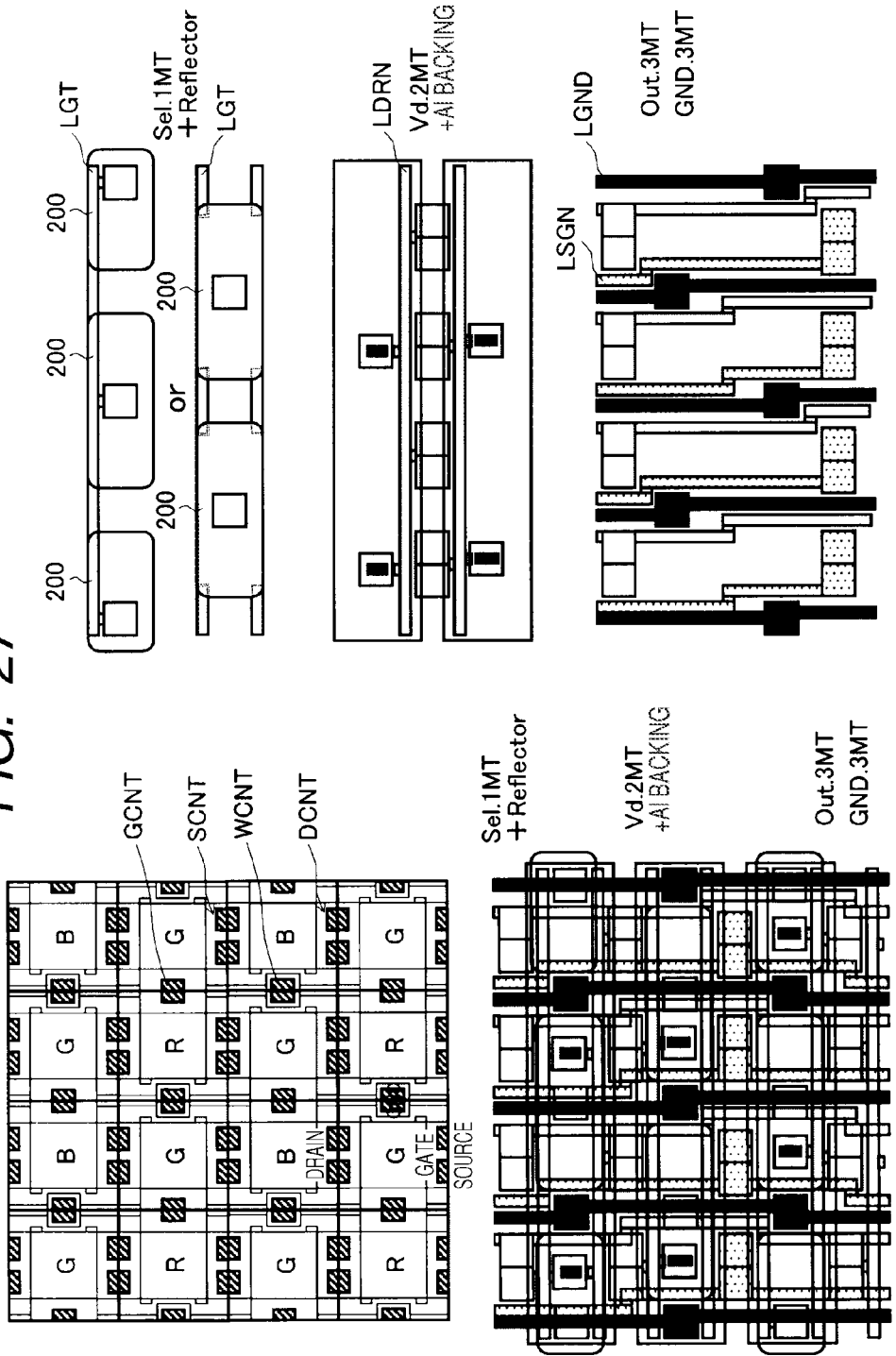
FIG. 27 is a diagram of a first example of the reflector and a wiring sharing layout.

FIG. 27 is a diagram of a first example of the reflector and a wiring sharing layout.

FIG. 28 is a diagram of a second example of the reflector and the wiring sharing layout.

FIG. 29 is a diagram of a third example of the reflector and the wiring sharing layout.

In the first example shown in FIG. 27, unlike the example shown in FIGS. 17A and 17B, the gate line LGT is first metal wiring, the drain line LDRN is second metal wiring, and the signal line LSGN and the ground line LGND are third metal wiring.

In this case, the first metal wiring of the gate line LGT is used as the reflector 200. The reflector 200 is selectively formed in association with the gate region.

In the second example shown in FIG. 28, as in the example shown in FIGS. 17A and 17B, the ground line LGND is first metal wiring, the signal line LSGN is second metal wiring, and the gate line LGT and the drain line LDRN are third metal wiring.

In this case, the first metal wiring of the ground line LGND is used as the reflector 200.

In the third example shown in FIG. 29, as in the example shown in FIG. 27, the gate line LGT is first metal wiring, the drain line LDRN is second metal wiring, and the signal line LSGN and the ground line LGND are third metal wiring.

In this case, the first metal wiring of the gate line LGT is used as the reflector 200. The reflector 200 is formed in a stripe shape.

The examples of the pixel cell structure, the array, and the formation of the reflector are explained above.

A characteristic configuration and functions of the signal processing system including the column circuit side are explained below.

First, in this embodiment, the solid-state imaging device 1 has a pre-line reset function for improving large light amount resistance using a reset level of a preceding line as a reference level of the comparator 401 (411) of the column circuit 400 (410).

Figure 30A:
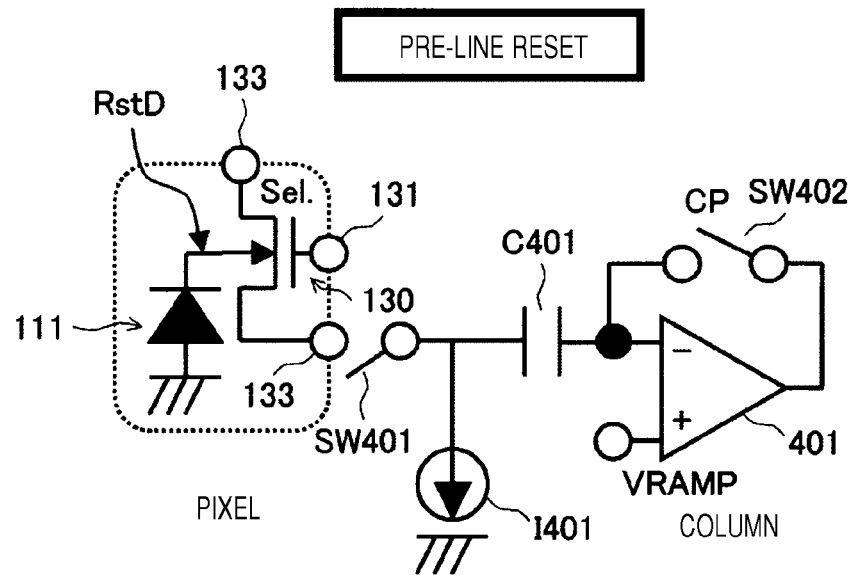
FIGS. 30A and 30B are diagrams for explaining a basic concept of pre-line reset.
Figure 30B:
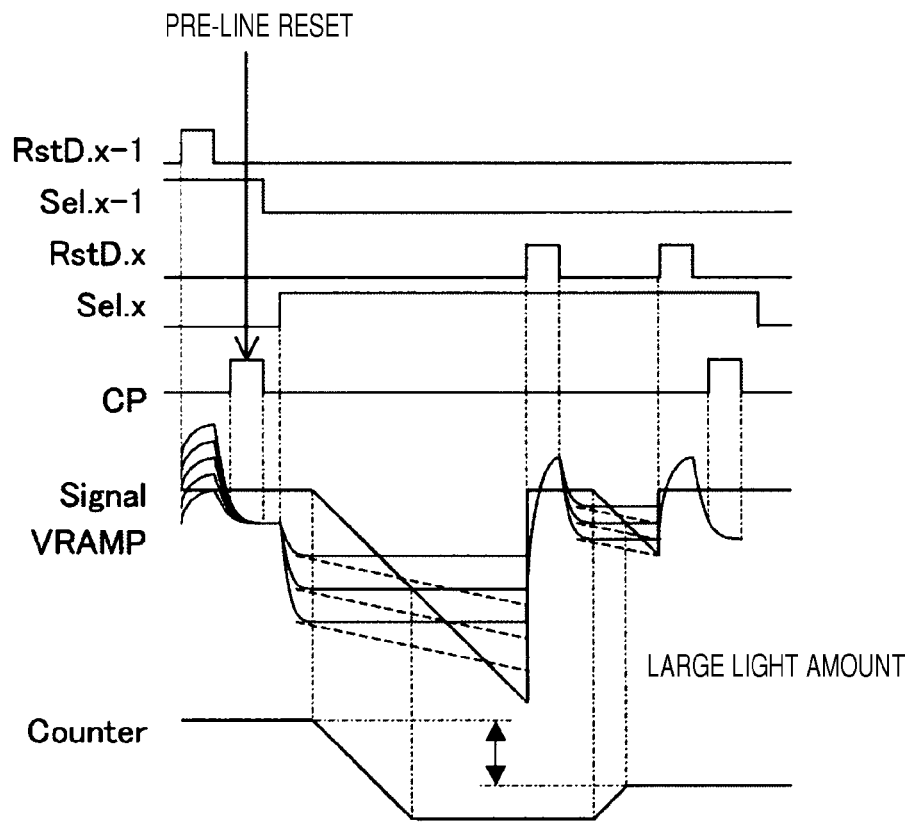

FIGS. 30A and 30B are diagrams for explaining a basic concept of pre-line reset. FIG. 30A is a diagram of an equivalent circuit. FIG. 30B is a timing chart.

In this case, before an operation for comparison with a ramp waveform VRAMP in the comparator 401 (411) (before D-phase readout), the switch (SW) 402 (412) of the column circuit 400 (410) is turned on and an input and an output of the comparator are connected to perform circuit reset.

Consequently, large light amount resistance is improved by using a reset level of a preceding line as a reference level of the comparator 401 (411) of the column circuit 400 (410).

This embodiment adopts a function of reducing a residual image by performing a reset operation after injecting charges from the drain to the pixels immediately before pixel reset to saturate the pixel cells (hard resetting the pixel cells).

Figure 31A:
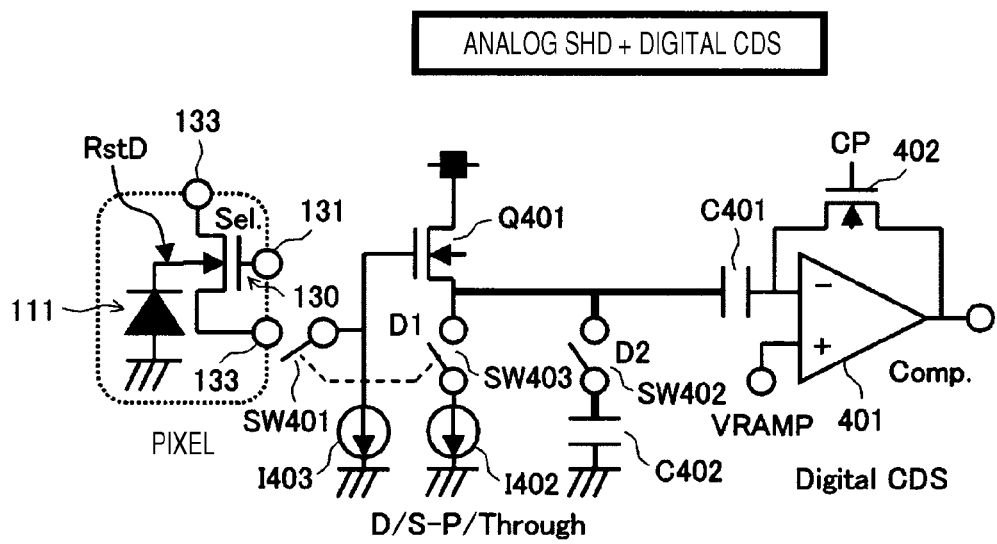
FIGS. 31A and 31B are conceptual diagrams of a signal processing system corresponding to a hard reset function according to the embodiment.
Figure 31B:
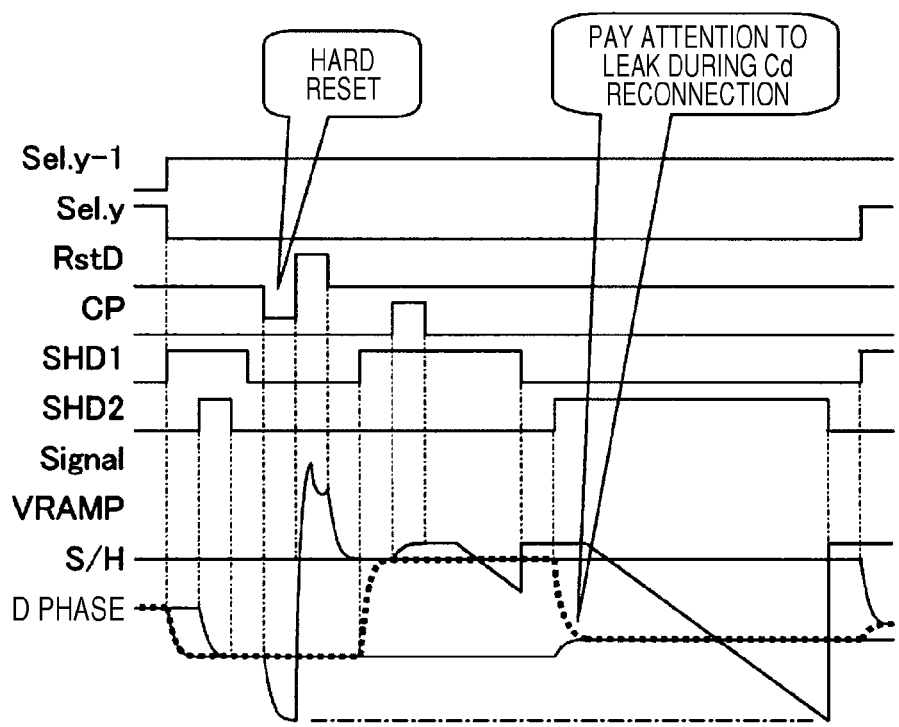

FIGS. 31A and 31B are schematic diagrams of a signal processing system corresponding to a hard reset function according to this embodiment. FIG. 31A is a diagram of an equivalent circuit. FIG. 31B is a timing chart.

In this case, a transistor Q401, a drain of which is connected to power supply potential and a source of which is connected to the capacitor C401 (C411), a capacitor C402 connected between a connection point of the transistor Q401 and a ground line via a switch SW402, a current source I402 connected to the source of the transistor Q401 via a switch W403, and a current source I403 connected to a gate of the transistor Q401 are provided between the switch SW 401 and the capacitor C401 (C411) arranged between the signal transfer line and the column line 400 (410). The gate of the transistor Q401 is connected to a switch SW401.

In the hard reset, when the gate voltage VG of the transistor 130 is set to 0 V to −1.0 V and the drain voltage VD thereof is set to 1.8 V, the source voltage VS thereof is high impedance Hi-Z or LD. The accumulated electrons overflow (OF). In other words, the pixel cell Cel is saturated. At this point, a signal is held.

In the following reset operation, when the gate voltage VG of the transistor 130 is set to 0 V to −1.0 V and the drain voltage VD thereof is set to be equal to or higher than 3.0 V, for example, set to 3.7 V, the source voltage VS thereof is high impedance Hi-Z or LD. The electrons present in the accumulation well are discharged to the outside through the drain electrode.

In this case, to prevent leak on a signal side that consumes sampling time, for example, analog sampling is performed only on the signal side and the CDS is digitally performed. As a result, a significant improvement effect is obtained by adding one capacitor.

For example, it is possible to improve large light amount resistance with a small size by combining analog sampling for a D phase and digital sampling for a P phase.

A circuit configuration corresponding to the analog SHD and the digital CDS can be applied to pixel cells of a so-called floating diffusion (FD) configuration as well.

In this embodiment, a γ characteristic is positively given to the pixel cells. In association with the γ characteristic, an inverse γ correction circuit is configured by using a transistor having a back gate terminal of the same structure as the transistor 130 of the pixel cells.

Figure 32:
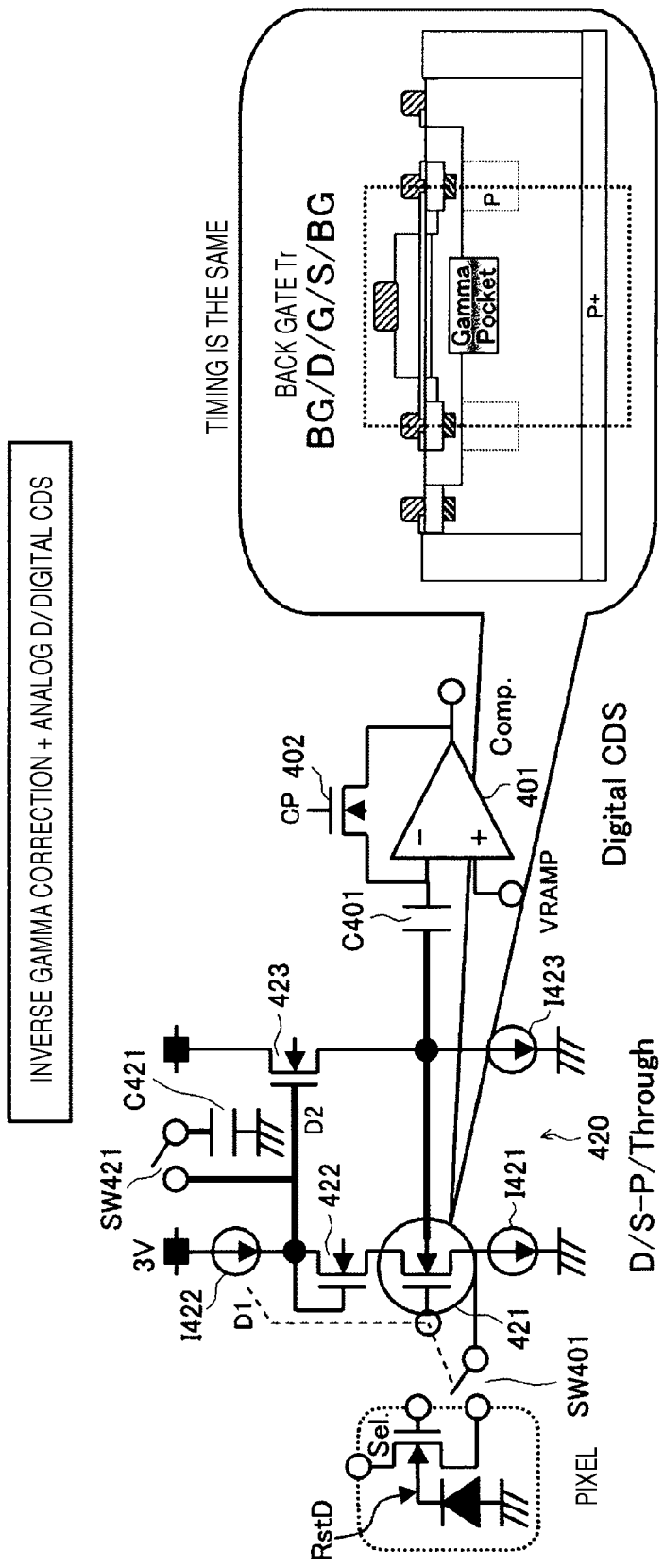
FIG. 32 is an equivalent circuit diagram for explaining a basic concept of a signal processing system including an inverse γ correction circuit.

FIG. 32 is an equivalent circuit diagram for explaining a basic concept of a signal processing system including the inverse γ correction circuit.

The inverse γ correction circuit 420 includes a transistor 421 having a back gate terminal, transistors 422 and 423 configuring a current mirror, a switch SW421, a capacitor C421, and current sources I421, I422, and I423.

A source of the transistor 421 and the current source I421 are connected. A connection point of the source of the transistor 421 and the current source I421 is connected to the switch SW401. A drain of the transistor 421 is connected to a source of the transistor 422. A gate and a drain of the transistor 422 are connected. A connection point of the gate and the drain is connected to the current source I422, a gate of the transistor 423, and the switch SW421.

A drain of the transistor 423 is connected to power supply potential. A source of the transistor 423 is connected to a current source I423. Connection points of the source of the transistor 423 and the current source I423 are connected to the substrate of the transistor 421 and the capacitor 401. The capacitor C421 is connected to the switch SW421.

Since a timing chart of the signal processing system is the same as that shown in FIG. 32B, the timing chart is not shown in the figure.

The γ characteristic is reduced by the inverse γ correction circuit 420, i.e., non-linearity of the γ characteristic is changed to linearity to perform analog to digital conversion.

The signal processing system according to this embodiment has the characteristics described above.

In general column digital CDS or ADC, CDS or ADC is slowly performed in one H (horizontal) period. A signal memorized in an FD is assumed.

However, in the threshold modulation system, a signal change is caused by received light even during CDS or ADC. Therefore, when a high-speed electronic shutter is used with a large light amount, it is likely that a signal error and floating black occur.

In general, such a problem is prevented by high-speed analog CDS. In this system, it is conceivable to correct a black level taking into account shutter speed and a signal amount. Electronic shutter speed in a practical range is not considered to specifically cause a problem.

To prevent leak on a signal side that consumes sampling time, as described above, for example, analog sampling is performed only on the signal side. As a result, a significant improvement effect is obtained by adding one capacitor.

The pre-line reset system that makes use of a reset level of a preceding line can cope with reset of the column digital CDS.

Figure 33B:
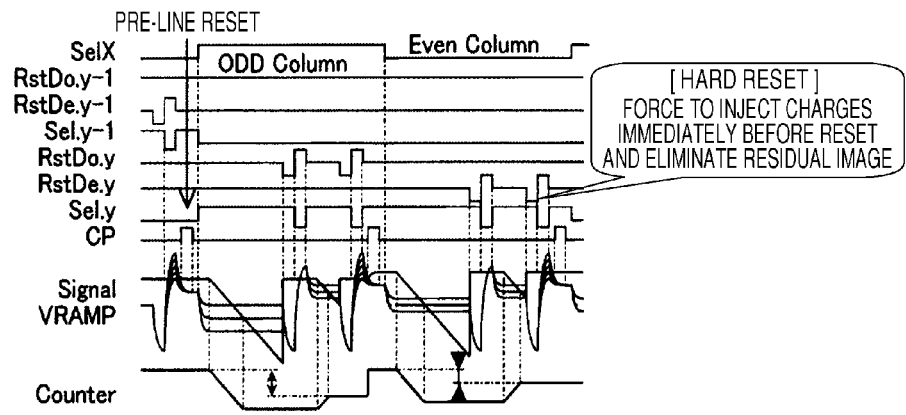
Figure 33C:
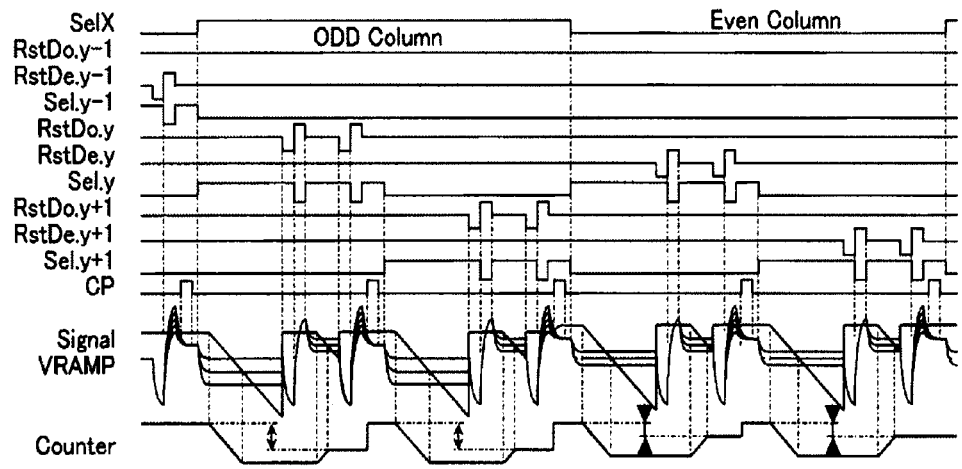

FIGS. 33A to 33C are diagrams of a level diagram of the pre-line reset system, two-column sharing, and 2×2 pixel timing. FIG. 33A is a diagram of an example of working voltage. FIG. 33B is a diagram of an example of a still image sequence in two column sharing. FIG. 33C is a diagram of an example of a 2×2 pixel addition sequence.

Figure 34:
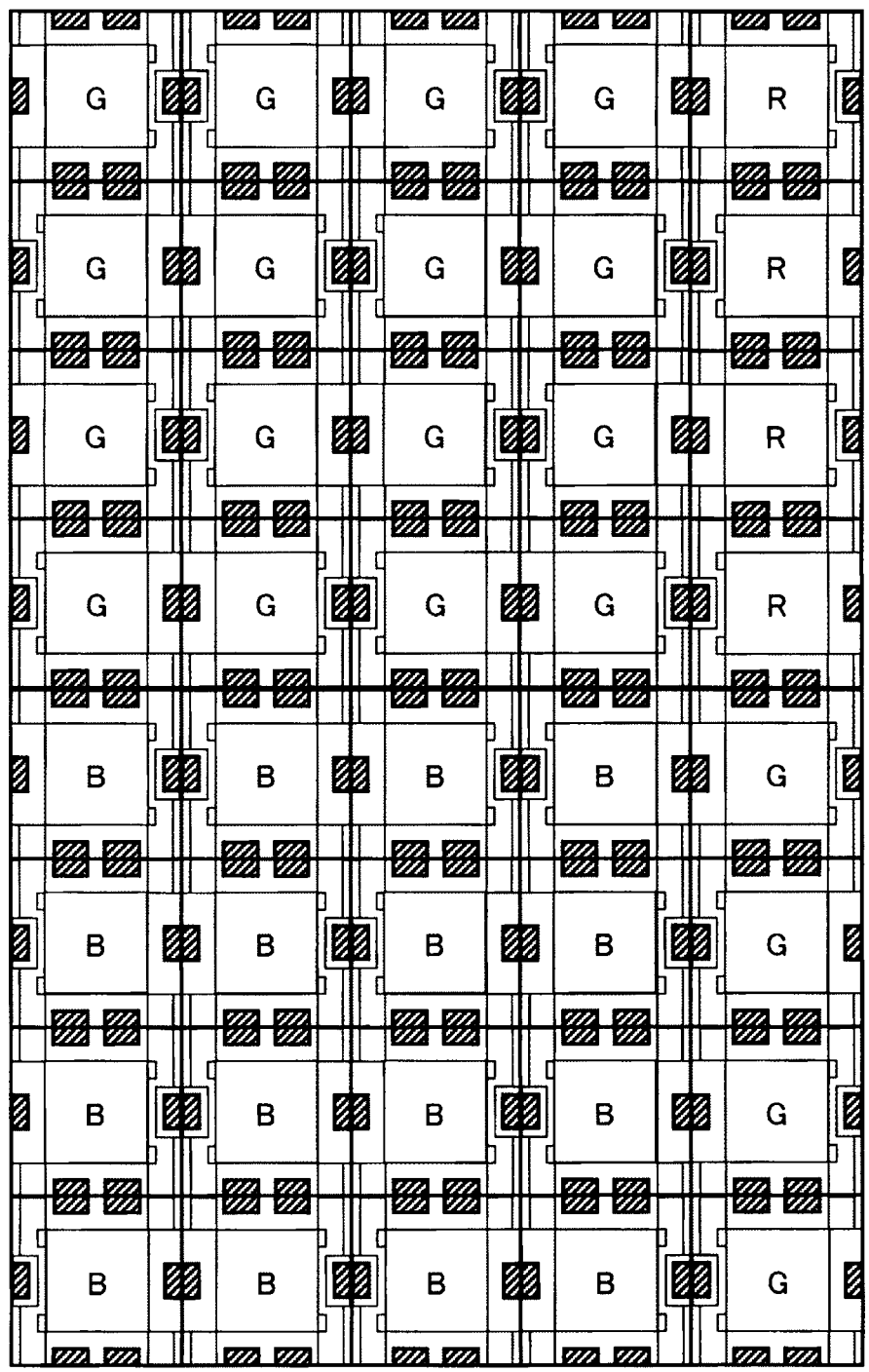
FIG. 34 is a plan view of a configuration example in which plural pixels are arranged in an array form and one output signal is obtained by the plural pixels.

In this embodiment, for example, as shown in FIG. 34, pixel cells (transistors) are arranged in an array shape to obtain one output signal with plural pixels. This makes it possible to attain a high-Qs and low-noise dynamic range.

A method of obtaining one output signal may be performed in a solid-state imaging element or in a signal processing IC outside the element. When the method is performed in the signal processing IC outside the element, there is an advantage that, for example, a defective pixel can be corrected.

Figure 35:
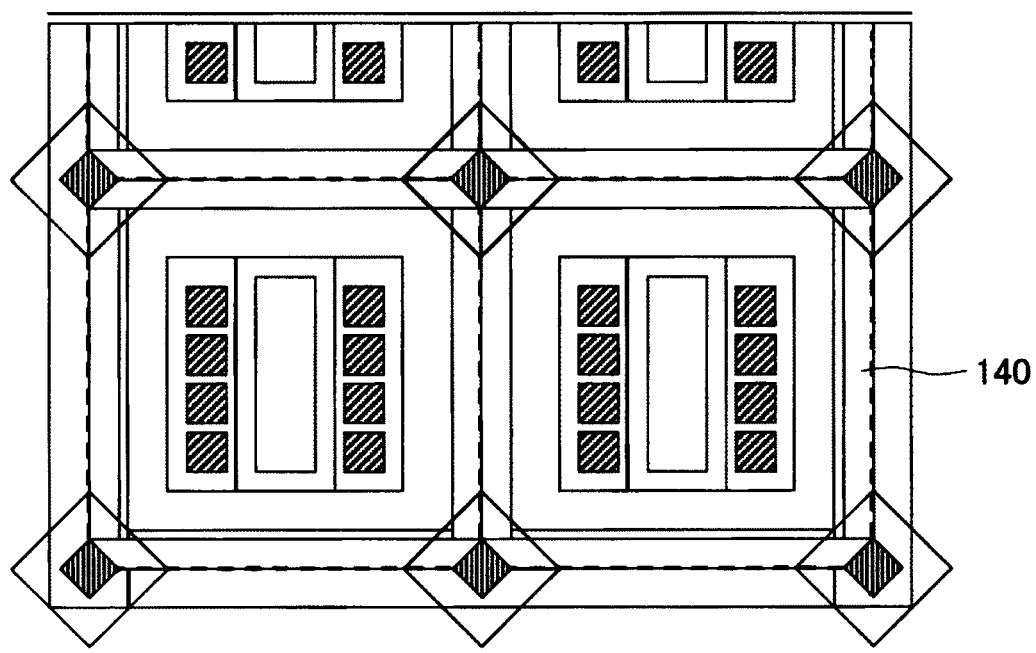
FIG. 35 is a plan view of a configuration example in which plural pixels are arranged in an array form and element separation is performed in a unit of plural pixels to obtain one output signal.
Figure 36A:
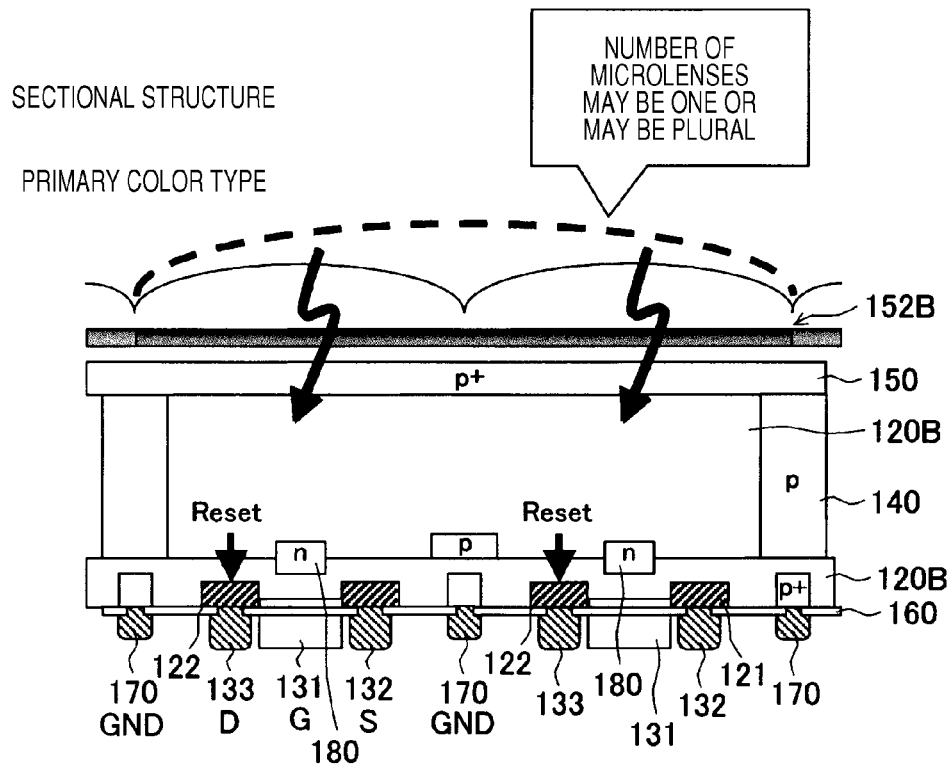
FIGS. 36A and 36B are sectional views of configuration examples in which plural pixels are arranged in a pixel form and element separation is performed in a unit of plural pixels to obtain one output signal.

In this embodiment, for example, as shown in a plan view of FIG. 35 and a simplified sectional view of FIG. 36A, on condition that one output is finally obtained, element separation is performed in a unit of plural pixels to prepare for mixing of signals in plural pixels arranged in an array shape. Consequently, the sensor accumulation region is further expanded and a high dynamic range (D-Range) can be attained.

Figure 36B:
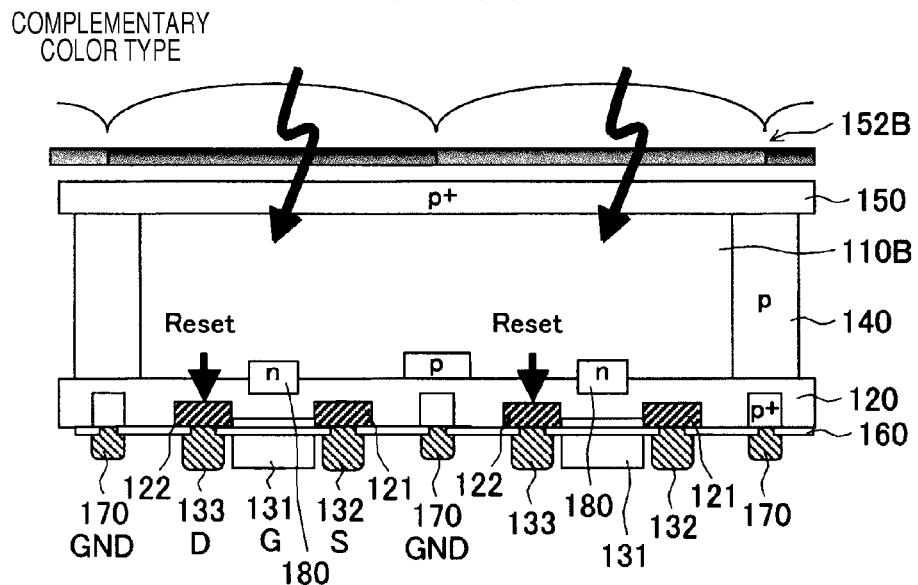

In this embodiment, for example, as shown in a simplified sectional view of FIG. 36B, if color filter coding is not the same color in plural pixels arranged in an array shape but, for example, primary colors B (Blue) and R (Red), a complementary color magenta is obtained. Therefore, complementary color signal processing used in a cam coder and the like can be used. As a result, color reproducibility is the same as that of the primary colors and improvement of mass productivity through sharing of color filter materials can be attained.

Figure 37:
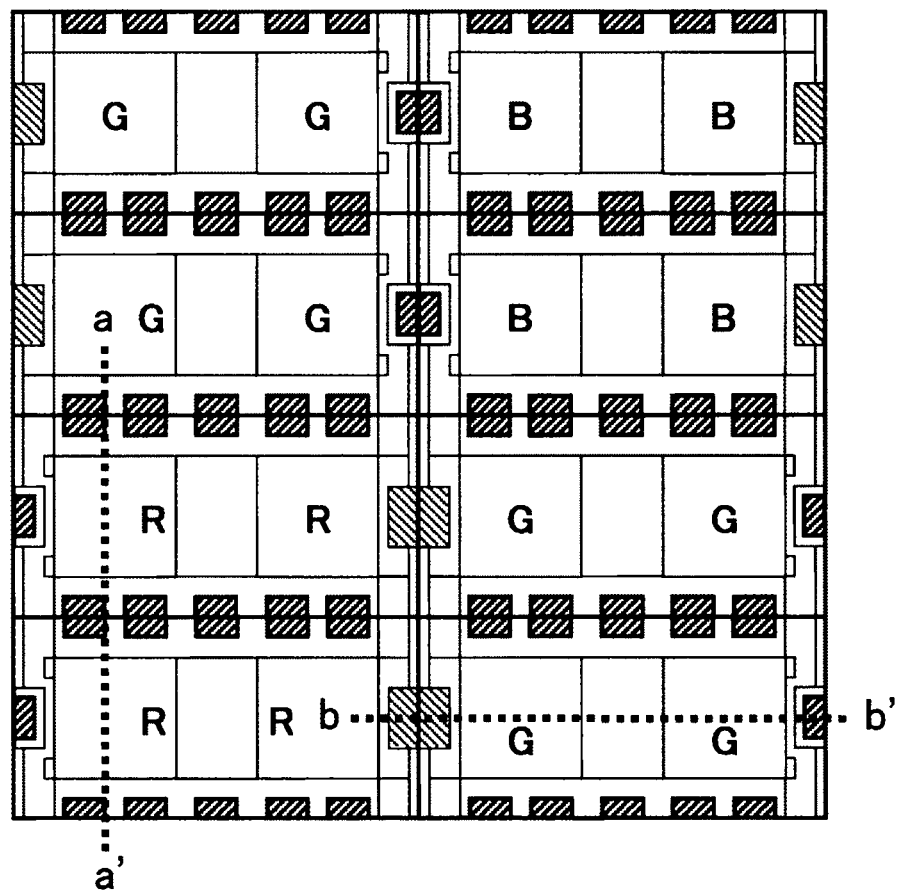
FIG. 37 is a plan view of another configuration example in which plural pixels are arranged in an array form and element separation is performed in a unit of plural pixels to obtain one output signal.
Figure 38A:
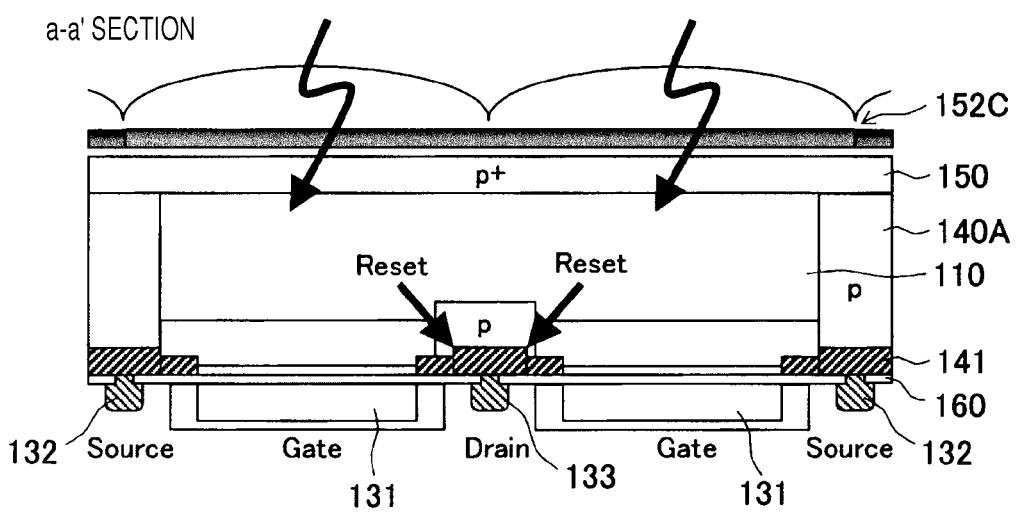
FIGS. 38A and 38B are simplified sectional views taken along an a-a' line and a b-b' line shown in FIG. 37.
Figure 38B:
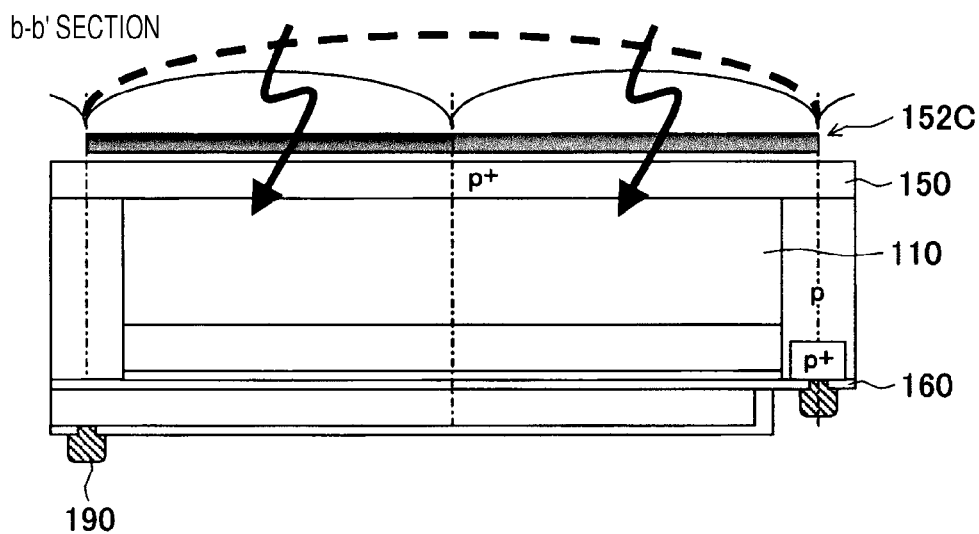

In this embodiment, for example, as shown in FIG. 37 and FIGS. 38A and 38B, in a pixel that shares a part or a plurality of contacts of a drain, a source, a substrate (a well), or a gate with an adjacent pixel cell, when element separation is performed in a unit of plural pixels, since an element separation p-well under a reset drain can be eliminated, there is an effect that reset voltage can be reduced.

In the solid-state imaging device 1 according to this embodiment, it is possible to perform nondestructive readout without worsening of dark currents by continuing photoelectric conversion without resetting pixels in signal readout from pixels.

It is possible to realize, according to the nondestructive readout, for example, a high-S/N wide dynamic range (Wide D-Range) and live view during low-speed exposure and valve exposure.

It is also possible to realize, according to the nondestructive readout, various forms, for example, it is possible to perform still image low-speed exposure and asynchronous and synchronous simultaneous operations of a moving image, use for both AE and AF is possible, and it is possible to perform real-time AE/AF at random in an entire area through high-speed partial scan.

FIG. 39 is a diagram of an example of a wide dynamic range (Wide D-Range) sequence according to the nondestructive readout.

In FIG. 39, the vertical direction indicates a signal level and the horizontal direction indicates exposure time.

<Step ST1>

The signal level is reset and black scan is performed. A threshold Vh variation image is captured.

<Step ST2>

At time t1, first intermediate scan (SCAN #1) is performed. A high-luminance image is captured and a Vth difference is obtained.

<Step ST3>

At time t2, second intermediate scan (SCAN #2) is performed. A medium-luminance image is captured and a Vth difference is obtained.

<Step ST4>

At time t3, final scan is performed to reset the signal level. A low-luminance image is captured (CDS).

Although not shown in the figure, as step ST5, a wide dynamic range is realized by image combination of the high-luminance image, the medium-luminance image, and the low-luminance image. (The respective images are multiplied by time ratios and combined by level to obtain a high-DR image.)

Figure 40:
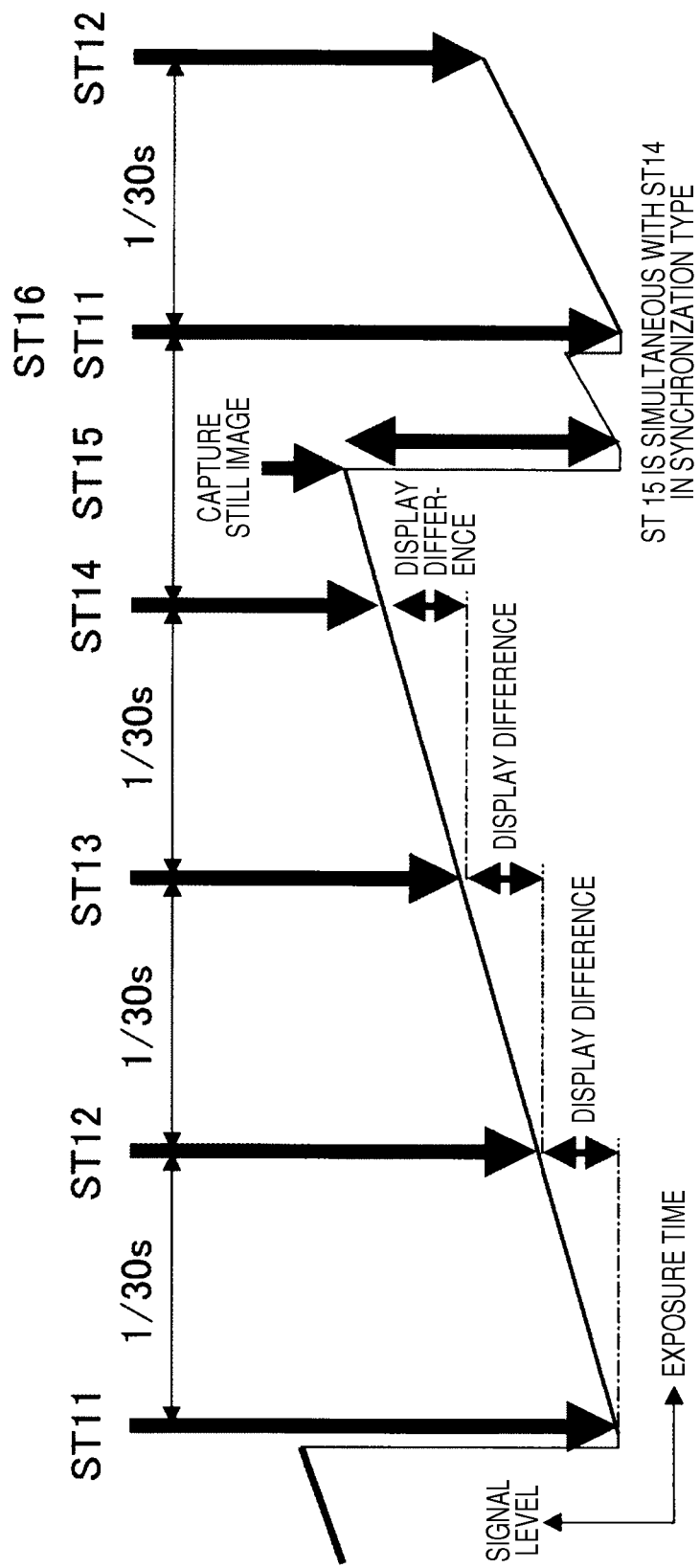
FIG. 40 is a diagram of an example of a low-speed live view sequence by nondestructive readout.

FIG. 40 is a diagram of an example of a low-speed live view sequence according to the nondestructive readout.

In FIG. 40, the vertical direction indicates a signal level and the horizontal direction indicates exposure time.

<Step ST11>

The signal level is reset and black scan is performed. A threshold Vh variation image is captured.

<Step ST12>

First intermediate scan (SCAN #1) is performed. #1 image is captured and a #0Vth difference is obtained and, for example, displayed for monitoring.

<Step ST13>

Second intermediate scan (SCAN #2) is performed. #2 image is captured and #1 Vth difference is obtained and, for example, displayed for monitoring.

<Step ST14>

Final scan is performed. #n image is captured and #n Vth difference is obtained and, for example, displayed for monitoring.

<Step ST15>

Capturing scan is performed to reset the signal level. Final image capturing CDS and recording in a memory are performed.

<Step ST16>

In the case of an asynchronous type, the image capture in step ST15 (a still image) is displayed in terms of 1/30s.

In this way, it is possible to realize, according to the nondestructive readout, for example, a high-S/N wide dynamic range (Wide D-Range) and live view during low-speed exposure and valve exposure.

As explained above, according to this embodiment, the substrate 100 includes the first substrate surface 101 side on which light is irradiated and the second substrate surface 102 side on which elements are formed. The plural pixel cells Cel (2A) separated by the adjacent cell group and the element separation layer are formed. Each of the pixel cells Cel includes the first conductive (in this embodiment, n-type) well (the first well) 110 formed on the first substrate surface 101 side and the second conductive (p-type) well (the second well) 120 formed further on the second substrate surface 102 side than the first well 110. The n-type first well 110 functions as a light sensing section that receives light from the first substrate surface 101 side and has the photoelectric conversion function and the charge accumulation function for the received light. The MOS transistor 130 that detects accumulated charges in the light sensing section of the first well 110 and has the threshold modulation function is formed in the second well 120. The p-type element separation layer (conductive layer) 140 of the second conducive type opposite to the first conductive type (in this embodiment, n-type) is formed on the sidewalls of the first well 110 and the second well 120 to surround the sidewalls. Therefore, effects described below can be obtained.

A pixel can be formed by one transistor of the drain (D)/gate (G)/source (S) structure. An increase in the number of steps can be minimized because the pixel structure is compatible with a logic process.

Layout efficiency is high and a micro-pixel can be realized because the contacts of the drain, the source, the gate, and the well can be shared.

Since a gate area is large, transistor noise is extremely small.

Since the entire pixel is an accumulation region, a saturation signal amount is large and a high dynamic range (DR) can be realized.

Since dark currents generated from the interface are discharged to the drain, a dark current image defect in the interface does not occur.

It is possible to perform nondestructive readout in which dark currents do not worsen regardless of ON or OFF of the gate.

The entire light sensing section is the gate. When the reflector is mounted, near infrared high sensitivity and an ultra-fine pixel can be realized.

Noise can be reduced by the inverse γ correction function.

The solid-state imaging device having the characteristics described above can be applied as imaging devices of a digital camera and a video camera.

Figure 41:
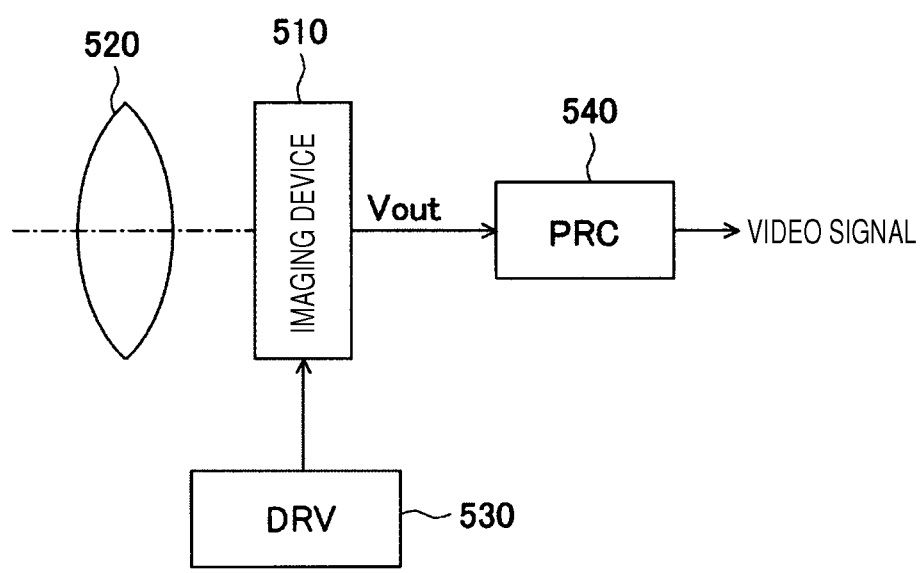
FIG. 41 is a diagram of an example of a configuration of a camera system to which the solid-state imaging device according to the embodiment is applied.

FIG. 41 is a diagram of an example of a configuration of a camera system to which the solid-state imaging device according to this embodiment is applied.

This camera system 500 includes, as shown in FIG. 41, an imaging device 510 to which the solid-state imaging device 1 according to this embodiment can be applied, an optical system that guides incident light to a pixel region of the imaging device 510 (focuses a subject image), for example, a lens 520 that focuses incident light (image light) on an imaging surface, a driving circuit (DRV) 530 that drives the imaging device 510, and a signal processing circuit (PRC) 540 that processes an output signal of the imaging device 510.

The driving circuit 503 includes a timing generator (not shown) that generates various timing signals including a start pulse and a clock pulse for driving circuits in the imaging device 510. The driving circuit 530 drives the imaging device 510 with a predetermined timing signal.

The signal processing circuit 540 applies signal processing such as CDS (Correlated Double Sampling) to an output signal of the imaging device 510.

An image signal processed by the signal processing circuit 540 is recorded in a recording medium such as a memory. The image signal recorded in the recording medium is hard-copied by a printer or the like. The image signal processed by the signal processing circuit 540 is displayed as a moving image on a monitor including a liquid crystal display.

As described above, in imaging apparatuses and electronic apparatuses such as a digital camera, a monitoring camera, a camera mounted on a cellular phone, a single lens reflex camera, and a scanner, it is possible to realize a highly accurate camera by mounting the solid-state imaging device 1 as the imaging device 510.

The present invention is not limited by the explanation of the embodiment.

For example, the numerical values and the materials described in the embodiment are only examples. The present invention is not limited to the numerical values and the materials.

Besides, various alterations are possible without departing from the spirit of the present invention.

It should be understood by those skilled in the art that various modifications, combinations, sub-combinations, and alterations may occur depending on design requirements and other factors insofar as they are within the scope of the appended claims or the equivalents thereof.

What is claim is:

1. A camera comprising:

a solid-state imaging device that receives light from a first substrate surface side of a substrate;

an optical system that guides incident light to the first substrate surface side of the solid-state imaging device; and a signal processing circuit that processes an output signal of the solid-state imaging device, wherein, the solid-state imaging device includes pixel cells that are (a) formed on the substrate having the first substrate surface side, on which light is irradiated, and a second substrate surface side, on which elements are formed, and (b) separated by an adjacent cell group and an element separation layer for each of the pixel cells or with plural pixel cells as a unit, each of the pixel cells includes (a) a first conductive well formed on the first substrate surface side and (b) a second conductive well formed on the second substrate surface side, the first conductive well receives light from the first substrate surface side and has a photoelectric conversion function and a charge accumulation function for the received light, a transistor that detects accumulated charges in the first conductive well and has a threshold modulation function is formed in the second conductive well, and the accumulated charges and signal charges are identical carriers.

2. A camera comprising:

a solid-state imaging device that receives light from a first substrate surface side of a substrate;

an optical system that guides incident light to the first substrate surface side of the solid-state imaging device; and a signal processing circuit that processes an output signal of the solid-state imaging device, wherein, the solid-state imaging device includes pixel cells that are (a) formed on the substrate having the first substrate surface side, on which light is irradiated, and a second substrate surface side, on which elements are formed, and (b) separated by an adjacent cell group and an element separation layer for each of the pixel cells or with plural pixel cells as a unit, each of the pixel cells includes (a) a first conductive well formed on the first substrate surface side and (b) a second conductive well formed on the second substrate surface side, the first conductive well receives light from the first substrate surface side and has a photoelectric conversion function and a charge accumulation function for the received light, a transistor that detects accumulated charges in the first conductive well and has a threshold modulation function is formed in the second conductive well, and in the arrangement of the pixel cells in the array form, drain contacts are divided into two or more groups in a column and share a column circuit of a signal readout processing system.

3. A camera comprising:

a solid-state imaging device that receives light from a first substrate surface side of a substrate;

an optical system that guides incident light to the first substrate surface side of the solid-state imaging device;

a signal processing circuit that processes an output signal of the solid-state imaging device; and a signal processing system that performs, during signal readout from the pixels, destructive readout for continuing photoelectric conversion without resetting the pixels, wherein, the solid-state imaging device includes pixel cells that are (a) formed on the substrate having the first substrate surface side, on which light is irradiated, and a second substrate surface side, on which elements are formed, and (b) separated by an adjacent cell group and an element separation layer for each of the pixel cells or with plural pixel cells as a unit, each of the pixel cells includes (a) a first conductive well formed on the first substrate surface side and (b) a second conductive well formed on the second substrate surface side, the first conductive well receives light from the first substrate surface side and has a photoelectric conversion function and a charge accumulation function for the received light, and a transistor that detects accumulated charges in the first conductive well and has a threshold modulation function is formed in the second conductive well.

4. A camera comprising:

a solid-state imaging device that receives light from a first substrate surface side of a substrate;

an optical system that guides incident light to the first substrate surface side of the solid-state imaging device; and a signal processing circuit that processes an output signal of the solid-state imaging device, wherein, the solid-state imaging device includes pixel cells that are (a) formed on the substrate having the first substrate surface side, on which light is irradiated, and a second substrate surface side, on which elements are formed, and (b) separated by an adjacent cell group and an element separation layer for each of the pixel cells or with plural pixel cells as a unit, each of the pixel cells includes (a) a first conductive well formed on the first substrate surface side and (b) a second conductive well formed on the second substrate surface side, the first conductive well receives light from the first substrate surface side and has a photoelectric conversion function and a charge accumulation function for the received light, a transistor that detects accumulated charges in the first conductive well and has a threshold modulation function is formed in the second conductive well, and the pixel cell has a gamma characteristic that a modulation degree increases when illuminance is low.

5. The camera of claim 4, wherein the pixel cell has the structure in which a capacity increases during a large signal output and has a function of realizing a high dynamic range according to the gamma characteristic.

6. The camera of claim 4, further comprising an inverse .gamma. correction circuit that performs inverse gamma correction using a transistor having a back gate terminal of the structure same as that of the transistor of the pixel cells.

7. A camera comprising:

a solid-state imaging device that receives light from a first substrate surface side of a substrate;

an optical system that guides incident light to the first substrate surface side of the solid-state imaging device; and a signal processing circuit that processes an output signal of the solid-state imaging device, wherein, the solid-state imaging device includes pixel cells that are (a) formed on the substrate having the first substrate surface side, on which light is irradiated, and a second substrate surface side, on which elements are formed, and (b) separated by an adjacent cell group and an element separation layer for each of the pixel cells or with plural pixel cells as a unit, each of the pixel cells includes (a) a first conductive well formed on the first substrate surface side and (b) a second conductive well formed on the second substrate surface side, the first conductive well receives light from the first substrate surface side and has a photoelectric conversion function and a charge accumulation function for the received light, a transistor that detects accumulated charges in the first conductive well and has a threshold modulation function is formed in the second conductive well, and the transistor has a function of a readout transistor, a function of a reset transistor, and a function of a selection transistor.

8. The camera of claim 7, wherein the solid-state imaging device has, in a gate electrode of the transistor on the second substrate surface side or a further front section of the gate electrode, a reflector that reflects light transmitted through the substrate and makes the light incident on the second conductive well and the first conductive well of the substrate.

9. The camera of claim 8, wherein the reflector is used as a predetermined wiring layer as well.

10. The camera of claim 7, wherein charges are injected from a drain to the pixels immediately before pixel reset and then the pixels are reset.

11. The camera of claim 10, further comprising a signal processing system for reading out a signal from the pixel cells, wherein the signal processing system includes a comparator and utilizes a reset level of a preceding line as a reference level of the comparator.

12. A camera comprising:
a solid-state imaging device that receives light from a first substrate surface side of a substrate;
an optical system that guides incident light to the first substrate surface side of the solid-state imaging device; and
a signal processing circuit that processes an output signal of the solid-state imaging device, wherein,
the solid-state imaging device includes pixel cells that are (a) formed on the substrate having the first substrate surface side, on which light is irradiated, and a second substrate surface side, on which elements are formed, and (b) separated by an adjacent cell group and an element separation layer for each of the pixel cells or with plural pixel cells as a unit,
each of the pixel cells includes (a) a first conductive well formed on the first substrate surface side and (b) a second conductive well formed on the second substrate surface side,
the first conductive well receives light from the first substrate surface side and has a photoelectric conversion function and a charge accumulation function for the received light,
a transistor that detects accumulated charges in the first conductive well and has a threshold modulation function is formed in the second conductive well, and
a second conductive separation layer is formed at least on a side of the first conductive well of the first conductive well and the second conductive well.

13. A solid-state imaging device according to claim 12, wherein:
a first conductive source region and a first conductive drain region are formed in the second conductive well or the second conducive separation layer, and
a gate electrode is formed on a channel formation region in the second conductive well between the source region and the drain on the second substrate surface side of the substrate.

14. The camera of claim 13, wherein a plurality of the pixel cells are arranged in an array form and share, with adjacent pixel cells, a part or a plurality of contacts of the drain, the source, the wells, or the gate.

15. The camera of claim 13, wherein:
a plurality of the pixel cells are arranged in an array form,
a gate electrode of the pixel cells are formed in common to the pixel cells in a stripe shape in one direction of the pixel array, and
a well contact is formed on the source region side or the drain region side.

16. The camera of claim 15, wherein a well contact region is formed in the second conductive separation layer.

17. The camera of claim 16, wherein the well contact region is formed in the second conductive separation layer on the first substrate surface side.

18. The camera of claim 15, wherein, when the well contact is formed on the drain side, the well contact is formed in a pinch shape with drain width reduced.

* * * * *